United States Patent [19]

Pearlstein

[11] Patent Number: 5,646,686
[45] Date of Patent: Jul. 8, 1997

[54] METHODS AND APPARATUS FOR REDUCING DRIFT IN VIDEO DECODERS

[75] Inventor: Larry A. Pearlstein, Newtown, Pa.

[73] Assignee: Hitachi America, Ltd., Tarrytown, N.Y.

[21] Appl. No.: 724,019

[22] Filed: Sep. 27, 1996

Related U.S. Application Data

[63] Continuation-in-part of Ser. No. 320,481, Oct. 11, 1994.
[51] Int. Cl.$^6$ ................................. H04N 7/36; H04N 7/50
[52] U.S. Cl. ..................... 348/392; 348/407; 348/408; 348/419
[58] Field of Search ........................ 348/390, 392, 348/404, 419, 408; H04N 7/36, 7/50

[56] References Cited

U.S. PATENT DOCUMENTS

| | | | |
|---|---|---|---|
| 4,238,773 | 12/1980 | Tsuboka et al. | 348/565 |
| 4,931,879 | 6/1990 | Koga et al. | 358/335 |
| 5,091,785 | 2/1992 | Canfield et al. | 348/567 |
| 5,202,847 | 4/1993 | Bolton et al. | 364/725 |
| 5,237,460 | 8/1993 | Miller et al. | 360/8 |
| 5,262,854 | 11/1993 | Ng | 348/420 |
| 5,313,303 | 5/1994 | Ersoz et al. | 348/43.9 |
| 5,325,124 | 6/1994 | Keith | 348/391 |
| 5,325,125 | 6/1994 | Naimpally et al. | 348/402 |
| 5,325,126 | 6/1994 | Keith | 348/418 |
| 5,335,117 | 8/1994 | Park et al. | 360/48 |
| 5,367,318 | 11/1994 | Beaudin et al. | 345/201 |
| 5,386,241 | 1/1995 | Park | 348/565 |
| 5,390,052 | 2/1995 | Kato et al. | 360/32 |
| 5,398,072 | 3/1995 | Auld | 348/426 |
| 5,398,079 | 3/1995 | Liu | 348/718 |
| 5,408,270 | 4/1995 | Lim | 348/429 |
| 5,422,677 | 6/1995 | Do | 348/568 |
| 5,477,397 | 12/1995 | Naimpally et al. | 360/10.3 |
| 5,517,245 | 5/1996 | Kondo | 348/392 |
| 5,526,124 | 6/1996 | Nagasawa | 348/392 |

OTHER PUBLICATIONS

A. Hoffman, B. Macq and J.J. Quisquater, "Future Prospects of the Cable TV Networks, New Technologies and New Services", Laboratoire de Telecommunications et Teledetection, pp. 13–22.

(List continued on next page.)

*Primary Examiner*—Howard W. Britton
*Attorney, Agent, or Firm*—Michaelson & Wallace; Michael P. Straub; Peter L. Michaelson

[57] ABSTRACT

A video decoder capable of downsampling full resolution images on a block by block basis regardless of the downsampling rate is disclosed. When the applied downsampling rate does not divide evenly into the number of pixel values included in a block in the dimension being downsampled, the decoder generates a partial pixel value. A partial pixel value represents a portion of the information used to represent a pixel of an image. In contrast, a full or complete pixel value is a value represents all the information used to represent a pixel of an image. The generated partial pixel value is stored and then added to another partial pixel value generated by downsampling another block of pixel values corresponding to a portion of a full resolution image. Numerous drift reduction processing techniques applicable to downsampling decoders are disclosed. Many of these processing techniques are applicable to decoders which perform full order IDCTs as well as reduced order IDCTs. In one embodiment, spatial filtering is applied to anchor frames as part of the motion compensation process in order to reduce or eliminate drift. The spatial filtering is performed as a function of the location of the current block being decoded, the location within the anchor frame of the data being used for prediction purposes, and the motion vector being applied. Various drift reduction techniques applicable to interlaced and non-interlaced images are also described with drift reduction processing for interlaced images being applied differently than for non-interlaced images. In order to maximize the benefit from limited drift reduction processing resources, in various embodiments the amount of drift reduction processing is varied depending on the type of data being processed, e.g., more drift reduction processing is performed on uni-directionally encoded blocks than bi-directionally encoded blocks.

19 Claims, 9 Drawing Sheets

OTHER PUBLICATIONS

International Standards Organization—Moving Picture Experts Group, Draft of REcommendation H.262, ISO/IEC 13818-1 titled, "Information Technology—Generic Coding of Moving Pictures and Associated Audio", Nov. 1993.

International Standards Organization—Moving Picture Experts Group, Draft of REcommendation H.262,ISO/IEC 13818-2 titled, "Information Technology—Generic Coding of Moving Pictures and Associated Audio", Nov. 1993.

M. Iwahashi et al, "Design of Motion Compensation Filters of Frequency Scaleable Coding—Draft Reduction", pp. 277–280.

A.W. Johnson et al, "Filters for Drift REduction in Frequency Scaleable Video Coding Schemes", Electronics Letters, vol. 30, No. 6, Mar. 17, 1994.

H.G. Lim et al, "A Low Complexity H.261–Compatible Software Video Decoder", Signal Processing: Image Communication, pp. 25–37, 1996.

R. Mokry and D. Anastassiou, "Minimal Error Drift in Frequency Scalability for Motion–Compensated DCT Coding", IEEE Transactions on Circuits and Systems for Video Technology, Jan., 12, 1994.

Atul Puri and R. Aravind, "Motion–Compensated Video Coding with Adaptive Perceptual Quantization", IEEE Transactions on Circuits and Systems for Video Technology, vol. 1, No. 4, Dec. 1991.

METHODS AND APPARATUS FOR REDUCING DRIFT IN VIDEO DECODERS

RELATED APPLICATIONS

This patent application is a continuation-in-part of pending U.S. patent application Ser. No. 08/320,481 filed on Oct. 11, 1994.

FIELD OF THE INVENTION

The present invention is directed to video decoders and, more particularly, to methods and apparatus for implementing downsampling video decoders and for reducing the amount of drift in video images which are decoded using a reduced complexity, e.g., a downsampling, video decoder.

BACKGROUND OF THE INVENTION

The use of digital, as opposed to analog signals, for television broadcasts and the transmission of other types of video and audio signals has been proposed as a way of allowing improved picture quality and as a more efficient use of spectral bandwidth over that currently possible using analog NTSC television signals.

Because of the relatively large amount of digital data required to represent a video image, many algorithms for video compression use motion compensation techniques, e.g., motion vectors, and Discrete Cosine Transform (DCT) coding, to reduce the amount of video data required to represent a video image.

Motion vectors are used to avoid the need to retransmit the same video data for multiple frames. A motion vector refers to a previous or subsequent video frame and identifies video data that should be copied from the previous or subsequent frame and incorporated into the current video frame. A motion vector will normally specifies vertical and horizontal indices identifying the block of data to be copied and the offset, if any, between the location of the identified video data in the previous or subsequent frame and the location in the current frame at which the specified video data is to be inserted. Some standards, such as the MPEG standard discussed below, allow the location offset information included in a motion vector to be specified to a resolution of half a pel, i.e., half pel resolution.

The ISO MPEG (International Standards Organization—Moving Picture Experts Group) ("MPEG") standard is an example of one standard which uses motion vectors and DCT coding in order to reduce the amount of data required to represent a video image.

One version of the MPEG standard, MPEG-2, is described in the International Standards Organization—Moving Picture Experts Group, Drafts of Recommendation H.262, ISO/IEC 13818-1 and 13818-2 titled "Information Technology—Generic Coding Of Moving Pictures and Associated Audio" hereby expressly incorporated by reference.

A known full resolution video decoder 10 is illustrated in FIG. 1. As illustrated, the known video decoder 10 includes a channel buffer 12, a syntax parser/VLD and master state controller circuit, an inverse quantization circuit 16, an inverse DCT (IDCT) circuit 18, a multiplexer 20, summer 22, anchor frame memory 24, and motion compensated prediction module 25 which are coupled together as illustrated in FIG. 1.

The channel buffer 12 receives and temporally stores encoded video data received from a transport decoder before supplying the encoded video data to the syntax parser/VLD and master state controller circuit 14. The syntax parser/VLD portion of the circuit 14 is responsible for parsing and variable length decoding the encoded video data while the master state controller is responsible for generating various timing control signals used throughout the decoder 10. The inverse quantization circuit 16 receives the video data from the circuit and performs an inverse quantization operation to generate a plurality of DCT coefficients and other data which are supplied to the IDCT circuit 18. In the full resolution decoder 10, the IDCT circuit 18 performs a full order IDCT operation on the DCT coefficients it receives. This means that if the video data was originally encoded using 8×8 DCT coefficient blocks it is decoded by performing an 8×8 IDCT operation.

The output of the IDCT circuit is coupled to a first input of the multiplexer 20 and to the first input of the summer 22. A second input of the MUX 20 is coupled to the output of the summer 22.

In the case of intra-coded video frames, the MUX 20 is controlled, as is known in the art, to output the video data generated by the IDCT circuit 18. This data is stored in the anchor frame memory 24 for use in subsequent predictions and is also output for display.

The motion compensated prediction (MCP) module 25 includes first and second motion compensated prediction circuits 28, 29, an average prediction circuit 30 and a MUX 31. The MCP module 25 is capable of performing single, e.g., forward or backward prediction as well as two way prediction. The first MCP circuit is responsible for performing one way prediction or the first of the two ways of prediction if two way prediction is employed. The 2nd MCP circuit 29 is used to perform the second prediction when two way prediction is employed.

The average prediction circuit 30 is responsible for averaging the results produced by the $1^{st}$ and $2^{nd}$ MCP circuits 28, 29 when two way prediction is used. The MUX 31 is controlled, as is known in the art, to output the signal from the $1^{st}$ MCP circuit 28 when one-way prediction is being used and the output of the average prediction circuit 30, when two way prediction is being performed. The output of the motion compensated prediction module 25 is coupled to the input of the summer 22.

The summer 22 combines the output of the IDCT circuit 18 with the output of the MCP module 25 to produce data representing a fully decoded video image in the case of an inter-coded video image.

As is known in the art, the MUX 20 is controlled to select and supply to the anchor frame memory 24, the output of the IDCT circuit 18 in the case of intra-coded video images and the output of the summer 22 in the case of inter-coded images.

FIG. 2 is a simplified diagram of a portion 21 of the known full resolution video decoder 10 which follows the inverse quantization circuit 16 when configured for processing inter-coded video images. The illustrated portion 21 includes the IDCT circuit 18, the summer 22, the anchor frame memory 24 and the motion compensated prediction module 25. For purposes of simplicity, the MUX 20 is omitted from FIG. 2.

A relatively large amount of data may be required to represent a video image. This data must be stored, e.g., in an anchor frame memory for decoding purposes. High definition video images such as those used to provide HDTV, are an example of images where large amounts of data may be used to represent the video images.

In order to reduce the complexity and the cost of digital video decoders, various modifications to the portion 21 of the known full resolution decoder illustrated in FIG. 2 have been made. These techniques often include the use of downsampling to reduce the amount of data required to represent one or more video images thereby permitting a smaller anchor frame memory 24 to be used.

In some decoders, downsampling is achieved by extracting a subset, e.g., a 4×4 block of DCT coefficients, from each full block, e.g., 8×8 block, of DCT coefficients being processed. A reduced order IDCT, e.g., a 4×4 IDCT when processing images encoded using 8×8 blocks of DCT coefficients, is then performed on the extracted DCT coefficients. The DCT extraction operation may be performed by placing a DCT coefficient extraction circuit before the IDCT circuit 18 in the known encoder of FIG. 1. The reduced order IDCT may be accomplished by simply using a reduced order IDCT circuit, e.g., a 4×4 IDCT circuit, as the IDCT circuit 18.

By using a reduced order, e.g., 4×4 IDCT which matches the downsampled image size, IDCT circuitry requirements as well as memory requirements are reduced.

In many cases, performing an IDCT where some DCT coefficients have been forced to or are treated as zero, in combination with downsampling, has the unfortunate side effect of introducing drift into images, e.g., inter-coded video images. Drift results from the application of a motion vector which was intended to be applied to a full resolution image to a downsampled image.

One known downsampling decoder which performs a reduced order, i.e., a 4×4 inverse discrete cosine transform (IDCT) circuit on a downsampled video image, i.e., an image originally represented by an 8×8 block of DCT coefficients, is described in H. G. Lim et al.'s article "A low complexity H.261-compatible software video decoder," *Signal Processing: Image Communication*8, pp. 25–37, (1996) (hereinafter "the Lim et al. article).

The known approaches to performing drift reduction such as those described in the Lim et al. article are based on the use of a reduced order IDCT for downsampling, e.g., the use of a 4×4 IDCT to generate an IDCT from data coded using an 8×8 DCT. In such a case, each pixel represented by the DCTs in the reduced order DCT block being decoded are a function of a single full order, e.g., 8×8 DCT block.

For various reasons, in a reduced cost decoder, in many cases it is desirable to perform a full order IDCT, e.g., with some of the DCT coefficients set to or treated as zeros, as opposed to performing a reduced order IDCT. After completion of the full order IDCT downsampling may be performed to reduce memory requirements. This differs from the case where DCT coefficient extraction and a reduced order DCT is performed to produce the downsampled image. Significantly, in video decoders which perform a full order IDCT operation followed by a downsampling operation, the pixels of the downsampled video image may be a function of several different full size DCT coefficient blocks. This complicates drift reduction processing.

Unfortunately, because of the complexities associated with processing images which were generated using a full order IDCT followed by downsampling, the known drift reduction processing methods described in the Lim et al. article are not directly applicable to video decoders which use full order IDCTs followed by downsampling.

Accordingly, there is a need for methods and apparatus for reducing drift in video decoders which perform full order IDCTs followed by downsampling.

Another problem with known drift reduction techniques is that they do not support performing drift reduction on interlaced video where two fields may be combined into a single block for DCT processing, e.g., for performing an IDCT operation thereon.

Known decoders also suffer from the problem of inefficient drift reduction processing resource allocation. For example, in the decoder described in the Lim et al. article drift reduction techniques are applied uniformly to the generation of inter-coded video images without regard to the type of inter-coded video image being generated. In the case where computational resources are limited, e.g., in order to reduce costs, the uniform application of drift reduction to all inter-coded images being generated can be an inefficient allocation of processing resources.

Accordingly, there is a need for methods and apparatus for implementing drift reduction in downsampling decoders which utilize a full order IDCT followed by a downsampling operation. There is also a need for drift reduction methods and apparatus which are applicable to interlaced as well as non-interlaced video images regardless of whether a full or reduced order IDCT is performed.

In addition, there is a need for methods and apparatus which efficiently allocate drift reduction processing capability in order to maximize achieved drift reduction in systems with limited drift reduction processing capability, e.g., in low cost video decoders.

SUMMARY OF THE PRESENT INVENTION

The present invention is directed to video decoders and, more particularly, to methods and apparatus for implementing downsampling video decoders and for reducing the amount of drift in video images which are decoded using a reduced complexity, e.g., a downsampling, video decoder.

One embodiment of the present invention is directed to a downsampling video decoder capable of performing downsampling in either the horizontal or vertical dimensions at a rate which does not divide evenly into the number of pixels represented in a full resolution image by a block of pixel values or DCT coefficients. In one such embodiment, one or more partial pixel values are computed as a block of data representing a full resolution image is downsampled. The partial pixel values are either combined with previously stored partial pixel values to generate a full pixel value or are temporarily stored. In accordance with the present invention stored partial pixel values are subsequently combined with partial pixel values generated by downsampling subsequent blocks of video data.

By implementing a downsampling decoder in accordance with the present invention, 8×8 blocks of data representing pixels can be downsampled by a factor of, e.g., 3 in the horizontal and vertical directions, to produce reduced resolution representations of the original image. These resolution representations of the full resolution images can then be stored and used, e.g., as anchor frames for decoding subsequent images.

Other embodiments of the present invention are directed to performing drift reduction operations in video decoders, e.g., downsampling video decoders, which utilize reduced resolution anchor frames as prediction references. Some of these drift reduction techniques of the present invention can be applied to downsampling decoders which perform reduced order IDCT operations.

In accordance with one embodiment of the present invention, spatial filtering is applied to reduced resolution anchor frames as part of the motion compensation process in order to reduce the drift that results from using motion vectors intended to be applied to full resolution images to reduced resolution anchor frames. The spatial filtering may, and is, in various embodiments adjusted on a pixel by pixel basis to reduce or eliminate drift in the decoded images.

In one particular embodiment, the applied drift reduction processing is a function of the location of a DCT block being decoded within an image, the positions of the pixels used for reference purposes within the reference frame, and the motion vector being applied to the anchor frame. The applied drift reduction operation may be thought of as a set of spatially variant filters which are applied to the reduced resolution reference frame to implement upsampling, motion compensation and downsampling.

In one embodiment the filters used to implement drift reduction are adaptive. In such an embodiment, the filtering operation performed on the reference frame is varied as a function of whether the reference pixels were coded using field or frame structured DCT coding, whether field or frame motion compensation is to be used to generate the image being decoded, and/or whether a macroblock being decoded was coded using a field or frame structured DCT. Because of the adaptive nature of the filters used to implement motion compensation and drift reduction processing in such an embodiment, the present invention can be used to achieve drift reduction in interlaced as well as non-interlaced images.

One feature of the present invention is directed to the efficient allocation of limited drift reduction processing resources. In a particular exemplary embodiment, the amount of drift reduction processing applied to reference frames is controlled as a function of how productive the application of drift reduction processing to the individual frames being processed will be. In one particular embodiment, in order to apply drift reduction processing in an efficient manner, more drift reduction processing is applied to anchor frames which are used to decode uni-directionally encoded video data, e.g., P-frames, than is applied to bi-directionally coded data, e.g., blocks of B-frames which are coded using two prediction references.

In this manner, drift reduction processing resources are applied in a manner that makes more efficient use of a systems limited processing resources than would be achieved if drift reduction processing was uniformly applied to all anchor frames.

Various other features and embodiments of the present invention are discussed below in the detailed description that follows.

DETAILED DESCRIPTION

As discussed above, the present invention is directed to video decoders and, more particularly, to methods and apparatus for reducing the amount of drift in video images which are decoded using a reduced cost, e.g., a downsampling, video decoder.

Unlike some of the prior art drift reduction techniques which require the use of a reduced order IDCT circuit, many of the drift reduction techniques of the present invention can be applied to reduced complexity decoders whether or not a reduced order IDCT circuit is used to process the video data.

Figure 1:
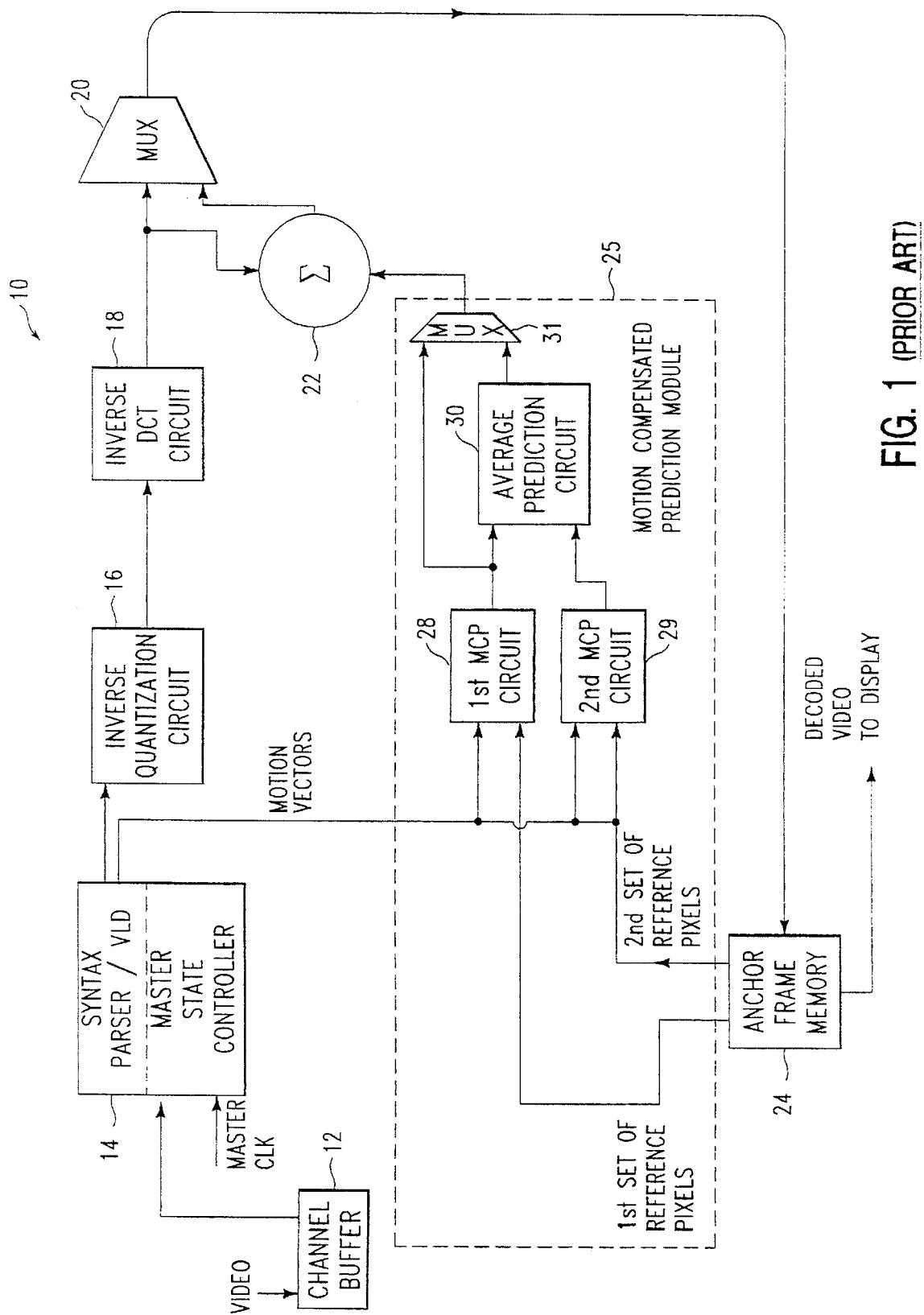
FIG. 1 is a block diagram of a known full resolution video decoder.
Figure 2:
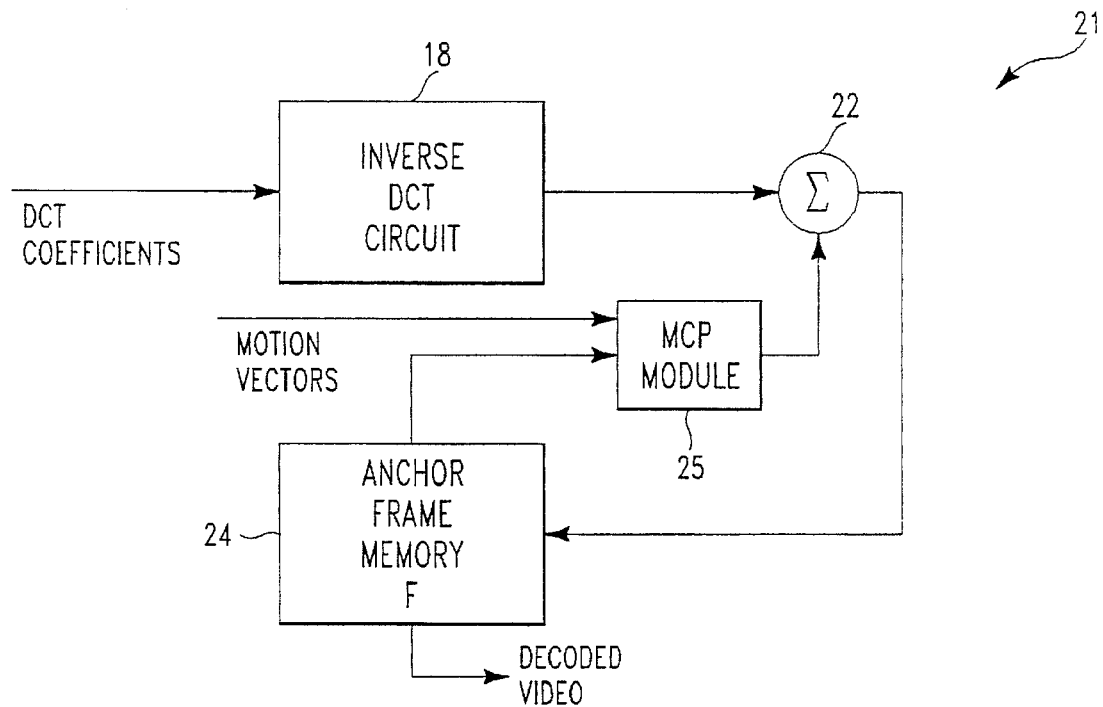
FIG. 2 is a simplified block diagram of a portion of the known full resolution video decoder of FIG. 1.
Figure 3A:
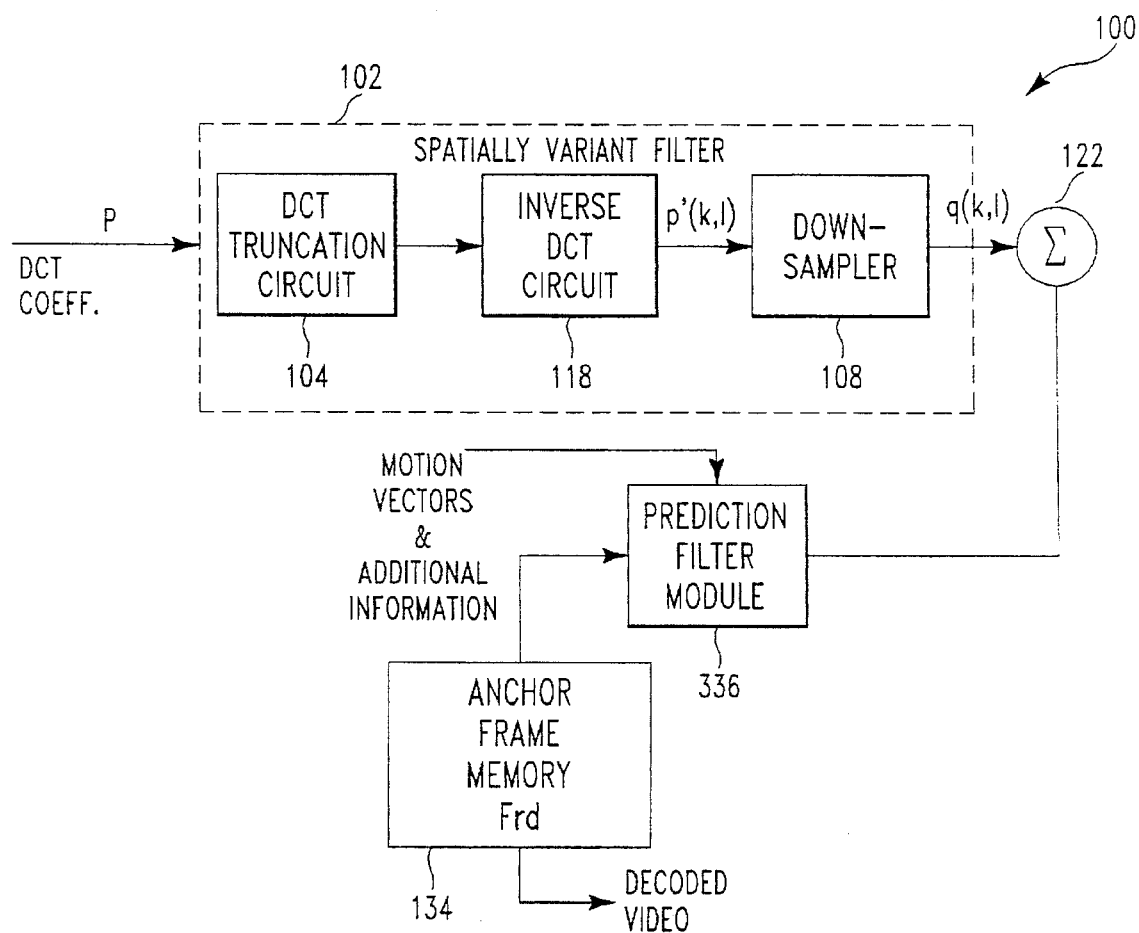
FIGS. 3A and 3B are simplified block diagrams of a portion of a video decoder implemented in accordance with various embodiments of the present invention.

Referring now to FIG. 3A, there is illustrated decoder circuitry generally indicated by the reference number 100 which can be used as part of a reduced complexity decoder in accordance with one exemplary embodiment of the present invention. The decoder circuitry 100 illustrated in FIG. 3A generally corresponds to, i.e., serves the same general function as the known decoder circuitry 21 illustrated in FIG. 2. However, the circuitry 100 includes various components, e.g., a DCT truncation circuit 104, a downsampler 108 and, in accordance with the present invention, a prediction filter module 336 not found in the full resolution decoder circuitry 21. These components, among others, permit the circuitry 100 to be implemented with less memory and often at a lower cost than the full resolution circuitry 21.

In FIG. 3A, it can be seen that the decoder circuitry 100 comprises the DCT truncation circuit 104, a full order inverse DCT circuit 118, a downsampler 108, a summer 122, an anchor frame memory 134, and a prediction filter module 336 coupled together as illustrated.

The DCT truncation circuit 104 is responsible for truncating blocks of DCT coefficients, e.g., 8×8 DCT coefficient blocks, by setting one or more of the coefficients in each block of DCT coefficients to zero in a methodical way. The IDCT circuit 118 is a full order reduced complexity IDCT circuit. By this we mean that the IDCT circuit 118 performs an IDCT on a full, e.g., 8×8 DCT block, but is simpler to implement than the full order IDCT 18 because it can be implemented with the knowledge that preselected ones of the DCT coefficients in each block will be set to zero or are to be treated as zero for purposes of performing the IDCT operation.

The reduced complexity IDCT circuit 118 has an output coupled to the input of the downsampler 108. The downsampler is responsible for performing a downsampling operation on the data received from the IDCT circuit 118 to reduce the amount of data used to represent each image or frame being decoded. The output of the downsampler 108 is coupled to the first input of the summer 122.

In the embodiment illustrated in FIG. 3A, the decoder circuitry 100 is configured for decoding inter-coded frames. As illustrated, a second input of the summer 122 is coupled to the output of the PFM 336 of the present invention. When so configured the downsampled video frame output by the summer 122 will be a function of a previously generated downsampled frame, $F_{rd}$, which was stored in the anchor frame memory 134 as well as the current frame that is being decoded.

It should be noted that while the truncation circuit 104 and the downsampler 108 are illustrated as separate circuits, the functions performed by these circuits could be incorporated into, e.g., the circuitry which performs the IDCT operation with some DCT coefficient values being treated as zero for IDCT processing purposes.

While the use of the DCT truncation circuit 104 has the advantage of permitting the use of a reduced complexity IDCT circuit 118 and the downsampler 108 has the advantage of reducing the amount of memory required to implement the anchor frame memory 134, the use of these circuits has the unfortunate consequence of altering and/or distorting the image being decoded. The DCT truncation circuit 104, IDCT circuit 118 and the downsampler 108 operate together as a spatially variant filter 102.

Figure 3B:
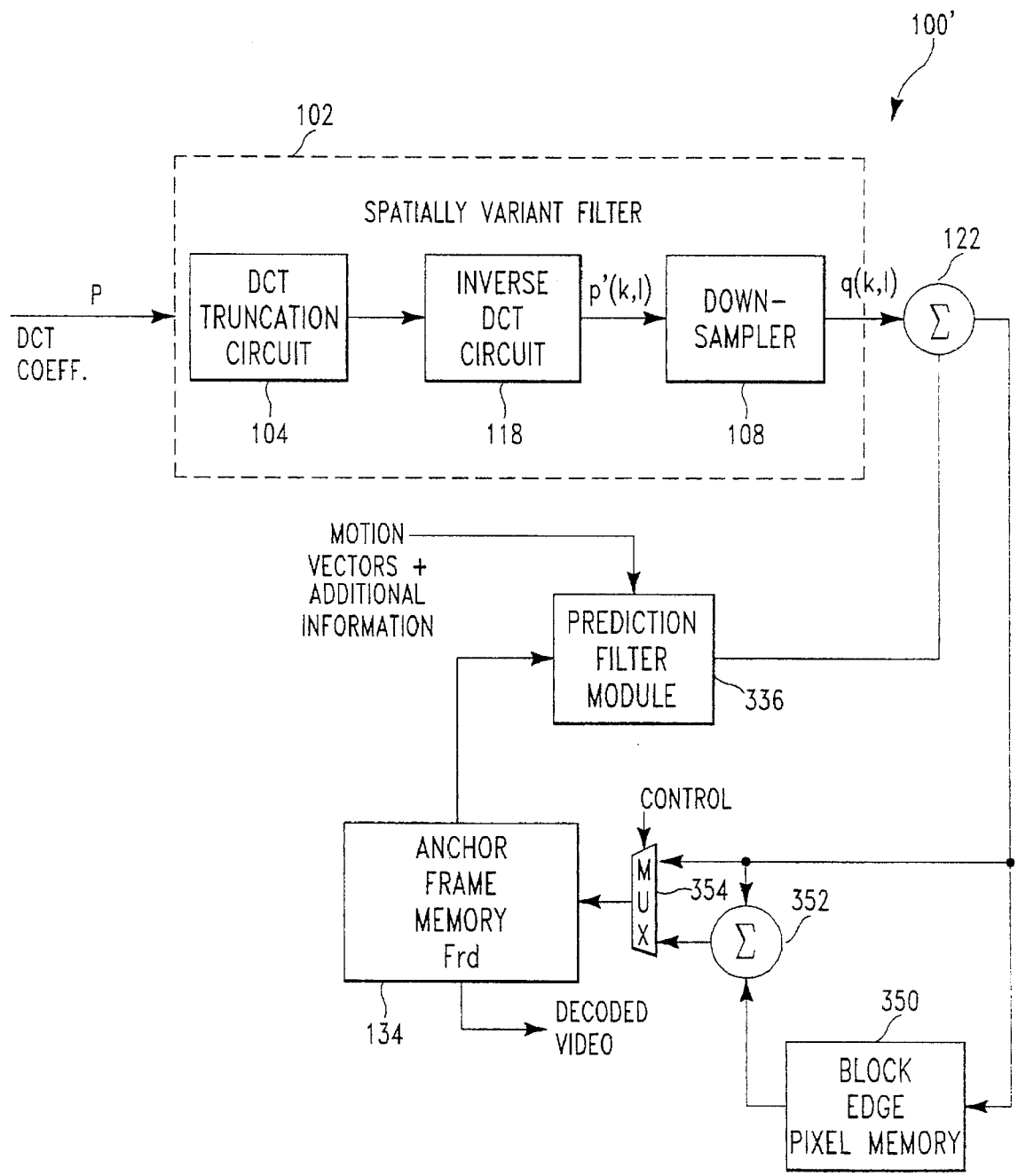

The input to the DCT truncation circuit 104 can be represented by the DCT data P which represents a frame of pixels, p, while the output of the IDCT 118 which follows the DCT truncation circuit 104 can be represented by the data p'(k,1). In the context of the simplified diagram of FIGS. 3A and 3B p represents a frame of prediction residual pixels. It should be noted that the present discussion is equally applicable to the case where the block 102 is part of an intra-frame decoder circuit and P represents the picture values directly. In the embodiment of FIG. 3, the data p'(k,1) serves as the input to the downsampler 108 which generates as an output q(k,1) which represents a downsampled frame q.

As will be apparent to one of ordinary skill in the art, much of the circuitry illustrated in FIG. 3A is the same as or similar to circuitry previously described in U.S. parent patent application Ser. No. 08/320,481, upon which the present application claims priority. However, as will be discussed below, the prediction filter module 336 of the present invention supports several new and novel drift reduction features. The prediction filter module 336 of the present invention will be described in detail below.

Figure 4:
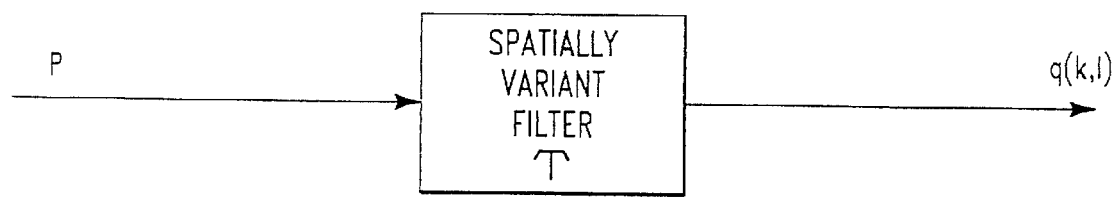
FIG. 4 illustrates a spatially variant filter.

Referring now briefly to FIG. 4, there is illustrated a spatially variant filter 102'. The filter 102' can be used to model the spatially variant filter 102 of the decoder circuit 100, which includes the DCT truncation circuit 104, IDCT circuit 118, and downsampler 108. The spatially variant filter 102' has a transfer function of T, p(k, 1)+e,sez P+ee as its input, and q(k,1) as its output.

The relationship between the pixel values p represented by the DCT data P supplied as an input frame to the filter 102 and the output of the filter 102, i.e. the pixel values represented by q(k,1), will now be described with reference to FIG. 5A. FIG. 5A illustrates the potential relationship between the pixel values of a four block frame represented by the DCT coefficients P, the pixel values in the frame p', represented by the data p'(k,1) output of the IDCT circuit 118, and the pixel values of the downsampled frame q represented by the output q(k,1) of the downsampling circuit 108.

As illustrated in FIG. 5A, as a result of the DCT truncation operation performed by the DCT truncation circuit 104 and the IDCT operation performed by the full order IDCT circuit 118, each pixel in a block of the frame p' is a function of all the pixels in a corresponding block of the input frame represented by the data P. In addition, because the downsampling operation is performed on the frame p' which is produced by performing a full order IDCT, it is possible for pixels in the frame q to be a function of pixels from multiple blocks in p'. Accordingly, a pixel in the frame q may be a function of several or all of the blocks of the input frame represented by the data P depending on the downsampling applied. The fact that the pixels in q can be a function of the value of pixels from multiple blocks of the original frame complicates drift reduction processing as compared to the case where all the pixels in q are simply a function of a single block in the input frame represented by the DCT data P, as in the case when downsampling is achieved through DCT extraction followed by performing a reduced order IDCT.

Referring once again to FIG. 3A, it can be seen that the frames generated by the spatially variant filter 102 are output to the summer 122 and then stored in the anchor frame memory 134 as reduced frames where a reduced, i.e., downsampled, frame is represented by the notation $F_{rd}$.

Figure 5B:
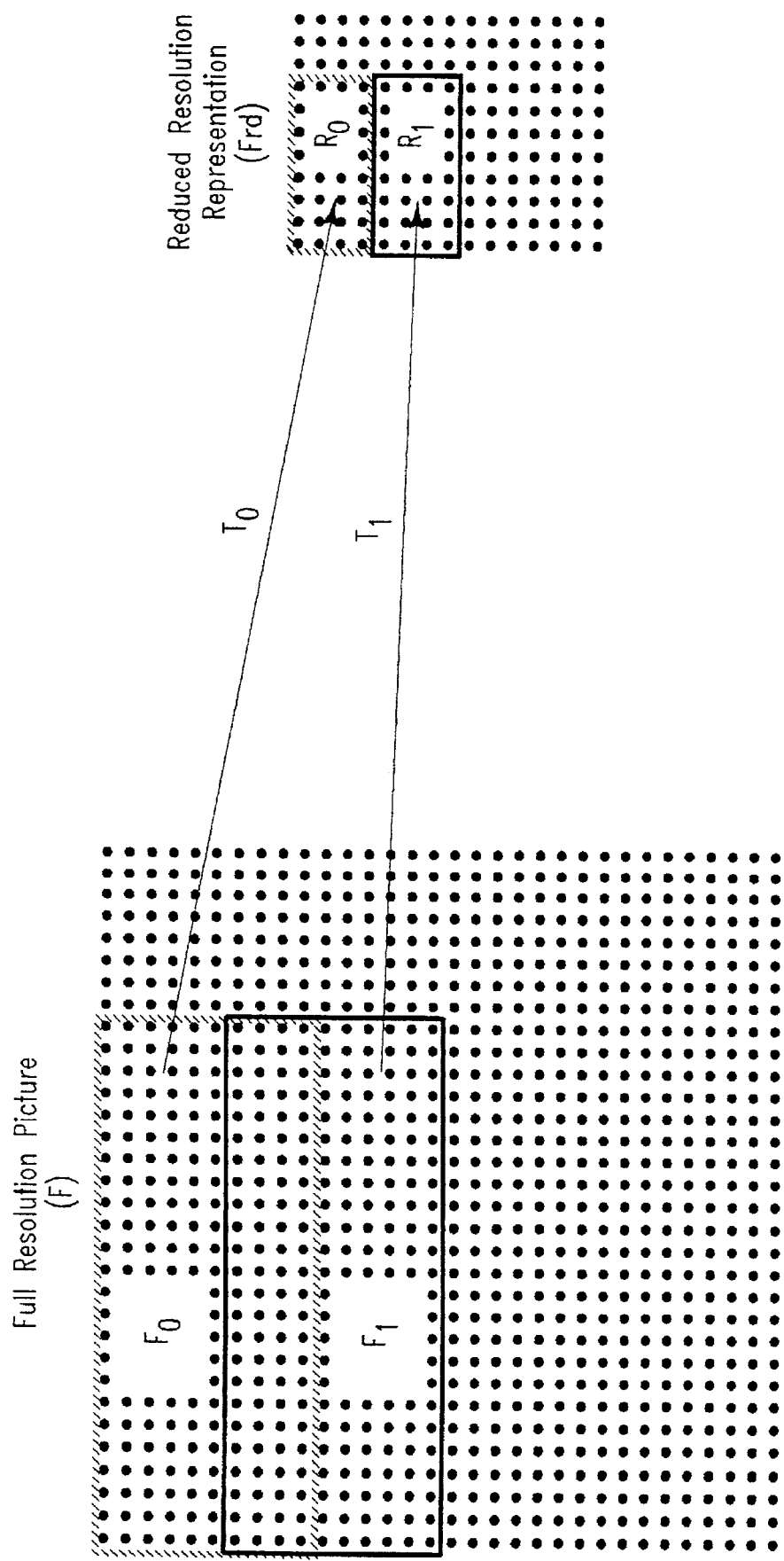
FIG. 5B is a diagram illustrating the potential relationship between pixel values representing pixels of an original image and pixel values in a downsampled image.
Figure 5A:
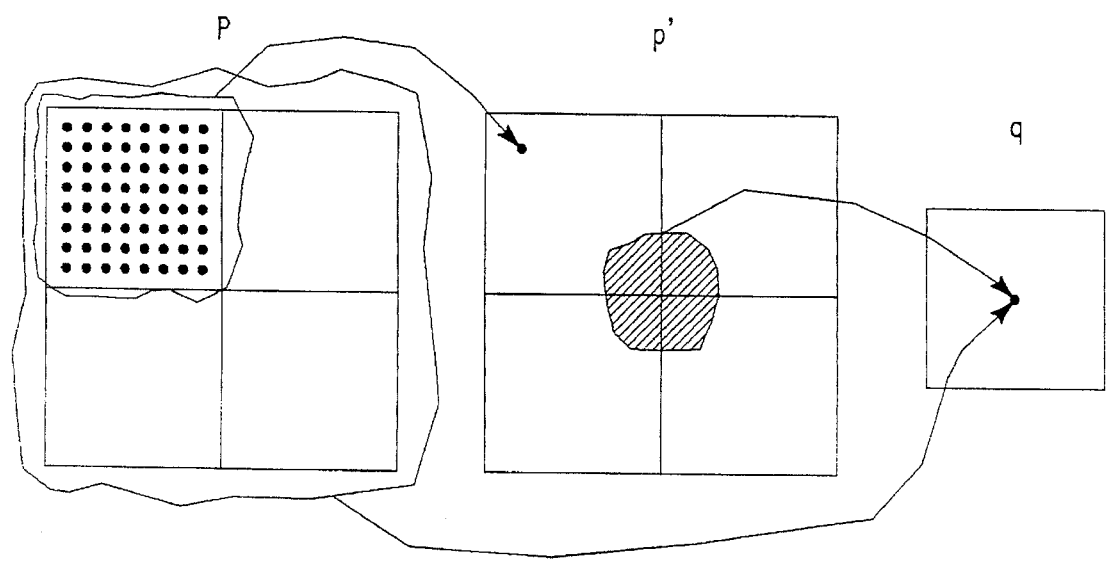
FIG. 5A is a diagram illustrating the potential relationship between pixel values in blocks of an original image to pixel values in a video image generated by performing a full order IDCT operation with some of the coefficients forced to or treated as zero, followed by a downsampling operation.

A general framework for describing the process of image downsampling is illustrated in FIG. 5B which illustrates both the full resolution frame F and the downsampled representation thereof $F_{rd}$. The reduced resolution representation $F_{rd}$ comprises a series of one or more non-overlapping collections of pixels where each collection of pixels will be represented by the variable R, and where the $i^{th}$ collection of pixels in $F_{rd}$ is denoted $R_i$, where i is an integer. As illustrated, each set of pixels in the region $R_i$ is a function of the pixels in a corresponding region $F_i$ of the full resolution image F. Note that the collections of pixels $F_i$, e.g., $F_0$ and $F_1$, may overlap one another. The transformation, e.g., spatially variant filtering operation performed by the circuit 102, which takes $F_i$ to $R_i$. For purposes of the present application, this function is denoted as T.

In symbolic form, $R_i$ may be described as a function of $F_i$ and T as follows:

$$R_i = T[F_i], \text{ for } i = 0, \ldots N-1$$

where N is $\geq 1$ and N is the number of pixel collections that make up the reduced resolution representation $F_{rd}$. Note that the pixels in any of the collections $R_i$ or $F_i$ may be from one or both fields, when interlaced full resolution pictures are used as the source of $F_{rd}$.

Downsampling occurs when the total number of pixels in the reduced resolution representation $F_{rd}$ is less than that of the full resolution picture F. Note that it is not necessary for the reduced resolution representation to contain values which directly represent pictures. The reduced resolution representation $F_{rd}$ stored in, e.g., the anchor frame memory 134 could, for example, be stored in the DCT domain.

Since the reduced resolution anchor frame $F_{rd}$ stored in the anchor frame memory 134 contains less information than the full resolution frame, it is not possible to exactly reproduce the full resolution frame from this stored data for use as a prediction reference in the reconstruction of subsequently coded frames.

Drift results from the inability in many cases, to produce the pixel values that would be produced by downsampling the full resolution reference picture for reconstructing a picture at reduced resolution.

The challenge of drift reduction is to produce an improved prediction reference which is suitable for use when a full-precision motion vector is used on a reduced resolution anchor frame. In commercial embodiments, the problem of drift reduction is additionally constrained by cost factors which limit the processing power and/or memory bandwidth that can be used for drift reduction and prediction reference generation purposes.

In accordance with one embodiment of the present invention, drift reduction is achieved by performing a filtering operation, e.g., a spatially variant filtering operation on the reduced resolution anchor frame $F_{rd}$ or portions thereof, obtained from the anchor frame memory 134.

In the embodiment illustrated in FIG. 3A, this filtering operation is directly incorporated into the circuitry which performs the motion compensation operation, e.g., the prediction filter module ("PFM") 336 which will be discussed in detail below.

Because of the block structure used to code frames, e.g., 8×8 pixel blocks, there is a minimal horizontal unit and a minimum vertical unit, in terms of pixels, that the effect of the spatially variant filtering operation performed by the spatial filter 102 repeats over. These minimum horizontal and vertical units may span one or more blocks of the original full resolution image. The horizontal and vertical minimum units are a function of the original full resolution block size in the horizontal and vertical directions and the rate of downsampling in each of these directions.

In accordance with the present invention it is possible to treat vertical and horizontal downsampling independently using separate filters, e.g., within the PFM 336. Accordingly, for purposes of explaining the present invention, the effects of downsampling in one dimension, e.g., the horizontal direction, will be discussed with the understanding that the effect on the second dimension of a block of pixel values is the same as, or similar to, that discussed in regard to the first dimension.

Consider the case of a full resolution 8×8 block of pixel values which is downsampled by a factor of 3 in the horizontal direction. In such a case, the downsampled pixels values for a single horizontal row of pixel values used to form a downsampled block will be a function of the pixel values of three full resolution blocks.

Figure 9A:
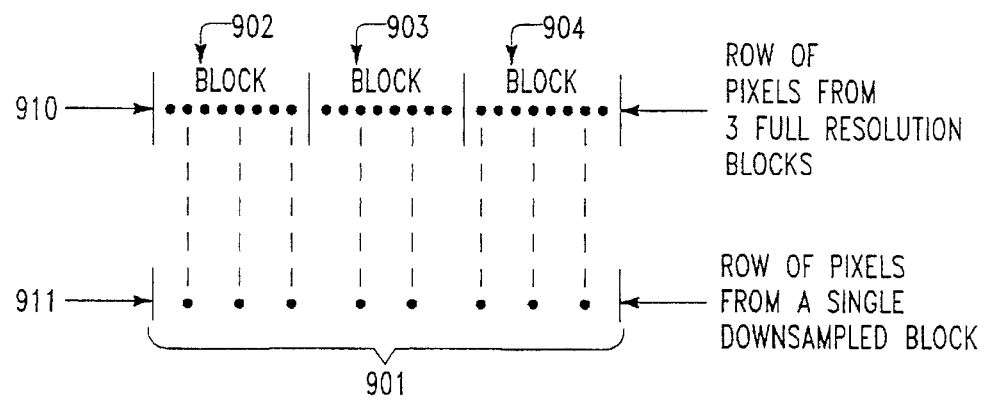
FIGS. 9A and 9B are diagrams which illustrate the relationship between a row of pixels from three 8×8 blocks belonging to a full resolution image and a row of pixels in an 8×8 block of pixels generated by downsampling.

Referring now briefly to FIG. 9A, the relationship between a row 910 of pixels from three full resolution 8×8 blocks to the pixels of a row 911 from a single 8×8 block of pixel values produced by downsampling the row 910 by a factor of 3 is illustrated.

As illustrated in FIG. 9A, in the case of an 8×8 block and downsampling by a factor of 3 in the horizontal direction, the 8 pixel values in each row of a full resolution block contributes to 2 ⅔ pixel values in the 8×8 block formed by the downsampling operation. Because 3 does not divide into eight evenly, at least one partial pixel value will result from the downsampling of each block. Such partial pixel values must be combined with partial pixel values generated by downsampling another block to produce a complete pixel value. For example, assume that each downsampled pixel value represented by a dot in row 911 is the result of the 3 pixel values represented by the dots in row 910 which are directly above, directly above and to the left, and directly above and to the right, of the dot in row 911.

In such a case, in order to generate the third pixel value in row 911, a ⅔ partial pixel value generated from the full resolution block 902 must be combined with a ⅓ pixel value generated from block 903. A partial pixel value that remains after a full resolution block 902, 903, or 904 is downsampled is a residual value which must be combined with another partial pixel value, e.g., generated from pixels in the next full resolution block to be downsampled.

One embodiment of the present invention illustrated in FIG. 3B includes circuitry which is designed to permit a decoder to perform downsampling using factors which do not divide evenly into the number of pixels in a full resolution block. i.e., to support downsampling that results in partial pixel values when blocks are downsampled.

Referring now to FIG. 3B, it can be seen that the decoder circuitry 100' includes much of the same circuitry as the FIG. 3A embodiment but also includes a block edge pixel memory unit 350, a second summer 352 and a multiplexer (MUX) 354 not found in the decoder circuitry 100. The additional circuitry illustrated in the FIG. 3B embodiment permits the decoder circuitry 100' to perform downsampling on pixel values representing full resolution blocks by factors which produce partial pixel values.

In the FIG. 3B embodiment, the output of the first summer 122 is coupled to both the input of the block edge pixel memory 350 and to a first input of the second summer 352. A second input of the second summer 352 is coupled to the output the block edge pixel memory. The MUX 354 is coupled to both the output of the first summer 122 and the second summer 352. In addition, the MUX 354 receives a partial pixel value control signal supplied by, e.g., a master state controller circuit such as the one illustrated in FIGS. 6 and 7.

When full pixel values are output by the summer 122, the MUX 354 is controlled so that the values received from the summer 122 are supplied to and stored in the anchor frame memory 134.

However, when partial pixel values are produced as a result of downsampling pixels, e.g., located at the end of a full resolution block, the residual values output by the summer 122 are supplied to and stored in the block edge pixel memory 350. When a subsequent spatially adjacent block in the dimension of interest, e.g., the horizontal dimension in this example, is processed, a previously generated and stored partial pixel value is output by the block edge pixel memory 350. This previously stored partial pixel value is combined by the summer 352 with the partial pixel value output by the first summer 122 to generate a complete pixel value. The MUX 354 is then controlled so that the output of the second summer 352 is stored in the anchor frame memory 134.

In the above described manner, the decoder circuitry 100' is able to generate, store and combine partial pixel value results to support downsampling by factors which do not divide evenly into the number of pixels which are included in a block in the downsampling dimension to which the particular downsampling factor is relevant.

While the anchor frame memory 134 and the block edge pixel memory 350 are illustrated as separate memories, they could be implemented as part of a single memory space or storage device.

Note that in the above described example of downsampling 8×8 blocks by a factor of 3, it takes 24 pixel values from the original full resolution blocks before the downsampling pattern will repeat. Accordingly, in the case of 8×8 blocks and downsampling by a factor of 3 in the horizontal direction, the minimum horizontal unit, in terms of pixel values, that the effect of the spatially variant filtering operation performed by the spatial filter 102 repeats over is 24.

The periodicity of a downsampling operation by a factor of D in one dimension may be determined as discussed below.

Let: $D = D_F / D_R$ where $D_F$ represents the size of a full resolution frame in the dimension of interest and $D_R$ represents the size of a reduced resolution frame in the dimension of interest.

In addition, let B denote the block size for DCT processing in the dimension of interest and let $K_N$ and $K_D$ represent the smallest pair of integers such that $B/D=K_N/K_D$ will be satisfied. In such a case, the minimum periodicity in the dimension of interest corresponds to $B \times K_D$.

For example, consider the above discussed case of downsampling 8×8 DCT blocks (B=8) by a factor of 3, e.g., D=3 in the horizontal dimension. In such a case, $$B/D=K_N/K_D=8/3 \text{ and}$$

$$B \times K_D = 24$$

accordingly the minimum periodicity resulting from the horizontal downsampling operation by a factor of 3 is 24 which corresponds to 3 full resolution blocks.

Consider, however, the case of downsampling by a factor of 2. In such a case:

$$B/D=8/2\times=K_N/K_D=4/1$$

and $$B \times K_D = 8 \times 1 = 8.$$

In such a case, the periodicity caused by downsampling by a factor of 2 is 4 and no residual pixel values need be calculated to produce a downsampled block since each pixel value in a downsampled block will correspond to values found in a single full resolution block.

As another example consider downsampling by a factor of 5. In such a case:

$$B/D=8/5=K_N/K_D$$

and $$B \times K_D = 8 \times 5 = 40$$

Thus, in a case of 8×8 DCT blocks and a downsampling rate of 5, the periodic effect of downsampling would repeat over a total of 40 full resolution frame pixel values.

With the above discussion in mind, it is possible to define a relationship between the original frames and a reduced representation thereof generated by the spatial filtering operation, including downsampling, used to generate the reduced representation, $F_{rd}$.

Figure 9B:
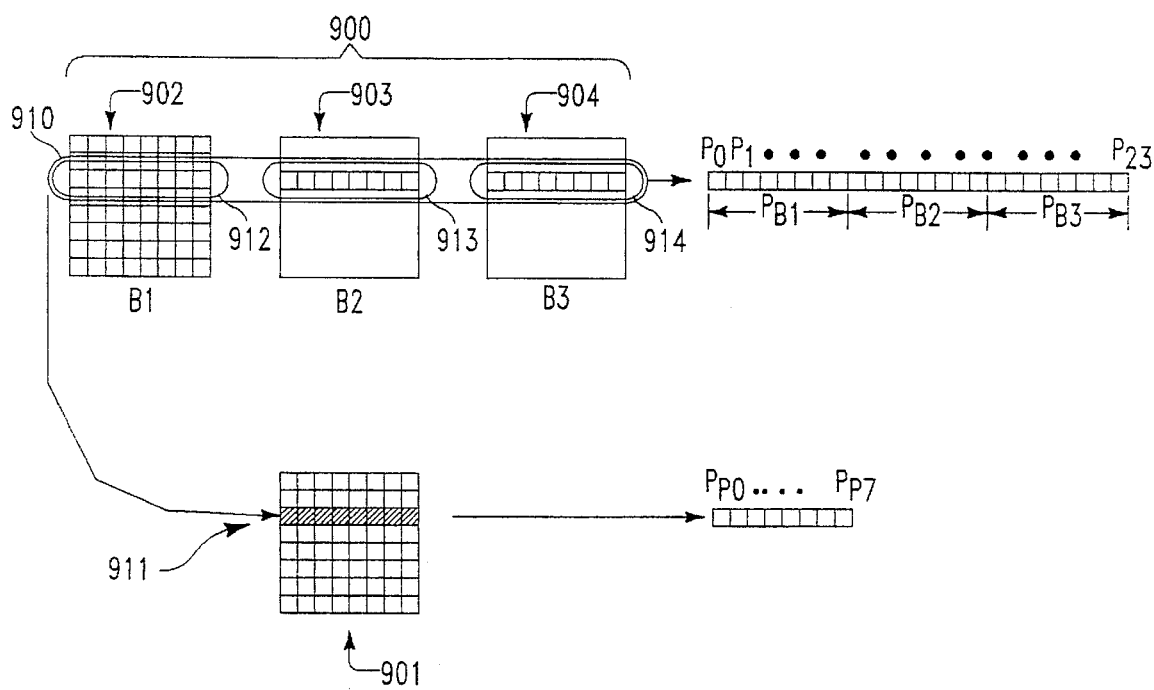

Referring now to FIG. 9B, there is illustrated a group of three contiguous 8×8 blocks of pixel values 902, 903, 904 of a full resolution video frame represented by the reference number 900 and a reduced representation 901 of the blocks 902, 903, 904 generated by downsampling by a factor of three.

Each row of pixel values in the three blocks of the full resolution frame 900 upon which a row of pixel values in the reduced resolution block 901 depends may be expressed as a vector, f, such that:

$$f_{Fullrow(j)}=[P_{0,j}, P_{1,j}, \ldots, P_{23}]$$

In a similar manner, the corresponding row of pixel values in the reduced resolution representation 901 may be expressed as a vector as follows:

$$f_{reducedrow(j)}=[P_{r0} \ldots P_{r7}]$$

The relationship between $f_{Fullrow(j)}$ and $f_{reducedrow(j)}$ can be expressed as follows: $f_{reducedrow(j)}=Tf_{Fullrow(j)}$ The horizontal and vertical minimum units are important because they serve as markers or boundaries which effect the initial generation of pixel values representing downsampled blocks. In addition, they serve to facilitate a determination by the PFM module 336 as to how much, if any, filtering is to be applied to an anchor frame in an attempt to reduce drift in a current frame being generated from the reduced anchor frame representation $F_{rd}$. For example, if the horizontal shift specified by a motion vector being applied precisely matches, or is an integer multiple of, the minimum horizontal unit over which the spatially variant filtering effects repeat, the PFM need perform no horizontal filtering to the reduced resolution anchor frame $F_{rd}$ to which the motion vector is being applied.

However, if the motion vector being applied specifies a shift in position, e.g., horizontal or vertical, which is different than the minimum horizontal or vertical unit, respectively, or a non-integer multiple thereof, the PFM 336 performs a position dependent, e.g., spatially variant, filtering operation on the anchor frame pixel values to be used to form the current frame in order to achieve a reduction in drift.

Figure 6:
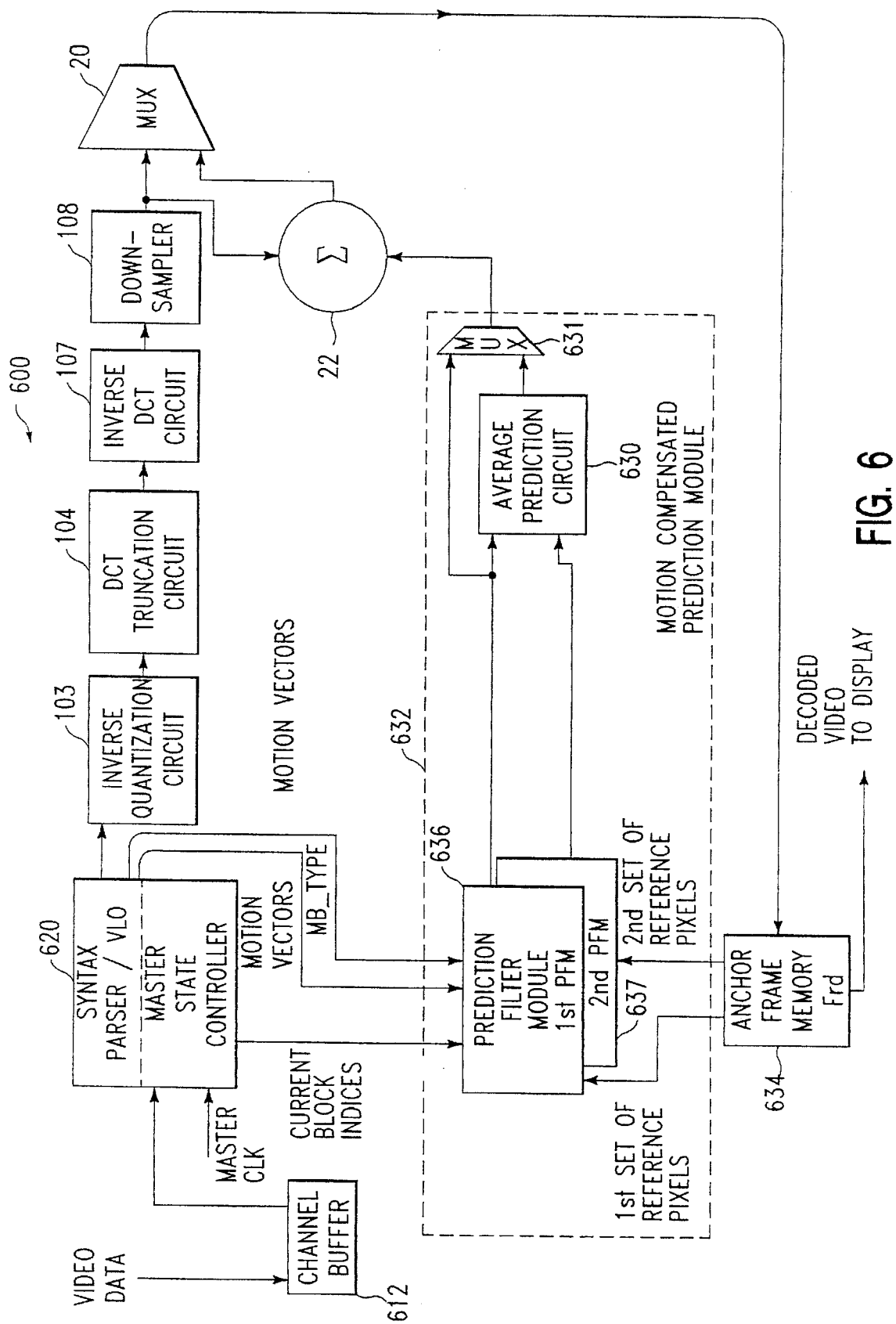
FIG. 6 is a block diagram illustrating a video decoder implemented in accordance with a first embodiment of the present invention.

The FIG. 3A and 3B embodiments discussed above include a single PFM 336 to support unidirectional prediction. Referring now to FIG. 6, there is illustrated a video decoder 600 implemented in accordance with one embodiment of the present invention which supports prediction, e.g., bi-directional prediction, based on multiple reference frames.

Circuitry included in FIG. 6 which bears the same reference numbers as circuits of other figures are the same as or similar to the other like numbered circuits and therefor will not be described again in detail.

The video decoder 600 of FIG. 6 comprises a channel buffer 612, a syntax parser/VLD and master state controller circuit 620, an inverse quantization circuit 103, a DCT truncation circuit 104, IDCT circuit 107, a downsampler 108, a MUX 20, summer 22, anchor frame memory 634 and a motion compensated prediction filter module 632.

The channel buffer 612 is responsible for receiving the video data to be decoded, e.g., from a transport decoder, for buffering it, and supplying it to the syntax parser/VLD and master state controller circuit 620. In addition to performing syntax parsing and variable length decoding functions the circuit 620 is responsible for supplying several different information signals, e.g., timing signals, mb_type information, current block indices and motion vectors to the motion compensated prediction module 632.

In the FIG. 6 embodiment, the motion compensated prediction module 632 comprises first and second prediction filter modules (PFMs) 636, 637, respectively, an average prediction circuit 630, and a multiplexer (MUX) 631. Each of the PFMs 636, 637 is responsible for performing the drift reduction and motion compensated prediction using a single but different reference frame. Accordingly, the anchor frame memory 634 is coupled to each of the PFMs 636, 637 to supply reduced representation anchor frames thereto for prediction purposes. While illustrated as two separate circuits, it is to be understood that the first and second PFMs 636, 637 could be implemented using a single PFM which is time shared.

In addition to receiving anchor frame data, each of the PFM's receives motion vectors, macroblock type information and the indices of the current block being decoded. This information is supplied by the syntax parser/VLD and master state controller circuit 620. The information received from the circuit 620 is used by the PFM's 636, 637 to determine the appropriate filter weights to be used when processing anchor frames and applying the received motion vectors thereto.

The output of each of the first and second PFMs 636, 637 is coupled to the input of the average prediction circuit 630. In addition, the output of the first PFM 636 is coupled to a first input of the MUX 631. The output of the average prediction circuit 630 is coupled to a second input of the MUX 631. The average prediction circuit 631 is responsible for averaging the pixel values generated by the first and second PFM's 636, 637 to generate a single set of pixel values therefrom when two way predictive coding is being used.

The MUX 631 is controlled by, e.g., the syntax parser/ VLD and master state controller 620 to couple the output of the first prediction filter module 636 to the second input of the summer 22 when one-way prediction is being performed. However, when two-way prediction is performed, the MUX 631 is controlled to couple the output of the average prediction circuit 630 to the second input of the summer 22.

Thus, by using a motion compensated prediction module 632 as illustrated in FIG. 6, motion compensation and drift reduction processing can be performed on reduced representations of images using motion vectors intended to be applied to full resolution anchor frames even when two way prediction is being used.

Figure 7:
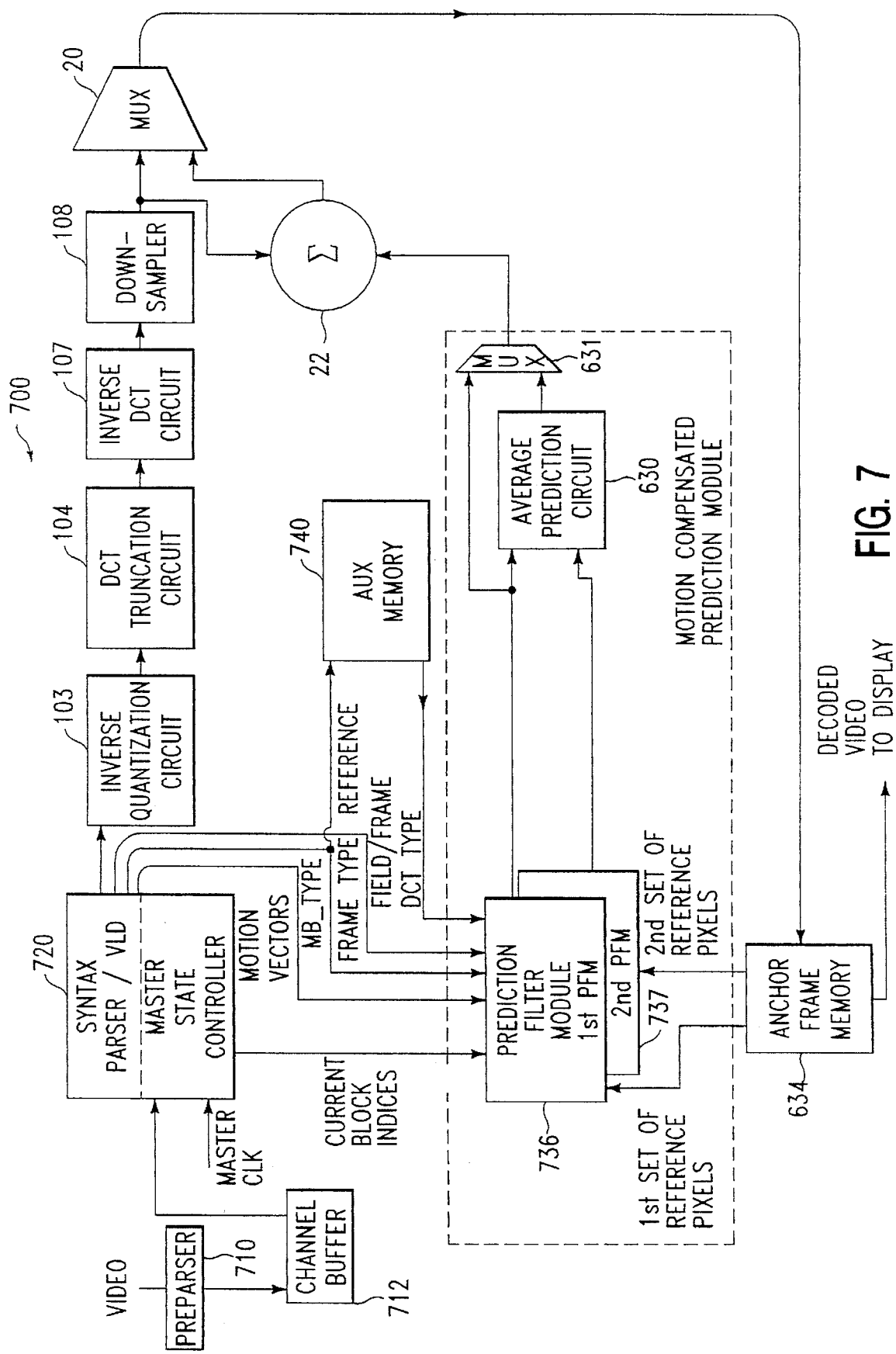
FIG. 7 is a block diagram illustrating a video decoder implemented in accordance with a second embodiment of the present invention.

FIG. 7 illustrates still yet another video decoder 700 implemented in accordance with an embodiment of the present invention. Components of the FIG. 7 embodiment bearing the same reference numbers as the components of the FIG. 6 embodiment are the same or similar components and, for the purposes of brevity, will not be described again in detail.

As is apparent from a comparison of the FIG. 6 and FIG. 7 embodiments, the FIG. 7 embodiment includes a preparser 710 not illustrated in the FIG. 6 embodiment, which is coupled in series with the input of the channel buffer 712. The preparser 710 is used to control the flow of data to the channel buffer 712 and to eliminate data as may be required. The preparser 710 may be the same as or similar to the preparser described in parent patent application Ser. No. 08/320,481.

In addition to the preparser 710, the video decoder 700 includes an auxiliary memory 740, not illustrated in the FIG. 6 embodiment, and first and second PFMs 736, 737 which use additional information not used by the PFMs 636, 637 to perform drift reduction filtering and motion compensation operations.

In the decoder circuit 700, the syntax parser/VLD and master state controller 720 provides, in addition to the information already discussed in regard to FIG. 6, frame type information to the first and second PFMs 736, 737 to provide the PFMs 736, 737 information on the type of frame currently being decoded. In addition, the macroblock type information, MB_TYPE, provided to the PFMs 736, 737 is also provided to the auxiliary memory 740 which is used to store information about the original coding of a reduced frame representation stored in the anchor frame memory 634, e.g., whether DCT coefficients used to generate the reduced representation $F_{rd}$ being used by the PFMs 736, 737 were originally coded according to a field or frame DCT type.

In the FIG. 7 embodiment, the PFM's 736, 737 may be used to compensate for spatial filtering that can result from the use of the preparser 710, as well as the DCT truncation circuit 104, IDCT 107 and downsampler 108. In addition, the PFMs 736, 737 can be used to process interlaced as well as non-interlaced frames or images.

A PFM 800 implemented in accordance with the present invention will now be described in detail with reference to FIG. 8. The PFM 800 illustrated in FIG. 8 may be used in the video decoder circuits of the present invention illustrated in FIGS. 3A, 3B, FIG. 6 and FIG. 7.

The PFM 800 of the present invention is responsible for performing a spatially variant drift reduction filtering operation along with the application of the motion vectors which were intended to be applied to a full resolution video frame or image. This operation may be, and in various embodiments is, based on, the index on the DCT block being decoded, the positions of the pixels used for reference within a periodic blocking structure, and the motion vector among other things. The number of reference pixels used to estimate each reference pixel value may also depend on the position of the block being decoded and the motion vector being used to generate the current image. The drift reduction operation performed by the PFM 336 of the present invention can be implemented as a set of spatially variant filters which operate on the reduced resolution reference frame $F_{rd}$ or segments thereof to effectively achieve upsampling, motion compensation and downsampling.

In one embodiment, the filter operator implemented by the PFM 336 is linear and represents the least mean square estimate based on a selected set of data in the downsampled reference picture of the reference pixels that would arise from downsampling using the spatially variant operator T on a full resolution reference picture. A statistical image model can be developed for this purpose and used to precompute filter coefficients to be used in the PFM filters.

Appendix A contains a listing of a program script that can be executed under the Matlab™ environment to produce a set of spatially variant filter coefficients that can be used to implement fourth order filters, e.g., the horizontal and vertical filters 808, 814, suitable for use as drift reduction filters. Matlab is a commercially available software product available form The MathWorks, Inc. which is located at 24 Prime Park Way, Natic, Mass. 01760. The example script generates filters for the exemplary case of 3:1 downsampling and 8×8 blocks.

As discussed above, in predictive coding of the pixels representing a frame or image, the pixels from one or more previously encoded reference frames or fields are used to form a prediction of the current frame being coded.

The goal of the PFM module 336 is to filter the reduced resolution frame $F_{rd}$ such that the pixel values generated by the PFM 336 for prediction purposes will approximate the pixel values that would be generated by applying the function T to a full resolution anchor frame F which has the pixels of interest located at the position specified by the motion vector in the current frame being decoded. Expressed another way, the goal of the spatially variant filtering operation performed by the PFM 336 is to produce an output $F_{rd}$ filterd such that:

$$F_{rd}\_filterd=TF$$

where T=the spatially variant filtering operation performed by the spatially variant filter 102, and F represents a full resolution anchor frame having the pixels of interest located at the position of interest in the current frame being generated.

Figure 8:
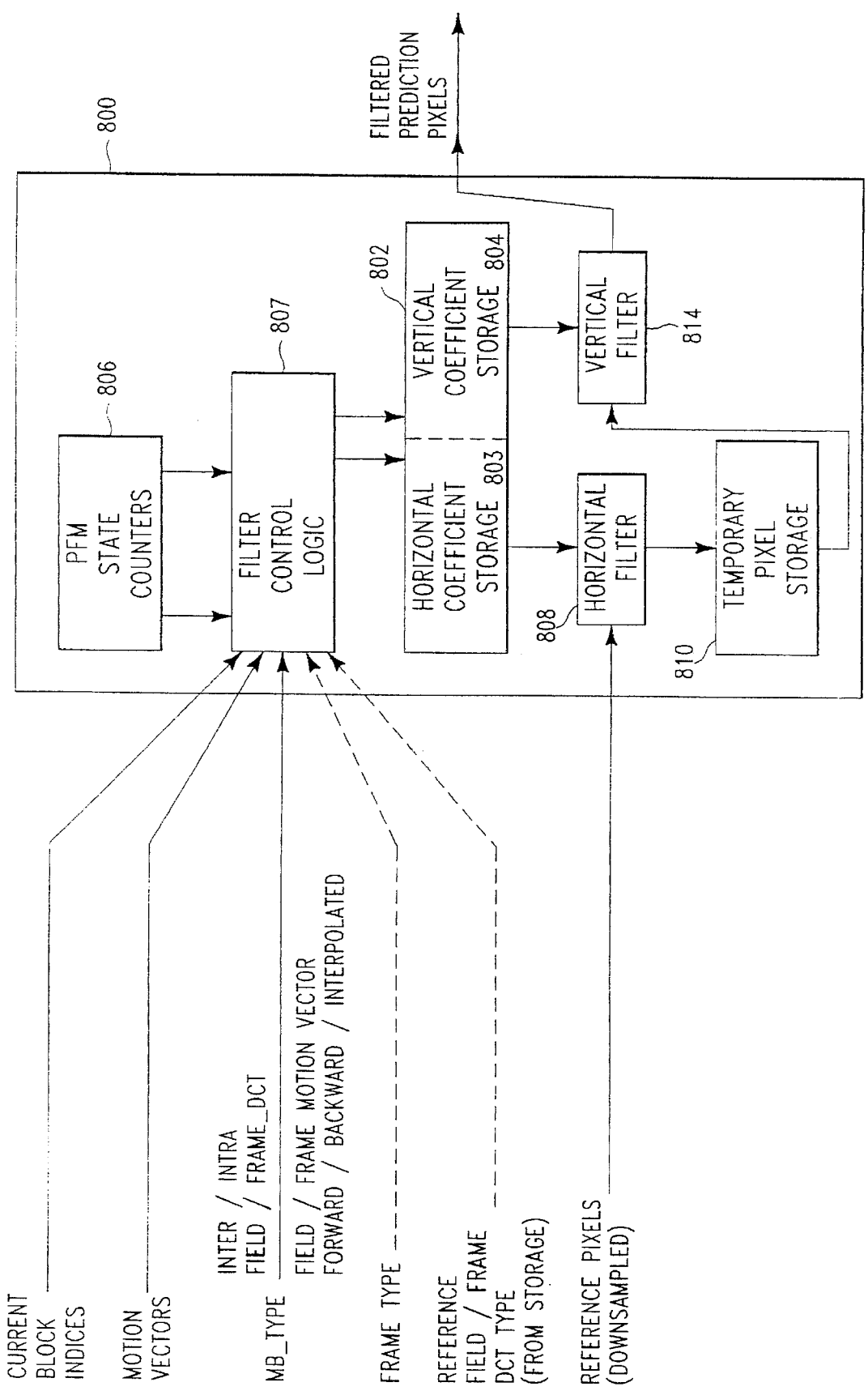
FIG. 8 is a block diagram of a prediction filter module implemented in accordance with an exemplary embodiment of the present invention.

Referring now to FIG. 8, there is illustrated a prediction filter module ("PFM") 800 implemented in accordance with one embodiment of the present invention. The prediction filter module 800 may be used as the PFM 336 of FIG. 3A.

The PFM comprises a PFM state counter unit 806, filter control logic 807, a filter coefficient storage unit 802, a horizontal filter 808, a temporary pixel storage unit 810 and a vertical filter 814. The coefficient storage unit 802 includes a horizontal coefficient storage section 803 for storing filter coefficient values used to control the horizontal filter 808. Similarly, the vertical coefficient storage section 804 is used to store filter coefficient values used to control the vertical filter 814. A PFM state counter unit 806 is coupled to the filter control logic 807, which, in turn, is coupled to the coefficient storage unit 802. The PFM state counter 806 drives the filter control logic 807 which is responsible for processing the information signals input thereto and for selecting filter coefficients to be used by the horizontal and vertical filters 808, 814. The control logic, in response to the output of the PFM state counters causes the coefficient storage unit 802 to output filter coefficient values at the appropriate time and in the proper sequence, i.e., to control the filtering of the pixel values supplied to the filters 808, 814.

The filter control logic 807 receives as its input the current block indices, e.g., the horizontal row and column indices of the current block being decoded, motion vectors to be used in the motion compensation process, macroblock type information, and, in various embodiments, frame type information and reference field/frame DCT type information.

The macroblock type information, illustrated in FIG. 8 as MB_TYPE, includes information which identifies whether a macroblock and the blocks which comprise the macroblock are inter-coded or intra-coded, whether the macroblock was coded on a field or frame DCT basis, whether the motion vector associated with the macroblock is a field or frame motion vector and whether the macroblock was coded using forward, backward or interpolated coding techniques.

The information supplied to the filter control logic 807 is used to determine the horizontal and vertical filter values required to achieve drift reduction. These filter values may be precomputed for various possible input values and stored in tables located within the filter coefficient storage unit 802.

In one particular embodiment, the horizontal and vertical coefficient values are separately generated by the filter control logic 807, e.g., using a coefficient look-up table, on a pixel by pixel basis, to insure that the filtering operation applied to the pixel values provides maximum drift reduction results.

While two separate coefficient storage units 803, 804 are illustrated, it is to be understood that in some embodiments, e.g., where downsampling is applied at the same rate in both the vertical and horizontal directions, it may be possible to use a single set of precomputed coefficients to control both the vertical and horizontal filters 803, 804.

Data representing the reference pixels corresponding to the downsampled anchor frame $F_{rd}$, used for prediction purposes, are supplied to the horizontal filter 808. The horizontal filter 808 performs a spatially variant filtering operation on the received data using the filter coefficients output by the horizontal coefficient storage unit 803. The results of this filtering operation are stored in the temporary pixel storage unit 810 and then supplied to the vertical filter 814 for further filtering.

The vertical filter 814 performs a spatially variant filtering operation on the pixel data supplied by the temporary pixel storage unit 810 to reduce drift thereon. As in the case of the horizontal filter 808, the filter coefficients used by the vertical filter 814 are supplied by the vertical coefficient storage unit 804, e.g., on a pixel by pixel basis.

The PFM 800 uses two one dimensional filters, e.g., the horizontal filter 808 and the vertical filter 814 to perform a two dimensional spatially variant filtering operation on the received data representing blocks of reference pixels. However, a single two dimensional filter could be used for this purpose. By performing two one dimensional filtering operations as described, it is possible to implement the PFM 800 with less circuitry than if a two dimensional filter were used.

Having described the components of the prediction filter module 800, we now return to a discussion of the PFM's role in drift reduction. The general operation and function of the PFM module 800 has been described above in regard to the earlier discussion of the FIG. 3A, 3B and FIG. 6 embodiments. In the FIG. 7 embodiment, the PFM filters 736, 737 rely on and use more input signals, e.g., the current frame type information provided by the syntax parser/VLD and master state controller circuit 720 and the reference field/ frame DCT type information.

In the FIG. 7 embodiment, the PFMs 736, 737 adapt to the coding of interlaced video. In particular, the prediction filters that are used will vary according to whether the pixels in a reference frame read out of the anchor frame memory 634 were coded using a field or frame structured DCT, whether there was field or frame motion compensation performed to created the anchor frame being used, and whether the current macroblock being decoded used field or frame structured DCT coding. The auxiliary memory 740 is used to store the coding information about the reference frames that is used by the PFMs 736, 737. One implementation of the auxiliary memory 740 involves the use of a one-bit deep memory array associated with each of the frames stored in the anchor frame memory 634. The memory array associated with each stored reference frame is used to keep track of the DCT structure used to code each of the reference frames stored in the anchor frame memory. In one embodiment each bit in the memory array is set to correspond to the DCT structure of a macroblock in the stored frame to which the array corresponds.

In the FIG. 7 embodiment, the drift reduction operation performed by the PFMs 736, 737 take into account whether high vertical frequency or mid-range vertical frequency DCT coefficients were discarded, e.g., by the preparser 710. In embodiments where the decision to discard DCT coefficients is not performed in a systematic or predictable way or is not ascertainable from the DCT structure of a stored anchor frame, for each of the stored anchor frames an additional one bit memory array may be incorporated into the auxiliary memory 740. The additional memory array could receive and store information, e.g., from the preparser 710 or the syntax parser/VLD circuit 720, as to what decision was made regarding the discarding of DCT coefficients with regard to each block of an anchor frame.

It should be noted that while the auxiliary memory 740 is illustrated as a separate memory device it may be incorporated into the channel buffer and/or anchor frame memory.

As discussed above, in many video decoders which incorporate downsampling the cost of circuitry is an important concern. In order to maximize the cost effective application of drift reduction processing resources, in one embodiment the complexity of the drift reduction operation being performed on an anchor frame is varied as a function of the amount of processing resources that are available as compared to the amount of drift reduction that will be achieved by processing the particular anchor frame. The filter control logic 807 in the PFM 800 is responsible for this function of optimizing overall achieved picture quality for a series of frames given a fixed degree of computational resources available in the PFM 800.

In accordance with the present invention, in one embodiment, the filter control logic 807 is used to control the degree of drift reduction that is performed on an anchor frame based on the macroblock prediction type and other measures of the instantaneous availability of processing resources, including available video bus bandwidth used for communication anchor frame data. In one particular embodiment the order of the horizontal and vertical filters 808, 814 used for drift reduction processing purposes is decreased when processing macroblocks that employ interpolated prediction as compared to when processing macroblocks which employ uni-directional prediction. The use of lower order filters reduces computation requirements associated with processing bi-directionally encoded images. In another embodiment frame type information is used to control the amount of drift reduction processing. Since B frames do not propagate drift, in one such embodiment, reduced complexity processing is performed on B frames as compared to P frames. For example, lower order filters may be used to perform drift reduction processing on B frames than are used on P frames. In such an embodiment the first and second PFM's 736, 737 need not be identical and, in fact, the second PFM 838 which is used in processing B frames may be less complex than the first PFM 736.

Because there is a significant difference in the burden on a decoder between processing macroblocks that use only one prediction reference, e.g., P frame macroblocks and some B frame macroblocks, and those that make use of interpolated prediction, e.g., B frame macroblocks that employ both forward and backward prediction, greater overall drift reduction can be achieved by devoting a greater percentage of the available drift reduction processing resources to the processing of macroblocks that use a single prediction reference as compared to those that use multiple prediction references. Accordingly, by processing bi-directionally encoded data differently than uni-directionally encoded data the present invention achieves drift reduction processing efficiencies as compared to systems which uniformly apply drift reduction processing to data being decoded.

While the above discussion of drift reduction operations has been discussed in terms of processing blocks of video data it is to be understood that images are frequently represented using luminance and chrominance blocks. The drift reduction processing techniques are generally applicable to both luminance and chrominance blocks. It is contemplated that in at least one embodiment, the drift reduction techniques will be applied separately to luminance and chrominance blocks.

APPENDIX A

The following is a brief explanation of the variables used in this appendix:

pi - The constant that is the ratio of a circle's circumference to its diameter

C - A vector that implements the scale factor that is commonly used in the definition of the DCT dct48 - a 48 x 48 matrix that performs six 8 point DCTs on a vector of length 48. The vector is implicitly partitioned as a concatenation of six 8 point vectors.

idct48 - the inverse of dct48 mask48 - a 48 x 48 matrix that effectively masks all but the 3 lowest frequency DCT coefficients on a partitioned 48 point vector.

downsample_ma48 - a 16 x 48 matrix that accomplishes 3:1 downsampling with a 3 point moving average filter transform_filt48 - a 48 x 48 matrix that models the effective lowpass filtering arising from zeroing all but the 3 lowest frequency coefficients on a partitioned 48 point vector ma_ds48 - a 16 x 48 matrix that models the effective lowpass filtering arising from zeroing all but the 3 lowest frequency coefficients on a partitioned 48 point vector, and subsequent 3:1 downsampling with moving average filtering meanZxW - a Z x W matrix that takes the mean of a length W vector, and sets each element of a length Z vector to this value rho - a correlation coefficient which models the pictures spatial correlation Rx - the 48 x 48 model spatial autocorrelation matrix dct - the 8 x 8 matrix that implements an 8 point forward DCT idct - the inverse of dct mask - an 8 x 8 matrix that effectively masks all but the 3 low frequency coefficients of an 8 point vector

-35- ds_ma0 - the 3 x 8 matrix that accomplishes 3:1 downsampling with a 3 point moving average filter, for the first block in the blocking structure with period 3. This matrix produces a single partial pixel value, in the rightmost position.

ds_ma1 - the 4 x 8 matrix that accomplishes 3:1 downsampling with a 3 point moving average filter, for the second block in the blocking structure with period 3. This matrix produces two partial pixel values, one at either end.

ds_ma0 - the 3 x 8 matrix that accomplishes 3:1 downsampling with a 3 point moving average filter, for the third block in the blocking structure with period 3. This matrix produces a single partial pixel value in the leftmost position.

pull_Z - a vector which extracts the Zth value from a vector of length 8 mc_Z - an 8 x 48 matrix which extracts 8 full resolution points from a vector of length 48 by a motion compensation shift of Z pixels sel_mcZ_ptW - a 4 x 16 matrix that selects four reduced resolution points from a vector of length 16, for use in estimating a single reduced resolution pixel, where Z represents the motion vector (modulo 48) and W represents the position of the full resolution pixel being estimated within the 8 point block.

T_W_Z - represents the spatially varying transform that generated the four reduced resolution points to be used in estimation from the full resolution reference picture. Z & W are as defined above.

D_W_Z - represents the filtering to produce a desired full resolution reference pixel, by taking into account the effects of zeroing DCT coefficients.
Z & W are as defined above.

w_W_Z - represents the Least Mean Square (LMS) filter to compute the desired full resolution reference pixel, given only downsampled data.

mcp_Z - represents the optimal filter to form an estimate of an 8 point full resolution block given reduced resolution data where Z is defined as above.

err_var - used in modeling the drift error (this does not enter the filter calculation)

mamcp_Z_chk_I - the filter for obtaining reduced drift with a motion shift value of Z, for the Ith block in the blocking structure with period 3.

Note that filters for fractional (half-pel) shift values are obtained by averaging the filters for the bracketing full resolution shifts.

```
pi = 3.1415926535897;

C = [1.0/sqrt(2) 1 1 1 1 1 1];

for u=0:7
for x=0:7
dct48(u+1,x+1)=0.5 * C(u+1) * cos( (2*x+1)*u*pi/16);
dct48(u+9,x+9)=0.5 * C(u+1) * cos( (2*x+1)*u*pi/16);
dct48(u+17,x+17)=0.5 * C(u+1) * cos( (2*x+1)*u*pi/16);
dct48(u+25,x+25)=0.5 * C(u+1) * cos( (2*x+1)*u*pi/16);
dct48(u+33,x+33)=0.5 * C(u+1) * cos( (2*x+1)*u*pi/16);
dct48(u+41,x+41)=0.5 * C(u+1) * cos( (2*x+1)*u*pi/16);
end
end idct48 = dct48';

mask48 = zeros(48,48);

for i=1:3
mask48(i,i) = 1;
mask48(i+8,i+8) = 1;
mask48(i+16,i+16) = 1;
mask48(i+24,i+24) = 1;
mask48(i+32,i+32) = 1;
mask48(i+40,i+40) = 1;
end
```

```
downsample_ma48 = zeros(16,48);

for i=0:15
downsample_ma48(i+1,3*i+1) = 1/3;
downsample_ma48(i+1,3*i+2) = 1/3;
downsample_ma48(i+1,3*i+3) = 1/3;
end transform_filt48 = idct48 * mask48 * dct48;

ma_ds48 = downsample_ma48 * transform_filt48;

mean2x2(1,:) = [0.5, 0.5];
mean2x2(2,:) = [0.5, 0.5];

mean3x3(1,:) = [1/3, 1/3, 1/3];
mean3x3(2,:) = [1/3, 1/3, 1/3];
mean3x3(3,:) = [1/3, 1/3, 1/3];

mean3x2(1,:) = [0.5, 0.5];
mean3x2(2,:) = [0.5, 0.5];
mean3x2(3,:) = [0.5, 0.5];

rho = 0.9;
for i=1:48
for j=1:48
Rx(i,j) = rho^abs(i-j);
end
end for u=0:7
for x=0:7
dct(u+1,x+1)=0.5 * C(u+1) * cos( (2*x+1)*u*pi/16);
end
end for u=0:7
for x=0:7
idct(x+1,u+1)=0.5 * C(u+1) * cos( (2*x+1)*u*pi/16);
end
end for i=1:8
for j=1:8
mask(i,j) = 0;
end
end for i=1:3
mask(i,i) = 1;
```

```
            end transform_filt8 = idct*mask*dct;

5          ds_ma0 = downsample_ma48(1:3,1:8);
            ds_ma1 = downsample_ma48(1:4,3:10);
            ds_ma2 = downsample_ma48(1:3,2:9);

mean_4 = [ 1/4, 1/4, 1/4, 1/4 ];
10
            mean_4x4(1,:) = [ 1/4, 1/4, 1/4, 1/4 ];
            mean_4x4(2,:) = [ 1/4, 1/4, 1/4, 1/4 ];
            mean_4x4(3,:) = [ 1/4, 1/4, 1/4, 1/4 ];
            mean_4x4(4,:) = [ 1/4, 1/4, 1/4, 1/4 ];
15
            pull_0 = [ 1 0 0 0 0 0 0 0 ];
            pull_1 = [ 0 1 0 0 0 0 0 0 ];
            pull_2 = [ 0 0 1 0 0 0 0 0 ];
            pull_3 = [ 0 0 0 1 0 0 0 0 ];
20          pull_4 = [ 0 0 0 0 1 0 0 0 ];
            pull_5 = [ 0 0 0 0 0 1 0 0 ];
            pull_6 = [ 0 0 0 0 0 0 1 0 ];
            pull_7 = [ 0 0 0 0 0 0 0 1 ];

25
            mc_5(1,:) = [ 0 0 0 0 0 1 0 0 0 0 0 0 0 0 0 0 0 0 0 0 0 0 0 0
            0 0 0 0 0 0 0 0 0 0 0 0 0 0 0 0 0 0 0 0 0 0 0 0 ];
            mc_5(2,:) = [ 0 0 0 0 0 0 1 0 0 0 0 0 0 0 0 0 0 0 0 0 0 0 0 0
            0 0 0 0 0 0 0 0 0 0 0 0 0 0 0 0 0 0 0 0 0 0 0 0 ];
30          mc_5(3,:) = [ 0 0 0 0 0 0 0 1 0 0 0 0 0 0 0 0 0 0 0 0 0 0 0 0
            0 0 0 0 0 0 0 0 0 0 0 0 0 0 0 0 0 0 0 0 0 0 0 0 ];
            mc_5(4,:) = [ 0 0 0 0 0 0 0 0 1 0 0 0 0 0 0 0 0 0 0 0 0 0 0 0
            0 0 0 0 0 0 0 0 0 0 0 0 0 0 0 0 0 0 0 0 0 0 0 0 ];
            mc_5(5,:) = [ 0 0 0 0 0 0 0 0 0 1 0 0 0 0 0 0 0 0 0 0 0 0 0 0
35          0 0 0 0 0 0 0 0 0 0 0 0 0 0 0 0 0 0 0 0 0 0 0 0 ];
            mc_5(6,:) = [ 0 0 0 0 0 0 0 0 0 0 1 0 0 0 0 0 0 0 0 0 0 0 0 0
            0 0 0 0 0 0 0 0 0 0 0 0 0 0 0 0 0 0 0 0 0 0 0 0 ];
            mc_5(7,:) = [ 0 0 0 0 0 0 0 0 0 0 0 1 0 0 0 0 0 0 0 0 0 0 0 0
            0 0 0 0 0 0 0 0 0 0 0 0 0 0 0 0 0 0 0 0 0 0 0 0 ];
40          mc_5(8,:) = [ 0 0 0 0 0 0 0 0 0 0 0 0 1 0 0 0 0 0 0 0 0 0 0 0
            0 0 0 0 0 0 0 0 0 0 0 0 0 0 0 0 0 0 0 0 0 0 0 0 ];

sel_mc5_pt0(1,:) = [ 1 0 0 0 0 0 0 0 0 0 0 0 0 0 0 ];
            sel_mc5_pt0(2,:) = [ 0 1 0 0 0 0 0 0 0 0 0 0 0 0 0 ];
45          sel_mc5_pt0(3,:) = [ 0 0 1 0 0 0 0 0 0 0 0 0 0 0 0 ];
            sel_mc5_pt0(4,:) = [ 0 0 0 1 0 0 0 0 0 0 0 0 0 0 0 ];

T_0_5 = sel_mc5_pt0 * ma_ds48;
            D_0_5 = pull_0 * transform_filt8 * mc_5;
50          w_0_5 = inv( T_0_5 * Rx * T_0_5' ) * T_0_5 * Rx * D_0_5';
```

-39-

```
mcp_5(1,:) = [ zeros(1,0)';(eye(4) - mean_4x4)*w_0_5 +
mean_4';zeros(1,12)']';
err_var(6,1)=D_0_5*Rx*D_0_5'-D_0_5*Rx*T_0_5'*inv(T_0_5*Rx*T_0_5')
*T_0_5*Rx* D_0_5';

sel_mc5_pt1(1,:) = [ 1 0 0 0 0 0 0 0 0 0 0 0 0 0 0 0 ];
sel_mc5_pt1(2,:) = [ 0 1 0 0 0 0 0 0 0 0 0 0 0 0 0 0 ];
sel_mc5_pt1(3,:) = [ 0 0 1 0 0 0 0 0 0 0 0 0 0 0 0 0 ];
sel_mc5_pt1(4,:) = [ 0 0 0 1 0 0 0 0 0 0 0 0 0 0 0 0 ];

T_1_5 = sel_mc5_pt1 * ma_ds48;
D_1_5 = pull_1 * transform_filt8 * mc_5;
w_1_5 = inv( T_1_5 * Rx * T_1_5' ) * T_1_5 * Rx * D_1_5';
mcp_5(2,:) = [ zeros(1,0)';(eye(4) - mean_4x4)*w_1_5 +
mean_4';zeros(1,12)']';
err_var(6,2)=D_1_5*Rx*D_1_5'-D_1_5*Rx*T_1_5'*inv(T_1_5*Rx*T_1_5')
*T_1_5*Rx* D_1_5';

sel_mc5_pt2(1,:) = [ 1 0 0 0 0 0 0 0 0 0 0 0 0 0 0 0 ];
sel_mc5_pt2(2,:) = [ 0 1 0 0 0 0 0 0 0 0 0 0 0 0 0 0 ];
sel_mc5_pt2(3,:) = [ 0 0 1 0 0 0 0 0 0 0 0 0 0 0 0 0 ];
sel_mc5_pt2(4,:) = [ 0 0 0 1 0 0 0 0 0 0 0 0 0 0 0 0 ];

T_2_5 = sel_mc5_pt2 * ma_ds48;
D_2_5 = pull_2 * transform_filt8 * mc_5;
w_2_5 = inv( T_2_5 * Rx * T_2_5' ) * T_2_5 * Rx * D_2_5';
mcp_5(3,:) = [ zeros(1,0)';(eye(4) - mean_4x4)*w_2_5 +
mean_4';zeros(1,12)']';
err_var(6,3)=D_2_5*Rx*D_2_5'-D_2_5*Rx*T_2_5'*inv(T_2_5*Rx*T_2_5')
*T_2_5*Rx* D_2_5';

sel_mc5_pt3(1,:) = [ 0 1 0 0 0 0 0 0 0 0 0 0 0 0 0 0 ];
sel_mc5_pt3(2,:) = [ 0 0 1 0 0 0 0 0 0 0 0 0 0 0 0 0 ];
sel_mc5_pt3(3,:) = [ 0 0 0 1 0 0 0 0 0 0 0 0 0 0 0 0 ];
sel_mc5_pt3(4,:) = [ 0 0 0 0 1 0 0 0 0 0 0 0 0 0 0 0 ];

T_3_5 = sel_mc5_pt3 * ma_ds48;
D_3_5 = pull_3 * transform_filt8 * mc_5;
w_3_5 = inv( T_3_5 * Rx * T_3_5' ) * T_3_5 * Rx * D_3_5';
mcp_5(4,:) = [ zeros(1,1)';(eye(4) - mean_4x4)*w_3_5 +
mean_4';zeros(1,11)']';
err_var(6,4)=D_3_5*Rx*D_3_5'-D_3_5*Rx*T_3_5'*inv(T_3_5*Rx*T_3_5')
*T_3_5*Rx* D_3_5';

sel_mc5_pt4(1,:) = [ 0 1 0 0 0 0 0 0 0 0 0 0 0 0 0 0 ];
sel_mc5_pt4(2,:) = [ 0 0 1 0 0 0 0 0 0 0 0 0 0 0 0 0 ];
sel_mc5_pt4(3,:) = [ 0 0 0 1 0 0 0 0 0 0 0 0 0 0 0 0 ];
sel_mc5_pt4(4,:) = [ 0 0 0 0 1 0 0 0 0 0 0 0 0 0 0 0 ];
```

```
      T_4_5 = sel_mc5_pt4 * ma_ds48;
      D_4_5 = pull_4 * transform_filt8 * mc_5;
      w_4_5 = inv( T_4_5 * Rx * T_4_5' ) * T_4_5 * Rx * D_4_5';
      mcp_5(5,:) = [ zeros(1,1)';(eye(4) - mean_4x4)*w_4_5 +
 5    mean_4';zeros(1,11)']';
      err_var(6,5)=D_4_5*Rx*D_4_5'-D_4_5*Rx*T_4_5'*inv(T_4_5*Rx*T_4_5')
      *T_4_5*Rx* D_4_5';

sel_mc5_pt5(1,:) = [ 0 1 0 0 0 0 0 0 0 0 0 0 0 0 0 ];
10    sel_mc5_pt5(2,:) = [ 0 0 1 0 0 0 0 0 0 0 0 0 0 0 0 ];
      sel_mc5_pt5(3,:) = [ 0 0 0 1 0 0 0 0 0 0 0 0 0 0 0 ];
      sel_mc5_pt5(4,:) = [ 0 0 0 0 1 0 0 0 0 0 0 0 0 0 0 ];

T_5_5 = sel_mc5_pt5 * ma_ds48;
15    D_5_5 = pull_5 * transform_filt8 * mc_5;
      w_5_5 = inv( T_5_5 * Rx * T_5_5' ) * T_5_5 * Rx * D_5_5';
      mcp_5(6,:) = [ zeros(1,1)';(eye(4) - mean_4x4)*w_5_5 +
      mean_4';zeros(1,11)']';
      err_var(6,6)=D_5_5*Rx*D_5_5'-D_5_5*Rx*T_5_5'*inv(T_5_5*Rx*T_5_5')
20    *T_5_5*Rx* D_5_5';

sel_mc5_pt6(1,:) = [ 0 0 1 0 0 0 0 0 0 0 0 0 0 0 0 ];
      sel_mc5_pt6(2,:) = [ 0 0 0 1 0 0 0 0 0 0 0 0 0 0 0 ];
      sel_mc5_pt6(3,:) = [ 0 0 0 0 1 0 0 0 0 0 0 0 0 0 0 ];
25    sel_mc5_pt6(4,:) = [ 0 0 0 0 0 1 0 0 0 0 0 0 0 0 0 ];

T_6_5 = sel_mc5_pt6 * ma_ds48;
      D_6_5 = pull_6 * transform_filt8 * mc_5;
      w_6_5 = inv( T_6_5 * Rx * T_6_5' ) * T_6_5 * Rx * D_6_5';
30    mcp_5(7,:) = [ zeros(1,2)';(eye(4) - mean_4x4)*w_6_5 +
      mean_4';zeros(1,10)']';
      err_var(6,7)=D_6_5*Rx*D_6_5'-D_6_5*Rx*T_6_5'*inv(T_6_5*Rx*T_6_5')
      *T_6_5*Rx* D_6_5';

35    sel_mc5_pt7(1,:) = [ 0 0 1 0 0 0 0 0 0 0 0 0 0 0 0 ];
      sel_mc5_pt7(2,:) = [ 0 0 0 1 0 0 0 0 0 0 0 0 0 0 0 ];
      sel_mc5_pt7(3,:) = [ 0 0 0 0 1 0 0 0 0 0 0 0 0 0 0 ];
      sel_mc5_pt7(4,:) = [ 0 0 0 0 0 1 0 0 0 0 0 0 0 0 0 ];

40    T_7_5 = sel_mc5_pt7 * ma_ds48;
      D_7_5 = pull_7 * transform_filt8 * mc_5;
      w_7_5 = inv( T_7_5 * Rx * T_7_5' ) * T_7_5 * Rx * D_7_5';
      mcp_5(8,:) = [ zeros(1,2)';(eye(4) - mean_4x4)*w_7_5 +
      mean_4';zeros(1,10)']';
45    err_var(6,8)=D_7_5*Rx*D_7_5'-D_7_5*Rx*T_7_5'*inv(T_7_5*Rx*T_7_5')
      *T_7_5*Rx* D_7_5';

mamcp_5_chk_0 = ds_ma0*mcp_5;
      save mamcp_5_chk_0 mamcp_5_chk_0 -ascii -double -tabs
50    mamcp_5_chk_1 = ds_ma1*mcp_5;
```

-41-

```
      save mamcp_5_chk_1 mamcp_5_chk_1 -ascii -double -tabs
      mamcp_5_chk_2 = ds_ma2*mcp_5;
      save mamcp_5_chk_2 mamcp_5_chk_2 -ascii -double -tabs 5     mc_6(1,:) = [ 0 0 0 0 0 0 1 0 0 0 0 0 0 0 0 0 0 0 0 0 0 0 0 0
      0 0 0 0 0 0 0 0 0 0 0 0 0 0 0 0 0 0 0 0 0 0 0 0 ];
      mc_6(2,:) = [ 0 0 0 0 0 0 0 1 0 0 0 0 0 0 0 0 0 0 0 0 0 0 0 0
      0 0 0 0 0 0 0 0 0 0 0 0 0 0 0 0 0 0 0 0 0 0 0 0 ];
      mc_6(3,:) = [ 0 0 0 0 0 0 0 0 1 0 0 0 0 0 0 0 0 0 0 0 0 0 0 0
10    0 0 0 0 0 0 0 0 0 0 0 0 0 0 0 0 0 0 0 0 0 0 0 0 ];
      mc_6(4,:) = [ 0 0 0 0 0 0 0 0 0 1 0 0 0 0 0 0 0 0 0 0 0 0 0 0
      0 0 0 0 0 0 0 0 0 0 0 0 0 0 0 0 0 0 0 0 0 0 0 0 ];
      mc_6(5,:) = [ 0 0 0 0 0 0 0 0 0 0 1 0 0 0 0 0 0 0 0 0 0 0 0 0
      0 0 0 0 0 0 0 0 0 0 0 0 0 0 0 0 0 0 0 0 0 0 0 0 ];
15    mc_6(6,:) = [ 0 0 0 0 0 0 0 0 0 0 0 1 0 0 0 0 0 0 0 0 0 0 0 0
      0 0 0 0 0 0 0 0 0 0 0 0 0 0 0 0 0 0 0 0 0 0 0 0 ];
      mc_6(7,:) = [ 0 0 0 0 0 0 0 0 0 0 0 0 1 0 0 0 0 0 0 0 0 0 0 0
      0 0 0 0 0 0 0 0 0 0 0 0 0 0 0 0 0 0 0 0 0 0 0 0 ];
      mc_6(8,:) = [ 0 0 0 0 0 0 0 0 0 0 0 0 0 1 0 0 0 0 0 0 0 0 0 0
20    0 0 0 0 0 0 0 0 0 0 0 0 0 0 0 0 0 0 0 0 0 0 0 0 ];

sel_mc6_pt0(1,:) = [ 1 0 0 0 0 0 0 0 0 0 0 0 0 0 0 0 ];
      sel_mc6_pt0(2,:) = [ 0 1 0 0 0 0 0 0 0 0 0 0 0 0 0 0 ];
      sel_mc6_pt0(3,:) = [ 0 0 1 0 0 0 0 0 0 0 0 0 0 0 0 0 ];
25    sel_mc6_pt0(4,:) = [ 0 0 0 1 0 0 0 0 0 0 0 0 0 0 0 0 ];

T_0_6 = sel_mc6_pt0 * ma_ds48;
      D_0_6 = pull_0 * transform_filt8 * mc_6;
      w_0_6 = inv( T_0_6 * Rx * T_0_6' ) * T_0_6 * Rx * D_0_6';
30    mcp_6(1,:) = [ zeros(1,0)';(eye(4) - mean_4x4)*w_0_6 +
      mean_4';zeros(1,12)']';
      err_var(7,1)=D_0_6*Rx*D_0_6'-D_0_6*Rx*T_0_6'*inv(T_0_6*Rx*T_0_6')
      *T_0_6*Rx* D_0_6';

35    sel_mc6_pt1(1,:) = [ 1 0 0 0 0 0 0 0 0 0 0 0 0 0 0 0 ];
      sel_mc6_pt1(2,:) = [ 0 1 0 0 0 0 0 0 0 0 0 0 0 0 0 0 ];
      sel_mc6_pt1(3,:) = [ 0 0 1 0 0 0 0 0 0 0 0 0 0 0 0 0 ];
      sel_mc6_pt1(4,:) = [ 0 0 0 1 0 0 0 0 0 0 0 0 0 0 0 0 ];

40    T_1_6 = sel_mc6_pt1 * ma_ds48;
      D_1_6 = pull_1 * transform_filt8 * mc_6;
      w_1_6 = inv( T_1_6 * Rx * T_1_6' ) * T_1_6 * Rx * D_1_6';
      mcp_6(2,:) = [ zeros(1,0)';(eye(4) - mean_4x4)*w_1_6 +
      mean_4';zeros(1,12)']';
45    err_var(7,2)=D_1_6*Rx*D_1_6'-D_1_6*Rx*T_1_6'*inv(T_1_6*Rx*T_1_6')
      *T_1_6*Rx* D_1_6';

sel_mc6_pt2(1,:) = [ 0 1 0 0 0 0 0 0 0 0 0 0 0 0 0 0 ];
      sel_mc6_pt2(2,:) = [ 0 0 1 0 0 0 0 0 0 0 0 0 0 0 0 0 ];
```

```
    sel_mc6_pt2(3,:) = [ 0 0 0 1 0 0 0 0 0 0 0 0 0 0 0 ];
    sel_mc6_pt2(4,:) = [ 0 0 0 0 1 0 0 0 0 0 0 0 0 0 0 ];

T_2_6 = sel_mc6_pt2 * ma_ds48;
5   D_2_6 = pull_2 * transform_filt8 * mc_6;
    w_2_6 = inv( T_2_6 * Rx * T_2_6' ) * T_2_6 * Rx * D_2_6';
    mcp_6(3,:) = [ zeros(1,1)';(eye(4) - mean_4x4)*w_2_6 +
    mean_4';zeros(1,11)']';
    err_var(7,3)=D_2_6*Rx*D_2_6'-D_2_6*Rx*T_2_6'*inv(T_2_6*Rx*T_2_6')
10  *T_2_6*Rx* D_2_6';

sel_mc6_pt3(1,:) = [ 0 1 0 0 0 0 0 0 0 0 0 0 0 0 0 ];
    sel_mc6_pt3(2,:) = [ 0 0 1 0 0 0 0 0 0 0 0 0 0 0 0 ];
    sel_mc6_pt3(3,:) = [ 0 0 0 1 0 0 0 0 0 0 0 0 0 0 0 ];
15  sel_mc6_pt3(4,:) = [ 0 0 0 0 1 0 0 0 0 0 0 0 0 0 0 ];

T_3_6 = sel_mc6_pt3 * ma_ds48;
    D_3_6 = pull_3 * transform_filt8 * mc_6;
    w_3_6 = inv( T_3_6 * Rx * T_3_6' ) * T_3_6 * Rx * D_3_6';
20  mcp_6(4,:) = [ zeros(1,1)';(eye(4) - mean_4x4)*w_3_6 +
    mean_4';zeros(1,11)']';
    err_var(7,4)=D_3_6*Rx*D_3_6'-D_3_6*Rx*T_3_6'*inv(T_3_6*Rx*T_3_6')
    *T_3_6*Rx* D_3_6';

25  sel_mc6_pt4(1,:) = [ 0 1 0 0 0 0 0 0 0 0 0 0 0 0 0 ];
    sel_mc6_pt4(2,:) = [ 0 0 1 0 0 0 0 0 0 0 0 0 0 0 0 ];
    sel_mc6_pt4(3,:) = [ 0 0 0 1 0 0 0 0 0 0 0 0 0 0 0 ];
    sel_mc6_pt4(4,:) = [ 0 0 0 0 1 0 0 0 0 0 0 0 0 0 0 ];

30  T_4_6 = sel_mc6_pt4 * ma_ds48;
    D_4_6 = pull_4 * transform_filt8 * mc_6;
    w_4_6 = inv( T_4_6 * Rx * T_4_6' ) * T_4_6 * Rx * D_4_6';
    mcp_6(5,:) = [ zeros(1,1)';(eye(4) - mean_4x4)*w_4_6 +
    mean_4';zeros(1,11)']';
35  err_var(7,5)=D_4_6*Rx*D_4_6'-D_4_6*Rx*T_4_6'*inv(T_4_6*Rx*T_4_6')
    *T_4_6*Rx* D_4_6';

sel_mc6_pt5(1,:) = [ 0 0 1 0 0 0 0 0 0 0 0 0 0 0 0 ];
    sel_mc6_pt5(2,:) = [ 0 0 0 1 0 0 0 0 0 0 0 0 0 0 0 ];
40  sel_mc6_pt5(3,:) = [ 0 0 0 0 1 0 0 0 0 0 0 0 0 0 0 ];
    sel_mc6_pt5(4,:) = [ 0 0 0 0 0 1 0 0 0 0 0 0 0 0 0 ];

T_5_6 = sel_mc6_pt5 * ma_ds48;
    D_5_6 = pull_5 * transform_filt8 * mc_6;
45  w_5_6 = inv( T_5_6 * Rx * T_5_6' ) * T_5_6 * Rx * D_5_6';
    mcp_6(6,:) = [ zeros(1,2)';(eye(4) - mean_4x4)*w_5_6 +
    mean_4';zeros(1,10)']';
    err_var(7,6)=D_5_6*Rx*D_5_6'-D_5_6*Rx*T_5_6'*inv(T_5_6*Rx*T_5_6')
    *T_5_6*Rx* D_5_6';
```

```
        sel_mc6_pt6(1,:) = [ 0 0 1 0 0 0 0 0 0 0 0 0 0 0 0 ];
        sel_mc6_pt6(2,:) = [ 0 0 0 1 0 0 0 0 0 0 0 0 0 0 0 ];
        sel_mc6_pt6(3,:) = [ 0 0 0 0 1 0 0 0 0 0 0 0 0 0 0 ];
        sel_mc6_pt6(4,:) = [ 0 0 0 0 0 1 0 0 0 0 0 0 0 0 0 ];
  5
        T_6_6 = sel_mc6_pt6 * ma_ds48;
        D_6_6 = pull_6 * transform_filt8 * mc_6;
        w_6_6 = inv( T_6_6 * Rx * T_6_6' ) * T_6_6 * Rx * D_6_6';
        mcp_6(7,:) = [ zeros(1,2)';(eye(4) - mean_4x4)*w_6_6 +
 10     mean_4';zeros(1,10)']';
        err_var(7,7)=D_6_6*Rx*D_6_6'-D_6_6*Rx*T_6_6'*inv(T_6_6*Rx*T_6_6')
        *T_6_6*Rx* D_6_6';

sel_mc6_pt7(1,:) = [ 0 0 1 0 0 0 0 0 0 0 0 0 0 0 0 ];
 15     sel_mc6_pt7(2,:) = [ 0 0 0 1 0 0 0 0 0 0 0 0 0 0 0 ];
        sel_mc6_pt7(3,:) = [ 0 0 0 0 1 0 0 0 0 0 0 0 0 0 0 ];
        sel_mc6_pt7(4,:) = [ 0 0 0 0 0 1 0 0 0 0 0 0 0 0 0 ];

T_7_6 = sel_mc6_pt7 * ma_ds48;
 20     D_7_6 = pull_7 * transform_filt8 * mc_6;
        w_7_6 = inv( T_7_6 * Rx * T_7_6' ) * T_7_6 * Rx * D_7_6';
        mcp_6(8,:) = [ zeros(1,2)';(eye(4) - mean_4x4)*w_7_6 +
        mean_4';zeros(1,10)']';
        err_var(7,8)=D_7_6*Rx*D_7_6'-D_7_6*Rx*T_7_6'*inv(T_7_6*Rx*T_7_6')
 25     *T_7_6*Rx* D_7_6';

mamcp_6_chk_0 = ds_ma0*mcp_6;
        save mamcp_6_chk_0 mamcp_6_chk_0 -ascii -double -tabs
        mamcp_6_chk_1 = ds_ma1*mcp_6;
 30     save mamcp_6_chk_1 mamcp_6_chk_1 -ascii -double -tabs
        mamcp_6_chk_2 = ds_ma2*mcp_6;
        save mamcp_6_chk_2 mamcp_6_chk_2 -ascii -double -tabs mc_7(1,:) = [ 0 0 0 0 0 0 0 1 0 0 0 0 0 0 0 0 0 0 0 0 0 0 0 0
 35     0 0 0 0 0 0 0 0 0 0 0 0 0 0 0 0 0 0 0 0 ];
        mc_7(2,:) = [ 0 0 0 0 0 0 0 0 1 0 0 0 0 0 0 0 0 0 0 0 0 0 0 0
        0 0 0 0 0 0 0 0 0 0 0 0 0 0 0 0 0 0 0 0 ];
        mc_7(3,:) = [ 0 0 0 0 0 0 0 0 0 1 0 0 0 0 0 0 0 0 0 0 0 0 0 0
        0 0 0 0 0 0 0 0 0 0 0 0 0 0 0 0 0 0 0 0 ];
 40     mc_7(4,:) = [ 0 0 0 0 0 0 0 0 0 0 1 0 0 0 0 0 0 0 0 0 0 0 0 0
        0 0 0 0 0 0 0 0 0 0 0 0 0 0 0 0 0 0 0 0 ];
        mc_7(5,:) = [ 0 0 0 0 0 0 0 0 0 0 0 1 0 0 0 0 0 0 0 0 0 0 0 0
        0 0 0 0 0 0 0 0 0 0 0 0 0 0 0 0 0 0 0 0 ];
        mc_7(6,:) = [ 0 0 0 0 0 0 0 0 0 0 0 0 1 0 0 0 0 0 0 0 0 0 0 0
 45     0 0 0 0 0 0 0 0 0 0 0 0 0 0 0 0 0 0 0 0 ];
        mc_7(7,:) = [ 0 0 0 0 0 0 0 0 0 0 0 0 0 1 0 0 0 0 0 0 0 0 0 0
        0 0 0 0 0 0 0 0 0 0 0 0 0 0 0 0 0 0 0 0 ];
        mc_7(8,:) = [ 0 0 0 0 0 0 0 0 0 0 0 0 0 0 1 0 0 0 0 0 0 0 0 0
        0 0 0 0 0 0 0 0 0 0 0 0 0 0 0 0 0 0 0 0 ];
```

-44-

```
sel_mc7_pt0(1,:) = [ 1 0 0 0 0 0 0 0 0 0 0 0 0 0 0 0 ];
sel_mc7_pt0(2,:) = [ 0 1 0 0 0 0 0 0 0 0 0 0 0 0 0 0 ];
sel_mc7_pt0(3,:) = [ 0 0 1 0 0 0 0 0 0 0 0 0 0 0 0 0 ];
sel_mc7_pt0(4,:) = [ 0 0 0 1 0 0 0 0 0 0 0 0 0 0 0 0 ];

T_0_7 = sel_mc7_pt0 * ma_ds48;
D_0_7 = pull_0 * transform_filt8 * mc_7;
w_0_7 = inv( T_0_7 * Rx * T_0_7' ) * T_0_7 * Rx * D_0_7';
mcp_7(1,:) = [ zeros(1,0)';(eye(4) - mean_4x4)*w_0_7 +
mean_4';zeros(1,12)']';
err_var(8,1)=D_0_7*Rx*D_0_7'-D_0_7*Rx*T_0_7'*inv(T_0_7*Rx*T_0_7')
*T_0_7*Rx* D_0_7';

sel_mc7_pt1(1,:) = [ 0 1 0 0 0 0 0 0 0 0 0 0 0 0 0 0 ];
sel_mc7_pt1(2,:) = [ 0 0 1 0 0 0 0 0 0 0 0 0 0 0 0 0 ];
sel_mc7_pt1(3,:) = [ 0 0 0 1 0 0 0 0 0 0 0 0 0 0 0 0 ];
sel_mc7_pt1(4,:) = [ 0 0 0 0 1 0 0 0 0 0 0 0 0 0 0 0 ];

T_1_7 = sel_mc7_pt1 * ma_ds48;
D_1_7 = pull_1 * transform_filt8 * mc_7;
w_1_7 = inv( T_1_7 * Rx * T_1_7' ) * T_1_7 * Rx * D_1_7';
mcp_7(2,:) = [ zeros(1,1)';(eye(4) - mean_4x4)*w_1_7 +
mean_4';zeros(1,11)']';
err_var(8,2)=D_1_7*Rx*D_1_7'-D_1_7*Rx*T_1_7'*inv(T_1_7*Rx*T_1_7')
*T_1_7*Rx* D_1_7';

sel_mc7_pt2(1,:) = [ 0 1 0 0 0 0 0 0 0 0 0 0 0 0 0 0 ];
sel_mc7_pt2(2,:) = [ 0 0 1 0 0 0 0 0 0 0 0 0 0 0 0 0 ];
sel_mc7_pt2(3,:) = [ 0 0 0 1 0 0 0 0 0 0 0 0 0 0 0 0 ];
sel_mc7_pt2(4,:) = [ 0 0 0 0 1 0 0 0 0 0 0 0 0 0 0 0 ];

T_2_7 = sel_mc7_pt2 * ma_ds48;
D_2_7 = pull_2 * transform_filt8 * mc_7;
w_2_7 = inv( T_2_7 * Rx * T_2_7' ) * T_2_7 * Rx * D_2_7';
mcp_7(3,:) = [ zeros(1,1)';(eye(4) - mean_4x4)*w_2_7 +
mean_4';zeros(1,11)']';
err_var(8,3)=D_2_7*Rx*D_2_7'-D_2_7*Rx*T_2_7'*inv(T_2_7*Rx*T_2_7')
*T_2_7*Rx* D_2_7';

sel_mc7_pt3(1,:) = [ 0 1 0 0 0 0 0 0 0 0 0 0 0 0 0 0 ];
sel_mc7_pt3(2,:) = [ 0 0 1 0 0 0 0 0 0 0 0 0 0 0 0 0 ];
sel_mc7_pt3(3,:) = [ 0 0 0 1 0 0 0 0 0 0 0 0 0 0 0 0 ];
sel_mc7_pt3(4,:) = [ 0 0 0 0 1 0 0 0 0 0 0 0 0 0 0 0 ];

T_3_7 = sel_mc7_pt3 * ma_ds48;
D_3_7 = pull_3 * transform_filt8 * mc_7;
w_3_7 = inv( T_3_7 * Rx * T_3_7' ) * T_3_7 * Rx * D_3_7';
mcp_7(4,:) = [ zeros(1,1)';(eye(4) - mean_4x4)*w_3_7 +
mean_4';zeros(1,11)']';
```

-45-

```
err_var(8,4)=D_3_7*Rx*D_3_7'-D_3_7*Rx*T_3_7'*inv(T_3_7*Rx*T_3_7')
*T_3_7*Rx* D_3_7';

sel_mc7_pt4(1,:) = [ 0 0 1 0 0 0 0 0 0 0 0 0 0 0 ];
sel_mc7_pt4(2,:) = [ 0 0 0 1 0 0 0 0 0 0 0 0 0 0 ];
sel_mc7_pt4(3,:) = [ 0 0 0 0 1 0 0 0 0 0 0 0 0 0 ];
sel_mc7_pt4(4,:) = [ 0 0 0 0 0 1 0 0 0 0 0 0 0 0 ];

T_4_7 = sel_mc7_pt4 * ma_ds48;
D_4_7 = pull_4 * transform_filt8 * mc_7;
w_4_7 = inv( T_4_7 * Rx * T_4_7' ) * T_4_7 * Rx * D_4_7';
mcp_7(5,:) = [ zeros(1,2)';(eye(4) - mean_4x4)*w_4_7 +
mean_4';zeros(1,10)']';
err_var(8,5)=D_4_7*Rx*D_4_7'-D_4_7*Rx*T_4_7'*inv(T_4_7*Rx*T_4_7')
*T_4_7*Rx* D_4_7';

sel_mc7_pt5(1,:) = [ 0 0 1 0 0 0 0 0 0 0 0 0 0 0 ];
sel_mc7_pt5(2,:) = [ 0 0 0 1 0 0 0 0 0 0 0 0 0 0 ];
sel_mc7_pt5(3,:) = [ 0 0 0 0 1 0 0 0 0 0 0 0 0 0 ];
sel_mc7_pt5(4,:) = [ 0 0 0 0 0 1 0 0 0 0 0 0 0 0 ];

T_5_7 = sel_mc7_pt5 * ma_ds48;
D_5_7 = pull_5 * transform_filt8 * mc_7;
w_5_7 = inv( T_5_7 * Rx * T_5_7' ) * T_5_7 * Rx * D_5_7';
mcp_7(6,:) = [ zeros(1,2)';(eye(4) - mean_4x4)*w_5_7 +
mean_4';zeros(1,10)']';
err_var(8,6)=D_5_7*Rx*D_5_7'-D_5_7*Rx*T_5_7'*inv(T_5_7*Rx*T_5_7')
*T_5_7*Rx* D_5_7';

sel_mc7_pt6(1,:) = [ 0 0 1 0 0 0 0 0 0 0 0 0 0 0 ];
sel_mc7_pt6(2,:) = [ 0 0 0 1 0 0 0 0 0 0 0 0 0 0 ];
sel_mc7_pt6(3,:) = [ 0 0 0 0 1 0 0 0 0 0 0 0 0 0 ];
sel_mc7_pt6(4,:) = [ 0 0 0 0 0 1 0 0 0 0 0 0 0 0 ];

T_6_7 = sel_mc7_pt6 * ma_ds48;
D_6_7 = pull_6 * transform_filt8 * mc_7;
w_6_7 = inv( T_6_7 * Rx * T_6_7' ) * T_6_7 * Rx * D_6_7';
mcp_7(7,:) = [ zeros(1,2)';(eye(4) - mean_4x4)*w_6_7 +
mean_4';zeros(1,10)']';
err_var(8,7)=D_6_7*Rx*D_6_7'-D_6_7*Rx*T_6_7'*inv(T_6_7*Rx*T_6_7')
*T_6_7*Rx* D_6_7';

sel_mc7_pt7(1,:) = [ 0 0 0 1 0 0 0 0 0 0 0 0 0 0 ];
sel_mc7_pt7(2,:) = [ 0 0 0 0 1 0 0 0 0 0 0 0 0 0 ];
sel_mc7_pt7(3,:) = [ 0 0 0 0 0 1 0 0 0 0 0 0 0 0 ];
sel_mc7_pt7(4,:) = [ 0 0 0 0 0 0 1 0 0 0 0 0 0 0 ];

T_7_7 = sel_mc7_pt7 * ma_ds48;
D_7_7 = pull_7 * transform_filt8 * mc_7;
w_7_7 = inv( T_7_7 * Rx * T_7_7' ) * T_7_7 * Rx * D_7_7';
```

-46-

```
mcp_7(8,:) = [ zeros(1,3)';(eye(4) - mean_4x4)*w_7_7 +
mean_4';zeros(1,9)']';
err_var(8,8)=D_7_7*Rx*D_7_7'-D_7_7*Rx*T_7_7'*inv(T_7_7*Rx*T_7_7')
    *T_7_7*Rx* D_7_7';

mamcp_7_chk_0 = ds_ma0*mcp_7;
save mamcp_7_chk_0 mamcp_7_chk_0 -ascii -double -tabs
mamcp_7_chk_1 = ds_ma1*mcp_7;
save mamcp_7_chk_1 mamcp_7_chk_1 -ascii -double -tabs
mamcp_7_chk_2 = ds_ma2*mcp_7;
save mamcp_7_chk_2 mamcp_7_chk_2 -ascii -double -tabs mc_8(1,:) = [ 0 0 0 0 0 0 0 0 1 0 0 0 0 0 0 0 0 0 0 0 0 0 0 0
    0 0 0 0 0 0 0 0 0 0 0 0 0 0 0 0 0 0 0 0 0 0 0 0 ];
mc_8(2,:) = [ 0 0 0 0 0 0 0 0 0 1 0 0 0 0 0 0 0 0 0 0 0 0 0 0
    0 0 0 0 0 0 0 0 0 0 0 0 0 0 0 0 0 0 0 0 0 0 0 0 ];
mc_8(3,:) = [ 0 0 0 0 0 0 0 0 0 0 1 0 0 0 0 0 0 0 0 0 0 0 0 0
    0 0 0 0 0 0 0 0 0 0 0 0 0 0 0 0 0 0 0 0 0 0 0 0 ];
mc_8(4,:) = [ 0 0 0 0 0 0 0 0 0 0 0 1 0 0 0 0 0 0 0 0 0 0 0 0
    0 0 0 0 0 0 0 0 0 0 0 0 0 0 0 0 0 0 0 0 0 0 0 0 ];
mc_8(5,:) = [ 0 0 0 0 0 0 0 0 0 0 0 0 1 0 0 0 0 0 0 0 0 0 0 0
    0 0 0 0 0 0 0 0 0 0 0 0 0 0 0 0 0 0 0 0 0 0 0 0 ];
mc_8(6,:) = [ 0 0 0 0 0 0 0 0 0 0 0 0 0 1 0 0 0 0 0 0 0 0 0 0
    0 0 0 0 0 0 0 0 0 0 0 0 0 0 0 0 0 0 0 0 0 0 0 0 ];
mc_8(7,:) = [ 0 0 0 0 0 0 0 0 0 0 0 0 0 0 1 0 0 0 0 0 0 0 0 0
    0 0 0 0 0 0 0 0 0 0 0 0 0 0 0 0 0 0 0 0 0 0 0 0 ];
mc_8(8,:) = [ 0 0 0 0 0 0 0 0 0 0 0 0 0 0 0 1 0 0 0 0 0 0 0 0
    0 0 0 0 0 0 0 0 0 0 0 0 0 0 0 0 0 0 0 0 0 0 0 0 ];

sel_mc8_pt0(1,:) = [ 0 1 0 0 0 0 0 0 0 0 0 0 0 0 0 0 ];
sel_mc8_pt0(2,:) = [ 0 0 1 0 0 0 0 0 0 0 0 0 0 0 0 0 ];
sel_mc8_pt0(3,:) = [ 0 0 0 1 0 0 0 0 0 0 0 0 0 0 0 0 ];
sel_mc8_pt0(4,:) = [ 0 0 0 0 1 0 0 0 0 0 0 0 0 0 0 0 ];

T_0_8 = sel_mc8_pt0 * ma_ds48;
D_0_8 = pull_0 * transform_filt8 * mc_8;
w_0_8 = inv( T_0_8 * Rx * T_0_8' ) * T_0_8 * Rx * D_0_8';
mcp_8(1,:) = [ zeros(1,1)';(eye(4) - mean_4x4)*w_0_8 +
mean_4';zeros(1,11)']';
err_var(9,1)=D_0_8*Rx*D_0_8'-D_0_8*Rx*T_0_8'*inv(T_0_8*Rx*T_0_8')
    *T_0_8*Rx* D_0_8';

sel_mc8_pt1(1,:) = [ 0 1 0 0 0 0 0 0 0 0 0 0 0 0 0 0 ];
sel_mc8_pt1(2,:) = [ 0 0 1 0 0 0 0 0 0 0 0 0 0 0 0 0 ];
sel_mc8_pt1(3,:) = [ 0 0 0 1 0 0 0 0 0 0 0 0 0 0 0 0 ];
sel_mc8_pt1(4,:) = [ 0 0 0 0 1 0 0 0 0 0 0 0 0 0 0 0 ];

T_1_8 = sel_mc8_pt1 * ma_ds48;
D_1_8 = pull_1 * transform_filt8 * mc_8;
w_1_8 = inv( T_1_8 * Rx * T_1_8' ) * T_1_8 * Rx * D_1_8';
```

```
mcp_8(2,:) = [ zeros(1,1)';(eye(4) - mean_4x4)*w_1_8 +
mean_4';zeros(1,11)']';
err_var(9,2)=D_1_8*Rx*D_1_8'-D_1_8*Rx*T_1_8'*inv(T_1_8*Rx*T_1_8')
*T_1_8*Rx* D_1_8';

sel_mc8_pt2(1,:) = [ 0 1 0 0 0 0 0 0 0 0 0 0 0 0 0 ];
sel_mc8_pt2(2,:) = [ 0 0 1 0 0 0 0 0 0 0 0 0 0 0 0 ];
sel_mc8_pt2(3,:) = [ 0 0 0 1 0 0 0 0 0 0 0 0 0 0 0 ];
sel_mc8_pt2(4,:) = [ 0 0 0 0 1 0 0 0 0 0 0 0 0 0 0 ];

T_2_8 = sel_mc8_pt2 * ma_ds48;
D_2_8 = pull_2 * transform_filt8 * mc_8;
w_2_8 = inv( T_2_8 * Rx * T_2_8' ) * T_2_8 * Rx * D_2_8';
mcp_8(3,:) = [ zeros(1,1)';(eye(4) - mean_4x4)*w_2_8 +
mean_4';zeros(1,11)']';
err_var(9,3)=D_2_8*Rx*D_2_8'-D_2_8*Rx*T_2_8'*inv(T_2_8*Rx*T_2_8')
*T_2_8*Rx* D_2_8';

sel_mc8_pt3(1,:) = [ 0 0 1 0 0 0 0 0 0 0 0 0 0 0 0 ];
sel_mc8_pt3(2,:) = [ 0 0 0 1 0 0 0 0 0 0 0 0 0 0 0 ];
sel_mc8_pt3(3,:) = [ 0 0 0 0 1 0 0 0 0 0 0 0 0 0 0 ];
sel_mc8_pt3(4,:) = [ 0 0 0 0 0 1 0 0 0 0 0 0 0 0 0 ];

T_3_8 = sel_mc8_pt3 * ma_ds48;
D_3_8 = pull_3 * transform_filt8 * mc_8;
w_3_8 = inv( T_3_8 * Rx * T_3_8' ) * T_3_8 * Rx * D_3_8';
mcp_8(4,:) = [ zeros(1,2)';(eye(4) - mean_4x4)*w_3_8 +
mean_4';zeros(1,10)']';
err_var(9,4)=D_3_8*Rx*D_3_8'-D_3_8*Rx*T_3_8'*inv(T_3_8*Rx*T_3_8')
*T_3_8*Rx* D_3_8';

sel_mc8_pt4(1,:) = [ 0 0 1 0 0 0 0 0 0 0 0 0 0 0 0 ];
sel_mc8_pt4(2,:) = [ 0 0 0 1 0 0 0 0 0 0 0 0 0 0 0 ];
sel_mc8_pt4(3,:) = [ 0 0 0 0 1 0 0 0 0 0 0 0 0 0 0 ];
sel_mc8_pt4(4,:) = [ 0 0 0 0 0 1 0 0 0 0 0 0 0 0 0 ];

T_4_8 = sel_mc8_pt4 * ma_ds48;
D_4_8 = pull_4 * transform_filt8 * mc_8;
w_4_8 = inv( T_4_8 * Rx * T_4_8' ) * T_4_8 * Rx * D_4_8';
mcp_8(5,:) = [ zeros(1,2)';(eye(4) - mean_4x4)*w_4_8 +
mean_4';zeros(1,10)']';
err_var(9,5)=D_4_8*Rx*D_4_8'-D_4_8*Rx*T_4_8'*inv(T_4_8*Rx*T_4_8')
*T_4_8*Rx* D_4_8';

sel_mc8_pt5(1,:) = [ 0 0 1 0 0 0 0 0 0 0 0 0 0 0 0 ];
sel_mc8_pt5(2,:) = [ 0 0 0 1 0 0 0 0 0 0 0 0 0 0 0 ];
sel_mc8_pt5(3,:) = [ 0 0 0 0 1 0 0 0 0 0 0 0 0 0 0 ];
sel_mc8_pt5(4,:) = [ 0 0 0 0 0 1 0 0 0 0 0 0 0 0 0 ];

T_5_8 = sel_mc8_pt5 * ma_ds48;
```

```
D_5_8 = pull_5 * transform_filt8 * mc_8;
w_5_8 = inv( T_5_8 * Rx * T_5_8' ) * T_5_8 * Rx * D_5_8';
mcp_8(6,:) = [ zeros(1,2)';(eye(4) - mean_4x4)*w_5_8 +
mean_4';zeros(1,10)']';
err_var(9,6)=D_5_8*Rx*D_5_8'-D_5_8*Rx*T_5_8'*inv(T_5_8*Rx*T_5_8')
*T_5_8*Rx* D_5_8';

sel_mc8_pt6(1,:) = [ 0 0 0 1 0 0 0 0 0 0 0 0 0 0 0 0 ];
sel_mc8_pt6(2,:) = [ 0 0 0 0 1 0 0 0 0 0 0 0 0 0 0 0 ];
sel_mc8_pt6(3,:) = [ 0 0 0 0 0 1 0 0 0 0 0 0 0 0 0 0 ];
sel_mc8_pt6(4,:) = [ 0 0 0 0 0 0 1 0 0 0 0 0 0 0 0 0 ];

T_6_8 = sel_mc8_pt6 * ma_ds48;
D_6_8 = pull_6 * transform_filt8 * mc_8;
w_6_8 = inv( T_6_8 * Rx * T_6_8' ) * T_6_8 * Rx * D_6_8';
mcp_8(7,:) = [ zeros(1,3)';(eye(4) - mean_4x4)*w_6_8 +
mean_4';zeros(1,9)']';
err_var(9,7)=D_6_8*Rx*D_6_8'-D_6_8*Rx*T_6_8'*inv(T_6_8*Rx*T_6_8')
*T_6_8*Rx* D_6_8';

sel_mc8_pt7(1,:) = [ 0 0 0 1 0 0 0 0 0 0 0 0 0 0 0 0 ];
sel_mc8_pt7(2,:) = [ 0 0 0 0 1 0 0 0 0 0 0 0 0 0 0 0 ];
sel_mc8_pt7(3,:) = [ 0 0 0 0 0 1 0 0 0 0 0 0 0 0 0 0 ];
sel_mc8_pt7(4,:) = [ 0 0 0 0 0 0 1 0 0 0 0 0 0 0 0 0 ];

T_7_8 = sel_mc8_pt7 * ma_ds48;
D_7_8 = pull_7 * transform_filt8 * mc_8;
w_7_8 = inv( T_7_8 * Rx * T_7_8' ) * T_7_8 * Rx * D_7_8';
mcp_8(8,:) = [ zeros(1,3)';(eye(4) - mean_4x4)*w_7_8 +
mean_4';zeros(1,9)']';
err_var(9,8)=D_7_8*Rx*D_7_8'-D_7_8*Rx*T_7_8'*inv(T_7_8*Rx*T_7_8')
*T_7_8*Rx* D_7_8';

mamcp_8_chk_0 = ds_ma0*mcp_8;
save mamcp_8_chk_0 mamcp_8_chk_0 -ascii -double -tabs
mamcp_8_chk_1 = ds_ma1*mcp_8;
save mamcp_8_chk_1 mamcp_8_chk_1 -ascii -double -tabs
mamcp_8_chk_2 = ds_ma2*mcp_8;
save mamcp_8_chk_2 mamcp_8_chk_2 -ascii -double -tabs mc_9(1,:) = [ 0 0 0 0 0 0 0 0 1 0 0 0 0 0 0 0 0 0 0 0 0 0 0
0 0 0 0 0 0 0 0 0 0 0 0 0 0 0 0 0 0 0 ];
mc_9(2,:) = [ 0 0 0 0 0 0 0 0 0 1 0 0 0 0 0 0 0 0 0 0 0 0 0
0 0 0 0 0 0 0 0 0 0 0 0 0 0 0 0 0 0 0 ];
mc_9(3,:) = [ 0 0 0 0 0 0 0 0 0 0 1 0 0 0 0 0 0 0 0 0 0 0 0
0 0 0 0 0 0 0 0 0 0 0 0 0 0 0 0 0 0 0 ];
mc_9(4,:) = [ 0 0 0 0 0 0 0 0 0 0 0 1 0 0 0 0 0 0 0 0 0 0 0
0 0 0 0 0 0 0 0 0 0 0 0 0 0 0 0 0 0 0 ];
mc_9(5,:) = [ 0 0 0 0 0 0 0 0 0 0 0 0 1 0 0 0 0 0 0 0 0 0 0
0 0 0 0 0 0 0 0 0 0 0 0 0 0 0 0 0 0 0 ];
```

```
mc_9(6,:) = [ 0 0 0 0 0 0 0 0 0 0 0 0 0 1 0 0 0 0 0 0 0 0 0 0
               0 0 0 0 0 0 0 0 0 0 0 0 0 0 0 0 0 0 0 0 0 0 0 0 ];
mc_9(7,:) = [ 0 0 0 0 0 0 0 0 0 0 0 0 0 0 1 0 0 0 0 0 0 0 0 0
               0 0 0 0 0 0 0 0 0 0 0 0 0 0 0 0 0 0 0 0 0 0 0 0 ];
mc_9(8,:) = [ 0 0 0 0 0 0 0 0 0 0 0 0 0 0 0 1 0 0 0 0 0 0 0 0
               0 0 0 0 0 0 0 0 0 0 0 0 0 0 0 0 0 0 0 0 0 0 0 0 ];

sel_mc9_pt0(1,:) = [ 0 1 0 0 0 0 0 0 0 0 0 0 0 0 0 0 ];
sel_mc9_pt0(2,:) = [ 0 0 1 0 0 0 0 0 0 0 0 0 0 0 0 0 ];
sel_mc9_pt0(3,:) = [ 0 0 0 1 0 0 0 0 0 0 0 0 0 0 0 0 ];
sel_mc9_pt0(4,:) = [ 0 0 0 0 1 0 0 0 0 0 0 0 0 0 0 0 ];

T_0_9 = sel_mc9_pt0 * ma_ds48;
D_0_9 = pull_0 * transform_filt8 * mc_9;
w_0_9 = inv( T_0_9 * Rx * T_0_9' ) * T_0_9 * Rx * D_0_9';
mcp_9(1,:) = [ zeros(1,1)';(eye(4) - mean_4x4)*w_0_9 +
mean_4';zeros(1,11)']';
err_var(10,1)=D_0_9*Rx*D_0_9'-D_0_9*Rx*T_0_9'*inv(T_0_9*Rx*T_0_9'
)*T_0_9*Rx* D_0_9';

sel_mc9_pt1(1,:) = [ 0 1 0 0 0 0 0 0 0 0 0 0 0 0 0 0 ];
sel_mc9_pt1(2,:) = [ 0 0 1 0 0 0 0 0 0 0 0 0 0 0 0 0 ];
sel_mc9_pt1(3,:) = [ 0 0 0 1 0 0 0 0 0 0 0 0 0 0 0 0 ];
sel_mc9_pt1(4,:) = [ 0 0 0 0 1 0 0 0 0 0 0 0 0 0 0 0 ];

T_1_9 = sel_mc9_pt1 * ma_ds48;
D_1_9 = pull_1 * transform_filt8 * mc_9;
w_1_9 = inv( T_1_9 * Rx * T_1_9' ) * T_1_9 * Rx * D_1_9';
mcp_9(2,:) = [ zeros(1,1)';(eye(4) - mean_4x4)*w_1_9 +
mean_4';zeros(1,11)']';
err_var(10,2)=D_1_9*Rx*D_1_9'-D_1_9*Rx*T_1_9'*inv(T_1_9*Rx*T_1_9'
)*T_1_9*Rx* D_1_9';

sel_mc9_pt2(1,:) = [ 0 0 1 0 0 0 0 0 0 0 0 0 0 0 0 0 ];
sel_mc9_pt2(2,:) = [ 0 0 0 1 0 0 0 0 0 0 0 0 0 0 0 0 ];
sel_mc9_pt2(3,:) = [ 0 0 0 0 1 0 0 0 0 0 0 0 0 0 0 0 ];
sel_mc9_pt2(4,:) = [ 0 0 0 0 0 1 0 0 0 0 0 0 0 0 0 0 ];

T_2_9 = sel_mc9_pt2 * ma_ds48;
D_2_9 = pull_2 * transform_filt8 * mc_9;
w_2_9 = inv( T_2_9 * Rx * T_2_9' ) * T_2_9 * Rx * D_2_9';
mcp_9(3,:) = [ zeros(1,2)';(eye(4) - mean_4x4)*w_2_9 +
mean_4';zeros(1,10)']';
err_var(10,3)=D_2_9*Rx*D_2_9'-D_2_9*Rx*T_2_9'*inv(T_2_9*Rx*T_2_9'
)*T_2_9*Rx* D_2_9';

sel_mc9_pt3(1,:) = [ 0 0 1 0 0 0 0 0 0 0 0 0 0 0 0 0 ];
sel_mc9_pt3(2,:) = [ 0 0 0 1 0 0 0 0 0 0 0 0 0 0 0 0 ];
sel_mc9_pt3(3,:) = [ 0 0 0 0 1 0 0 0 0 0 0 0 0 0 0 0 ];
sel_mc9_pt3(4,:) = [ 0 0 0 0 0 1 0 0 0 0 0 0 0 0 0 0 ];
```

```
T_3_9 = sel_mc9_pt3 * ma_ds48;
D_3_9 = pull_3 * transform_filt8 * mc_9;
w_3_9 = inv( T_3_9 * Rx * T_3_9' ) * T_3_9 * Rx * D_3_9';
mcp_9(4,:) = [ zeros(1,2)';(eye(4) - mean_4x4)*w_3_9 +
mean_4';zeros(1,10)']';
err_var(10,4)=D_3_9*Rx*D_3_9'-D_3_9*Rx*T_3_9'*inv(T_3_9*Rx*T_3_9'
)*T_3_9*Rx* D_3_9';

sel_mc9_pt4(1,:) = [ 0 0 1 0 0 0 0 0 0 0 0 0 0 0 0 ];
sel_mc9_pt4(2,:) = [ 0 0 0 1 0 0 0 0 0 0 0 0 0 0 0 ];
sel_mc9_pt4(3,:) = [ 0 0 0 0 1 0 0 0 0 0 0 0 0 0 0 ];
sel_mc9_pt4(4,:) = [ 0 0 0 0 0 1 0 0 0 0 0 0 0 0 0 ];

T_4_9 = sel_mc9_pt4 * ma_ds48;
D_4_9 = pull_4 * transform_filt8 * mc_9;
w_4_9 = inv( T_4_9 * Rx * T_4_9' ) * T_4_9 * Rx * D_4_9';
mcp_9(5,:) = [ zeros(1,2)';(eye(4) - mean_4x4)*w_4_9 +
mean_4';zeros(1,10)']';
err_var(10,5)=D_4_9*Rx*D_4_9'-D_4_9*Rx*T_4_9'*inv(T_4_9*Rx*T_4_9'
)*T_4_9*Rx* D_4_9';

sel_mc9_pt5(1,:) = [ 0 0 0 1 0 0 0 0 0 0 0 0 0 0 0 ];
sel_mc9_pt5(2,:) = [ 0 0 0 0 1 0 0 0 0 0 0 0 0 0 0 ];
sel_mc9_pt5(3,:) = [ 0 0 0 0 0 1 0 0 0 0 0 0 0 0 0 ];
sel_mc9_pt5(4,:) = [ 0 0 0 0 0 0 1 0 0 0 0 0 0 0 0 ];

T_5_9 = sel_mc9_pt5 * ma_ds48;
D_5_9 = pull_5 * transform_filt8 * mc_9;
w_5_9 = inv( T_5_9 * Rx * T_5_9' ) * T_5_9 * Rx * D_5_9';
mcp_9(6,:) = [ zeros(1,3)';(eye(4) - mean_4x4)*w_5_9 +
mean_4';zeros(1,9)']';
err_var(10,6)=D_5_9*Rx*D_5_9'-D_5_9*Rx*T_5_9'*inv(T_5_9*Rx*T_5_9'
)*T_5_9*Rx* D_5_9';

sel_mc9_pt6(1,:) = [ 0 0 0 1 0 0 0 0 0 0 0 0 0 0 0 ];
sel_mc9_pt6(2,:) = [ 0 0 0 0 1 0 0 0 0 0 0 0 0 0 0 ];
sel_mc9_pt6(3,:) = [ 0 0 0 0 0 1 0 0 0 0 0 0 0 0 0 ];
sel_mc9_pt6(4,:) = [ 0 0 0 0 0 0 1 0 0 0 0 0 0 0 0 ];

T_6_9 = sel_mc9_pt6 * ma_ds48;
D_6_9 = pull_6 * transform_filt8 * mc_9;
w_6_9 = inv( T_6_9 * Rx * T_6_9' ) * T_6_9 * Rx * D_6_9';
mcp_9(7,:) = [ zeros(1,3)';(eye(4) - mean_4x4)*w_6_9 +
mean_4';zeros(1,9)']';
err_var(10,7)=D_6_9*Rx*D_6_9'-D_6_9*Rx*T_6_9'*inv(T_6_9*Rx*T_6_9'
)*T_6_9*Rx* D_6_9';

sel_mc9_pt7(1,:) = [ 0 0 0 1 0 0 0 0 0 0 0 0 0 0 0 ];
sel_mc9_pt7(2,:) = [ 0 0 0 0 1 0 0 0 0 0 0 0 0 0 0 ];
```

```
sel_mc9_pt7(3,:) = [ 0 0 0 0 0 1 0 0 0 0 0 0 0 0 ];
sel_mc9_pt7(4,:) = [ 0 0 0 0 0 0 1 0 0 0 0 0 0 0 ];

T_7_9 = sel_mc9_pt7 * ma_ds48;
D_7_9 = pull_7 * transform_filt8 * mc_9;
w_7_9 = inv( T_7_9 * Rx * T_7_9' ) * T_7_9 * Rx * D_7_9';
mcp_9(8,:) = [ zeros(1,3)';(eye(4) - mean_4x4)*w_7_9 +
mean_4';zeros(1,9)']';
err_var(10,8)=D_7_9*Rx*D_7_9'-D_7_9*Rx*T_7_9'*inv(T_7_9*Rx*T_7_9'
)*T_7_9*Rx* D_7_9';

mamcp_9_chk_0 = ds_ma0*mcp_9;
save mamcp_9_chk_0 mamcp_9_chk_0 -ascii -double -tabs
mamcp_9_chk_1 = ds_ma1*mcp_9;
save mamcp_9_chk_1 mamcp_9_chk_1 -ascii -double -tabs
mamcp_9_chk_2 = ds_ma2*mcp_9;
save mamcp_9_chk_2 mamcp_9_chk_2 -ascii -double -tabs mc_10(1,:) = [ 0 0 0 0 0 0 0 0 0 1 0 0 0 0 0 0 0 0 0 0 0 0 0 0
0 0 0 0 0 0 0 0 0 0 0 0 0 0 0 0 0 0 0 0 ];
mc_10(2,:) = [ 0 0 0 0 0 0 0 0 0 0 1 0 0 0 0 0 0 0 0 0 0 0 0 0
0 0 0 0 0 0 0 0 0 0 0 0 0 0 0 0 0 0 0 0 ];
mc_10(3,:) = [ 0 0 0 0 0 0 0 0 0 0 0 1 0 0 0 0 0 0 0 0 0 0 0 0
0 0 0 0 0 0 0 0 0 0 0 0 0 0 0 0 0 0 0 0 ];
mc_10(4,:) = [ 0 0 0 0 0 0 0 0 0 0 0 0 1 0 0 0 0 0 0 0 0 0 0 0
0 0 0 0 0 0 0 0 0 0 0 0 0 0 0 0 0 0 0 0 ];
mc_10(5,:) = [ 0 0 0 0 0 0 0 0 0 0 0 0 0 1 0 0 0 0 0 0 0 0 0 0
0 0 0 0 0 0 0 0 0 0 0 0 0 0 0 0 0 0 0 0 ];
mc_10(6,:) = [ 0 0 0 0 0 0 0 0 0 0 0 0 0 0 1 0 0 0 0 0 0 0 0 0
0 0 0 0 0 0 0 0 0 0 0 0 0 0 0 0 0 0 0 0 ];
mc_10(7,:) = [ 0 0 0 0 0 0 0 0 0 0 0 0 0 0 0 1 0 0 0 0 0 0 0 0
0 0 0 0 0 0 0 0 0 0 0 0 0 0 0 0 0 0 0 0 ];
mc_10(8,:) = [ 0 0 0 0 0 0 0 0 0 0 0 0 0 0 0 0 1 0 0 0 0 0 0 0
0 0 0 0 0 0 0 0 0 0 0 0 0 0 0 0 0 0 0 0 ];

sel_mc10_pt0(1,:) = [ 0 1 0 0 0 0 0 0 0 0 0 0 0 0 ];
sel_mc10_pt0(2,:) = [ 0 0 1 0 0 0 0 0 0 0 0 0 0 0 ];
sel_mc10_pt0(3,:) = [ 0 0 0 1 0 0 0 0 0 0 0 0 0 0 ];
sel_mc10_pt0(4,:) = [ 0 0 0 0 1 0 0 0 0 0 0 0 0 0 ];

T_0_10 = sel_mc10_pt0 * ma_ds48;
D_0_10 = pull_0 * transform_filt8 * mc_10;
w_0_10 = inv( T_0_10 * Rx * T_0_10' ) * T_0_10 * Rx * D_0_10';
mcp_10(1,:) = [ zeros(1,1)';(eye(4) - mean_4x4)*w_0_10 +
mean_4';zeros(1,11)']';
err_var(11,1)=D_0_10*Rx*D_0_10'-D_0_10*Rx*T_0_10'*inv(T_0_10*Rx*T
_0_10')*T_0_10*Rx* D_0_10';

sel_mc10_pt1(1,:) = [ 0 0 1 0 0 0 0 0 0 0 0 0 0 0 ];
sel_mc10_pt1(2,:) = [ 0 0 0 1 0 0 0 0 0 0 0 0 0 0 ];
```

```
sel_mc10_pt1(3,:) = [ 0 0 0 0 1 0 0 0 0 0 0 0 0 0 0 ];
sel_mc10_pt1(4,:) = [ 0 0 0 0 0 1 0 0 0 0 0 0 0 0 0 ];

T_1_10 = sel_mc10_pt1 * ma_ds48;
D_1_10 = pull_1 * transform_filt8 * mc_10;
w_1_10 = inv( T_1_10 * Rx * T_1_10' ) * T_1_10 * Rx * D_1_10';
mcp_10(2,:) = [ zeros(1,2)';(eye(4) - mean_4x4)*w_1_10 +
mean_4';zeros(1,10)']';
err_var(11,2)=D_1_10*Rx*D_1_10'-D_1_10*Rx*T_1_10'*inv(T_1_10*Rx*T
_1_10')*T_1_10*Rx* D_1_10';

sel_mc10_pt2(1,:) = [ 0 0 1 0 0 0 0 0 0 0 0 0 0 0 0 ];
sel_mc10_pt2(2,:) = [ 0 0 0 1 0 0 0 0 0 0 0 0 0 0 0 ];
sel_mc10_pt2(3,:) = [ 0 0 0 0 1 0 0 0 0 0 0 0 0 0 0 ];
sel_mc10_pt2(4,:) = [ 0 0 0 0 0 1 0 0 0 0 0 0 0 0 0 ];

T_2_10 = sel_mc10_pt2 * ma_ds48;
D_2_10 = pull_2 * transform_filt8 * mc_10;
w_2_10 = inv( T_2_10 * Rx * T_2_10' ) * T_2_10 * Rx * D_2_10';
mcp_10(3,:) = [ zeros(1,2)';(eye(4) - mean_4x4)*w_2_10 +
mean_4';zeros(1,10)']';
err_var(11,3)=D_2_10*Rx*D_2_10'-D_2_10*Rx*T_2_10'*inv(T_2_10*Rx*T
_2_10')*T_2_10*Rx* D_2_10';

sel_mc10_pt3(1,:) = [ 0 0 1 0 0 0 0 0 0 0 0 0 0 0 0 ];
sel_mc10_pt3(2,:) = [ 0 0 0 1 0 0 0 0 0 0 0 0 0 0 0 ];
sel_mc10_pt3(3,:) = [ 0 0 0 0 1 0 0 0 0 0 0 0 0 0 0 ];
sel_mc10_pt3(4,:) = [ 0 0 0 0 0 1 0 0 0 0 0 0 0 0 0 ];

T_3_10 = sel_mc10_pt3 * ma_ds48;
D_3_10 = pull_3 * transform_filt8 * mc_10;
w_3_10 = inv( T_3_10 * Rx * T_3_10' ) * T_3_10 * Rx * D_3_10';
mcp_10(4,:) = [ zeros(1,2)';(eye(4) - mean_4x4)*w_3_10 +
mean_4';zeros(1,10)']';
err_var(11,4)=D_3_10*Rx*D_3_10'-D_3_10*Rx*T_3_10'*inv(T_3_10*Rx*T
_3_10')*T_3_10*Rx* D_3_10';

sel_mc10_pt4(1,:) = [ 0 0 0 1 0 0 0 0 0 0 0 0 0 0 0 ];
sel_mc10_pt4(2,:) = [ 0 0 0 0 1 0 0 0 0 0 0 0 0 0 0 ];
sel_mc10_pt4(3,:) = [ 0 0 0 0 0 1 0 0 0 0 0 0 0 0 0 ];
sel_mc10_pt4(4,:) = [ 0 0 0 0 0 0 1 0 0 0 0 0 0 0 0 ];

T_4_10 = sel_mc10_pt4 * ma_ds48;
D_4_10 = pull_4 * transform_filt8 * mc_10;
w_4_10 = inv( T_4_10 * Rx * T_4_10' ) * T_4_10 * Rx * D_4_10';
mcp_10(5,:) = [ zeros(1,3)';(eye(4) - mean_4x4)*w_4_10 +
mean_4';zeros(1,9)']';
err_var(11,5)=D_4_10*Rx*D_4_10'-D_4_10*Rx*T_4_10'*inv(T_4_10*Rx*T
_4_10')*T_4_10*Rx* D_4_10';
```

```
sel_mc10_pt5(1,:) = [ 0 0 0 1 0 0 0 0 0 0 0 0 0 0 0 0 ];
sel_mc10_pt5(2,:) = [ 0 0 0 0 1 0 0 0 0 0 0 0 0 0 0 0 ];
sel_mc10_pt5(3,:) = [ 0 0 0 0 0 1 0 0 0 0 0 0 0 0 0 0 ];
sel_mc10_pt5(4,:) = [ 0 0 0 0 0 0 1 0 0 0 0 0 0 0 0 0 ];

T_5_10 = sel_mc10_pt5 * ma_ds48;
D_5_10 = pull_5 * transform_filt8 * mc_10;
w_5_10 = inv( T_5_10 * Rx * T_5_10' ) * T_5_10 * Rx * D_5_10';
mcp_10(6,:) = [ zeros(1,3)';(eye(4) - mean_4x4)*w_5_10 +
mean_4';zeros(1,9)']';
err_var(11,6)=D_5_10*Rx*D_5_10'-D_5_10*Rx*T_5_10'*inv(T_5_10*Rx*T
_5_10')*T_5_10*Rx* D_5_10';

sel_mc10_pt6(1,:) = [ 0 0 0 1 0 0 0 0 0 0 0 0 0 0 0 0 ];
sel_mc10_pt6(2,:) = [ 0 0 0 0 1 0 0 0 0 0 0 0 0 0 0 0 ];
sel_mc10_pt6(3,:) = [ 0 0 0 0 0 1 0 0 0 0 0 0 0 0 0 0 ];
sel_mc10_pt6(4,:) = [ 0 0 0 0 0 0 1 0 0 0 0 0 0 0 0 0 ];

T_6_10 = sel_mc10_pt6 * ma_ds48;
D_6_10 = pull_6 * transform_filt8 * mc_10;
w_6_10 = inv( T_6_10 * Rx * T_6_10' ) * T_6_10 * Rx * D_6_10';
mcp_10(7,:) = [ zeros(1,3)';(eye(4) - mean_4x4)*w_6_10 +
mean_4';zeros(1,9)']';
err_var(11,7)=D_6_10*Rx*D_6_10'-D_6_10*Rx*T_6_10'*inv(T_6_10*Rx*T
_6_10')*T_6_10*Rx* D_6_10';

sel_mc10_pt7(1,:) = [ 0 0 0 0 1 0 0 0 0 0 0 0 0 0 0 0 ];
sel_mc10_pt7(2,:) = [ 0 0 0 0 0 1 0 0 0 0 0 0 0 0 0 0 ];
sel_mc10_pt7(3,:) = [ 0 0 0 0 0 0 1 0 0 0 0 0 0 0 0 0 ];
sel_mc10_pt7(4,:) = [ 0 0 0 0 0 0 0 1 0 0 0 0 0 0 0 0 ];

T_7_10 = sel_mc10_pt7 * ma_ds48;
D_7_10 = pull_7 * transform_filt8 * mc_10;
w_7_10 = inv( T_7_10 * Rx * T_7_10' ) * T_7_10 * Rx * D_7_10';
mcp_10(8,:) = [ zeros(1,4)';(eye(4) - mean_4x4)*w_7_10 +
mean_4';zeros(1,8)']';
err_var(11,8)=D_7_10*Rx*D_7_10'-D_7_10*Rx*T_7_10'*inv(T_7_10*Rx*T
_7_10')*T_7_10*Rx* D_7_10';

mamcp_10_chk_0 = ds_ma0*mcp_10;
save mamcp_10_chk_0 mamcp_10_chk_0 -ascii -double -tabs
mamcp_10_chk_1 = ds_ma1*mcp_10;
save mamcp_10_chk_1 mamcp_10_chk_1 -ascii -double -tabs
mamcp_10_chk_2 = ds_ma2*mcp_10;
save mamcp_10_chk_2 mamcp_10_chk_2 -ascii -double -tabs mc_11(1,:) = [ 0 0 0 0 0 0 0 0 0 0 1 0 0 0 0 0 0 0 0 0
0 0 0 0 0 0 0 0 0 0 0 0 0 0 0 0 ];
mc_11(2,:) = [ 0 0 0 0 0 0 0 0 0 0 0 1 0 0 0 0 0 0 0 0
0 0 0 0 0 0 0 0 0 0 0 0 0 0 0 0 ];
```

-54-

```
mc_11(3,:) = [ 0 0 0 0 0 0 0 0 0 0 0 0 1 0 0 0 0 0 0 0 0 0 0
0 0 0 0 0 0 0 0 0 0 0 0 0 0 0 0 0 0 0 0 0 0 0 0 0 ];
mc_11(4,:) = [ 0 0 0 0 0 0 0 0 0 0 0 0 0 1 0 0 0 0 0 0 0 0 0
0 0 0 0 0 0 0 0 0 0 0 0 0 0 0 0 0 0 0 0 0 0 0 0 0 ];
mc_11(5,:) = [ 0 0 0 0 0 0 0 0 0 0 0 0 0 0 1 0 0 0 0 0 0 0 0
0 0 0 0 0 0 0 0 0 0 0 0 0 0 0 0 0 0 0 0 0 0 0 0 0 ];
mc_11(6,:) = [ 0 0 0 0 0 0 0 0 0 0 0 0 0 0 0 1 0 0 0 0 0 0 0
0 0 0 0 0 0 0 0 0 0 0 0 0 0 0 0 0 0 0 0 0 0 0 0 0 ];
mc_11(7,:) = [ 0 0 0 0 0 0 0 0 0 0 0 0 0 0 0 0 1 0 0 0 0 0 0
0 0 0 0 0 0 0 0 0 0 0 0 0 0 0 0 0 0 0 0 0 0 0 0 0 ];
mc_11(8,:) = [ 0 0 0 0 0 0 0 0 0 0 0 0 0 0 0 0 0 1 0 0 0 0 0
0 0 0 0 0 0 0 0 0 0 0 0 0 0 0 0 0 0 0 0 0 0 0 0 0 ];

sel_mc11_pt0(1,:) = [ 0 0 1 0 0 0 0 0 0 0 0 0 0 0 0 ];
sel_mc11_pt0(2,:) = [ 0 0 0 1 0 0 0 0 0 0 0 0 0 0 0 ];
sel_mc11_pt0(3,:) = [ 0 0 0 0 1 0 0 0 0 0 0 0 0 0 0 ];
sel_mc11_pt0(4,:) = [ 0 0 0 0 0 1 0 0 0 0 0 0 0 0 0 ];

T_0_11 = sel_mc11_pt0 * ma_ds48;
D_0_11 = pull_0 * transform_filt8 * mc_11;
w_0_11 = inv( T_0_11 * Rx * T_0_11' ) * T_0_11 * Rx * D_0_11';
mcp_11(1,:) = [ zeros(1,2)';(eye(4) - mean_4x4)*w_0_11 +
mean_4';zeros(1,10)']';
err_var(12,1)=D_0_11*Rx*D_0_11'-D_0_11*Rx*T_0_11'*inv(T_0_11*Rx*T
_0_11')*T_0_11*Rx* D_0_11';

sel_mc11_pt1(1,:) = [ 0 0 1 0 0 0 0 0 0 0 0 0 0 0 0 ];
sel_mc11_pt1(2,:) = [ 0 0 0 1 0 0 0 0 0 0 0 0 0 0 0 ];
sel_mc11_pt1(3,:) = [ 0 0 0 0 1 0 0 0 0 0 0 0 0 0 0 ];
sel_mc11_pt1(4,:) = [ 0 0 0 0 0 1 0 0 0 0 0 0 0 0 0 ];

T_1_11 = sel_mc11_pt1 * ma_ds48;
D_1_11 = pull_1 * transform_filt8 * mc_11;
w_1_11 = inv( T_1_11 * Rx * T_1_11' ) * T_1_11 * Rx * D_1_11';
mcp_11(2,:) = [ zeros(1,2)';(eye(4) - mean_4x4)*w_1_11 +
mean_4';zeros(1,10)']';
err_var(12,2)=D_1_11*Rx*D_1_11'-D_1_11*Rx*T_1_11'*inv(T_1_11*Rx*T
_1_11')*T_1_11*Rx* D_1_11';

sel_mc11_pt2(1,:) = [ 0 0 1 0 0 0 0 0 0 0 0 0 0 0 0 ];
sel_mc11_pt2(2,:) = [ 0 0 0 1 0 0 0 0 0 0 0 0 0 0 0 ];
sel_mc11_pt2(3,:) = [ 0 0 0 0 1 0 0 0 0 0 0 0 0 0 0 ];
sel_mc11_pt2(4,:) = [ 0 0 0 0 0 1 0 0 0 0 0 0 0 0 0 ];

T_2_11 = sel_mc11_pt2 * ma_ds48;
D_2_11 = pull_2 * transform_filt8 * mc_11;
w_2_11 = inv( T_2_11 * Rx * T_2_11' ) * T_2_11 * Rx * D_2_11';
mcp_11(3,:) = [ zeros(1,2)';(eye(4) - mean_4x4)*w_2_11 +
mean_4';zeros(1,10)']';
```

-55-

```
err_var(12,3)=D_2_11*Rx*D_2_11'-D_2_11*Rx*T_2_11'*inv(T_2_11*Rx*T
_2_11')*T_2_11*Rx* D_2_11';

sel_mc11_pt3(1,:) = [ 0 0 0 1 0 0 0 0 0 0 0 0 0 0 0 ];
sel_mc11_pt3(2,:) = [ 0 0 0 0 1 0 0 0 0 0 0 0 0 0 0 ];
sel_mc11_pt3(3,:) = [ 0 0 0 0 0 1 0 0 0 0 0 0 0 0 0 ];
sel_mc11_pt3(4,:) = [ 0 0 0 0 0 0 1 0 0 0 0 0 0 0 0 ];

T_3_11 = sel_mc11_pt3 * ma_ds48;
D_3_11 = pull_3 * transform_filt8 * mc_11;
w_3_11 = inv( T_3_11 * Rx * T_3_11' ) * T_3_11 * Rx * D_3_11';
mcp_11(4,:) = [ zeros(1,3)';(eye(4) - mean_4x4)*w_3_11 +
mean_4';zeros(1,9)']';
err_var(12,4)=D_3_11*Rx*D_3_11'-D_3_11*Rx*T_3_11'*inv(T_3_11*Rx*T
_3_11')*T_3_11*Rx* D_3_11';

sel_mc11_pt4(1,:) = [ 0 0 0 1 0 0 0 0 0 0 0 0 0 0 0 ];
sel_mc11_pt4(2,:) = [ 0 0 0 0 1 0 0 0 0 0 0 0 0 0 0 ];
sel_mc11_pt4(3,:) = [ 0 0 0 0 0 1 0 0 0 0 0 0 0 0 0 ];
sel_mc11_pt4(4,:) = [ 0 0 0 0 0 0 1 0 0 0 0 0 0 0 0 ];

T_4_11 = sel_mc11_pt4 * ma_ds48;
D_4_11 = pull_4 * transform_filt8 * mc_11;
w_4_11 = inv( T_4_11 * Rx * T_4_11' ) * T_4_11 * Rx * D_4_11';
mcp_11(5,:) = [ zeros(1,3)';(eye(4) - mean_4x4)*w_4_11 +
mean_4';zeros(1,9)']';
err_var(12,5)=D_4_11*Rx*D_4_11'-D_4_11*Rx*T_4_11'*inv(T_4_11*Rx*T
_4_11')*T_4_11*Rx* D_4_11';

sel_mc11_pt5(1,:) = [ 0 0 0 1 0 0 0 0 0 0 0 0 0 0 0 ];
sel_mc11_pt5(2,:) = [ 0 0 0 0 1 0 0 0 0 0 0 0 0 0 0 ];
sel_mc11_pt5(3,:) = [ 0 0 0 0 0 1 0 0 0 0 0 0 0 0 0 ];
sel_mc11_pt5(4,:) = [ 0 0 0 0 0 0 1 0 0 0 0 0 0 0 0 ];

T_5_11 = sel_mc11_pt5 * ma_ds48;
D_5_11 = pull_5 * transform_filt8 * mc_11;
w_5_11 = inv( T_5_11 * Rx * T_5_11' ) * T_5_11 * Rx * D_5_11';
mcp_11(6,:) = [ zeros(1,3)';(eye(4) - mean_4x4)*w_5_11 +
mean_4';zeros(1,9)']';
err_var(12,6)=D_5_11*Rx*D_5_11'-D_5_11*Rx*T_5_11'*inv(T_5_11*Rx*T
_5_11')*T_5_11*Rx* D_5_11';

sel_mc11_pt6(1,:) = [ 0 0 0 0 1 0 0 0 0 0 0 0 0 0 0 ];
sel_mc11_pt6(2,:) = [ 0 0 0 0 0 1 0 0 0 0 0 0 0 0 0 ];
sel_mc11_pt6(3,:) = [ 0 0 0 0 0 0 1 0 0 0 0 0 0 0 0 ];
sel_mc11_pt6(4,:) = [ 0 0 0 0 0 0 1 0 0 0 0 0 0 0 0 ];

T_6_11 = sel_mc11_pt6 * ma_ds48;
D_6_11 = pull_6 * transform_filt8 * mc_11;
w_6_11 = inv( T_6_11 * Rx * T_6_11' ) * T_6_11 * Rx * D_6_11';
```

```
mcp_11(7,:) = [ zeros(1,4)';(eye(4) - mean_4x4)*w_6_11 +
mean_4';zeros(1,8)']';
err_var(12,7)=D_6_11*Rx*D_6_11'-D_6_11*Rx*T_6_11'*inv(T_6_11*Rx*T
_6_11')*T_6_11*Rx* D_6_11';

sel_mc11_pt7(1,:) = [ 0 0 0 0 1 0 0 0 0 0 0 0 0 0 ];
sel_mc11_pt7(2,:) = [ 0 0 0 0 0 1 0 0 0 0 0 0 0 0 ];
sel_mc11_pt7(3,:) = [ 0 0 0 0 0 0 1 0 0 0 0 0 0 0 ];
sel_mc11_pt7(4,:) = [ 0 0 0 0 0 0 0 1 0 0 0 0 0 0 ];

T_7_11 = sel_mc11_pt7 * ma_ds48;
D_7_11 = pull_7 * transform_filt8 * mc_11;
w_7_11 = inv( T_7_11 * Rx * T_7_11' ) * T_7_11 * Rx * D_7_11';
mcp_11(8,:) = [ zeros(1,4)';(eye(4) - mean_4x4)*w_7_11 +
mean_4';zeros(1,8)']';
err_var(12,8)=D_7_11*Rx*D_7_11'-D_7_11*Rx*T_7_11'*inv(T_7_11*Rx*T
_7_11')*T_7_11*Rx* D_7_11';

mamcp_11_chk_0 = ds_ma0*mcp_11;
save mamcp_11_chk_0 mamcp_11_chk_0 -ascii -double -tabs
mamcp_11_chk_1 = ds_ma1*mcp_11;
save mamcp_11_chk_1 mamcp_11_chk_1 -ascii -double -tabs
mamcp_11_chk_2 = ds_ma2*mcp_11;
save mamcp_11_chk_2 mamcp_11_chk_2 -ascii -double -tabs mc_12(1,:) = [ 0 0 0 0 0 0 0 0 0 0 0 0 1 0 0 0 0 0 0 0 0 0 0 0
                0 0 0 0 0 0 0 0 0 0 0 0 0 0 0 0 0 0 0 0 0 0 0 0 ];
mc_12(2,:) = [ 0 0 0 0 0 0 0 0 0 0 0 0 0 1 0 0 0 0 0 0 0 0 0 0
                0 0 0 0 0 0 0 0 0 0 0 0 0 0 0 0 0 0 0 0 0 0 0 0 ];
mc_12(3,:) = [ 0 0 0 0 0 0 0 0 0 0 0 0 0 0 1 0 0 0 0 0 0 0 0 0
                0 0 0 0 0 0 0 0 0 0 0 0 0 0 0 0 0 0 0 0 0 0 0 0 ];
mc_12(4,:) = [ 0 0 0 0 0 0 0 0 0 0 0 0 0 0 0 1 0 0 0 0 0 0 0 0
                0 0 0 0 0 0 0 0 0 0 0 0 0 0 0 0 0 0 0 0 0 0 0 0 ];
mc_12(5,:) = [ 0 0 0 0 0 0 0 0 0 0 0 0 0 0 0 0 1 0 0 0 0 0 0 0
                0 0 0 0 0 0 0 0 0 0 0 0 0 0 0 0 0 0 0 0 0 0 0 0 ];
mc_12(6,:) = [ 0 0 0 0 0 0 0 0 0 0 0 0 0 0 0 0 0 1 0 0 0 0 0 0
                0 0 0 0 0 0 0 0 0 0 0 0 0 0 0 0 0 0 0 0 0 0 0 0 ];
mc_12(7,:) = [ 0 0 0 0 0 0 0 0 0 0 0 0 0 0 0 0 0 0 1 0 0 0 0 0
                0 0 0 0 0 0 0 0 0 0 0 0 0 0 0 0 0 0 0 0 0 0 0 0 ];
mc_12(8,:) = [ 0 0 0 0 0 0 0 0 0 0 0 0 0 0 0 0 0 0 0 1 0 0 0 0
                0 0 0 0 0 0 0 0 0 0 0 0 0 0 0 0 0 0 0 0 0 0 0 0 ];

sel_mc12_pt0(1,:) = [ 0 0 1 0 0 0 0 0 0 0 0 0 0 0 ];
sel_mc12_pt0(2,:) = [ 0 0 0 1 0 0 0 0 0 0 0 0 0 0 ];
sel_mc12_pt0(3,:) = [ 0 0 0 0 1 0 0 0 0 0 0 0 0 0 ];
sel_mc12_pt0(4,:) = [ 0 0 0 0 0 1 0 0 0 0 0 0 0 0 ];

T_0_12 = sel_mc12_pt0 * ma_ds48;
D_0_12 = pull_0 * transform_filt8 * mc_12;
w_0_12 = inv( T_0_12 * Rx * T_0_12' ) * T_0_12 * Rx * D_0_12';
```

-57-

```
mcp_12(1,:) = [ zeros(1,2)';(eye(4) - mean_4x4)*w_0_12 +
mean_4';zeros(1,10)']';
err_var(13,1)=D_0_12*Rx*D_0_12'-D_0_12*Rx*T_0_12'*inv(T_0_12*Rx*T
_0_12')*T_0_12*Rx* D_0_12';

sel_mc12_pt1(1,:) = [ 0 0 1 0 0 0 0 0 0 0 0 0 0 0 0 0 ];
sel_mc12_pt1(2,:) = [ 0 0 0 1 0 0 0 0 0 0 0 0 0 0 0 0 ];
sel_mc12_pt1(3,:) = [ 0 0 0 0 1 0 0 0 0 0 0 0 0 0 0 0 ];
sel_mc12_pt1(4,:) = [ 0 0 0 0 0 1 0 0 0 0 0 0 0 0 0 0 ];

T_1_12 = sel_mc12_pt1 * ma_ds48;
D_1_12 = pull_1 * transform_filt8 * mc_12;
w_1_12 = inv( T_1_12 * Rx * T_1_12' ) * T_1_12 * Rx * D_1_12';
mcp_12(2,:) = [ zeros(1,2)';(eye(4) - mean_4x4)*w_1_12 +
mean_4';zeros(1,10)']';
err_var(13,2)=D_1_12*Rx*D_1_12'-D_1_12*Rx*T_1_12'*inv(T_1_12*Rx*T
_1_12')*T_1_12*Rx* D_1_12';

sel_mc12_pt2(1,:) = [ 0 0 0 1 0 0 0 0 0 0 0 0 0 0 0 0 ];
sel_mc12_pt2(2,:) = [ 0 0 0 0 1 0 0 0 0 0 0 0 0 0 0 0 ];
sel_mc12_pt2(3,:) = [ 0 0 0 0 0 1 0 0 0 0 0 0 0 0 0 0 ];
sel_mc12_pt2(4,:) = [ 0 0 0 0 0 0 1 0 0 0 0 0 0 0 0 0 ];

T_2_12 = sel_mc12_pt2 * ma_ds48;
D_2_12 = pull_2 * transform_filt8 * mc_12;
w_2_12 = inv( T_2_12 * Rx * T_2_12' ) * T_2_12 * Rx * D_2_12';
mcp_12(3,:) = [ zeros(1,3)';(eye(4) - mean_4x4)*w_2_12 +
mean_4';zeros(1,9)']';
err_var(13,3)=D_2_12*Rx*D_2_12'-D_2_12*Rx*T_2_12'*inv(T_2_12*Rx*T
_2_12')*T_2_12*Rx* D_2_12';

sel_mc12_pt3(1,:) = [ 0 0 0 1 0 0 0 0 0 0 0 0 0 0 0 0 ];
sel_mc12_pt3(2,:) = [ 0 0 0 0 1 0 0 0 0 0 0 0 0 0 0 0 ];
sel_mc12_pt3(3,:) = [ 0 0 0 0 0 1 0 0 0 0 0 0 0 0 0 0 ];
sel_mc12_pt3(4,:) = [ 0 0 0 0 0 0 1 0 0 0 0 0 0 0 0 0 ];

T_3_12 = sel_mc12_pt3 * ma_ds48;
D_3_12 = pull_3 * transform_filt8 * mc_12;
w_3_12 = inv( T_3_12 * Rx * T_3_12' ) * T_3_12 * Rx * D_3_12';
mcp_12(4,:) = [ zeros(1,3)';(eye(4) - mean_4x4)*w_3_12 +
mean_4';zeros(1,9)']';
err_var(13,4)=D_3_12*Rx*D_3_12'-D_3_12*Rx*T_3_12'*inv(T_3_12*Rx*T
_3_12')*T_3_12*Rx* D_3_12';

sel_mc12_pt4(1,:) = [ 0 0 0 1 0 0 0 0 0 0 0 0 0 0 0 0 ];
sel_mc12_pt4(2,:) = [ 0 0 0 0 1 0 0 0 0 0 0 0 0 0 0 0 ];
sel_mc12_pt4(3,:) = [ 0 0 0 0 0 1 0 0 0 0 0 0 0 0 0 0 ];
sel_mc12_pt4(4,:) = [ 0 0 0 0 0 0 1 0 0 0 0 0 0 0 0 0 ];
```

```
T_4_12 = sel_mc12_pt4 * ma_ds48;
D_4_12 = pull_4 * transform_filt8 * mc_12;
w_4_12 = inv( T_4_12 * Rx * T_4_12' ) * T_4_12 * Rx * D_4_12';
mcp_12(5,:) = [ zeros(1,3)';(eye(4) - mean_4x4)*w_4_12 +
mean_4';zeros(1,9)']';
err_var(13,5)=D_4_12*Rx*D_4_12'-D_4_12*Rx*T_4_12'*inv(T_4_12*Rx*T
_4_12')*T_4_12*Rx* D_4_12';

sel_mc12_pt5(1,:) = [ 0 0 0 0 1 0 0 0 0 0 0 0 0 0 ];
sel_mc12_pt5(2,:) = [ 0 0 0 0 0 1 0 0 0 0 0 0 0 0 ];
sel_mc12_pt5(3,:) = [ 0 0 0 0 0 0 1 0 0 0 0 0 0 0 ];
sel_mc12_pt5(4,:) = [ 0 0 0 0 0 0 0 1 0 0 0 0 0 0 ];

T_5_12 = sel_mc12_pt5 * ma_ds48;
D_5_12 = pull_5 * transform_filt8 * mc_12;
w_5_12 = inv( T_5_12 * Rx * T_5_12' ) * T_5_12 * Rx * D_5_12';
mcp_12(6,:) = [ zeros(1,4)';(eye(4) - mean_4x4)*w_5_12 +
mean_4';zeros(1,8)']';
err_var(13,6)=D_5_12*Rx*D_5_12'-D_5_12*Rx*T_5_12'*inv(T_5_12*Rx*T
_5_12')*T_5_12*Rx* D_5_12';

sel_mc12_pt6(1,:) = [ 0 0 0 0 1 0 0 0 0 0 0 0 0 0 ];
sel_mc12_pt6(2,:) = [ 0 0 0 0 0 1 0 0 0 0 0 0 0 0 ];
sel_mc12_pt6(3,:) = [ 0 0 0 0 0 0 1 0 0 0 0 0 0 0 ];
sel_mc12_pt6(4,:) = [ 0 0 0 0 0 0 0 1 0 0 0 0 0 0 ];

T_6_12 = sel_mc12_pt6 * ma_ds48;
D_6_12 = pull_6 * transform_filt8 * mc_12;
w_6_12 = inv( T_6_12 * Rx * T_6_12' ) * T_6_12 * Rx * D_6_12';
mcp_12(7,:) = [ zeros(1,4)';(eye(4) - mean_4x4)*w_6_12 +
mean_4';zeros(1,8)']';
err_var(13,7)=D_6_12*Rx*D_6_12'-D_6_12*Rx*T_6_12'*inv(T_6_12*Rx*T
_6_12')*T_6_12*Rx* D_6_12';

sel_mc12_pt7(1,:) = [ 0 0 0 0 1 0 0 0 0 0 0 0 0 0 ];
sel_mc12_pt7(2,:) = [ 0 0 0 0 0 1 0 0 0 0 0 0 0 0 ];
sel_mc12_pt7(3,:) = [ 0 0 0 0 0 0 1 0 0 0 0 0 0 0 ];
sel_mc12_pt7(4,:) = [ 0 0 0 0 0 0 0 1 0 0 0 0 0 0 ];

T_7_12 = sel_mc12_pt7 * ma_ds48;
D_7_12 = pull_7 * transform_filt8 * mc_12;
w_7_12 = inv( T_7_12 * Rx * T_7_12' ) * T_7_12 * Rx * D_7_12';
mcp_12(8,:) = [ zeros(1,4)';(eye(4) - mean_4x4)*w_7_12 +
mean_4';zeros(1,8)']';
err_var(13,8)=D_7_12*Rx*D_7_12'-D_7_12*Rx*T_7_12'*inv(T_7_12*Rx*T
_7_12')*T_7_12*Rx* D_7_12';

mamcp_12_chk_0 = ds_ma0*mcp_12;
save mamcp_12_chk_0 mamcp_12_chk_0 -ascii -double -tabs
mamcp_12_chk_1 = ds_ma1*mcp_12;
```

-59-

```
       save mamcp_12_chk_1 mamcp_12_chk_1 -ascii -double -tabs
       mamcp_12_chk_2 = ds_ma2*mcp_12;
       save mamcp_12_chk_2 mamcp_12_chk_2 -ascii -double -tabs 5     mc_13(1,:) = [ 0 0 0 0 0 0 0 0 0 0 0 0 1 0 0 0 0 0 0 0 0 0 0
       0 0 0 0 0 0 0 0 0 0 0 0 0 0 0 0 0 0 0 0 0 0 ];
       mc_13(2,:) = [ 0 0 0 0 0 0 0 0 0 0 0 0 0 1 0 0 0 0 0 0 0 0 0
       0 0 0 0 0 0 0 0 0 0 0 0 0 0 0 0 0 0 0 0 0 0 ];
       mc_13(3,:) = [ 0 0 0 0 0 0 0 0 0 0 0 0 0 0 1 0 0 0 0 0 0 0 0
10     0 0 0 0 0 0 0 0 0 0 0 0 0 0 0 0 0 0 0 0 0 0 ];
       mc_13(4,:) = [ 0 0 0 0 0 0 0 0 0 0 0 0 0 0 0 1 0 0 0 0 0 0 0
       0 0 0 0 0 0 0 0 0 0 0 0 0 0 0 0 0 0 0 0 0 0 ];
       mc_13(5,:) = [ 0 0 0 0 0 0 0 0 0 0 0 0 0 0 0 0 1 0 0 0 0 0 0
       0 0 0 0 0 0 0 0 0 0 0 0 0 0 0 0 0 0 0 0 0 0 ];
15     mc_13(6,:) = [ 0 0 0 0 0 0 0 0 0 0 0 0 0 0 0 0 0 1 0 0 0 0 0
       0 0 0 0 0 0 0 0 0 0 0 0 0 0 0 0 0 0 0 0 0 0 ];
       mc_13(7,:) = [ 0 0 0 0 0 0 0 0 0 0 0 0 0 0 0 0 0 0 1 0 0 0 0
       0 0 0 0 0 0 0 0 0 0 0 0 0 0 0 0 0 0 0 0 0 0 ];
       mc_13(8,:) = [ 0 0 0 0 0 0 0 0 0 0 0 0 0 0 0 0 0 0 0 1 0 0 0
20     0 0 0 0 0 0 0 0 0 0 0 0 0 0 0 0 0 0 0 0 0 0 ];

sel_mc13_pt0(1,:) = [ 0 0 1 0 0 0 0 0 0 0 0 0 0 0 0 0 ];
       sel_mc13_pt0(2,:) = [ 0 0 0 1 0 0 0 0 0 0 0 0 0 0 0 0 ];
       sel_mc13_pt0(3,:) = [ 0 0 0 0 1 0 0 0 0 0 0 0 0 0 0 0 ];
25     sel_mc13_pt0(4,:) = [ 0 0 0 0 0 1 0 0 0 0 0 0 0 0 0 0 ];

T_0_13 = sel_mc13_pt0 * ma_ds48;
       D_0_13 = pull_0 * transform_filt8 * mc_13;
       w_0_13 = inv( T_0_13 * Rx * T_0_13' ) * T_0_13 * Rx * D_0_13';
30     mcp_13(1,:) = [ zeros(1,2)';(eye(4) - mean_4x4)*w_0_13 +
       mean_4';zeros(1,10)']';
       err_var(14,1)=D_0_13*Rx*D_0_13'-D_0_13*Rx*T_0_13'*inv(T_0_13*Rx*T
       _0_13')*T_0_13*Rx* D_0_13';

35     sel_mc13_pt1(1,:) = [ 0 0 0 1 0 0 0 0 0 0 0 0 0 0 0 0 ];
       sel_mc13_pt1(2,:) = [ 0 0 0 0 1 0 0 0 0 0 0 0 0 0 0 0 ];
       sel_mc13_pt1(3,:) = [ 0 0 0 0 0 1 0 0 0 0 0 0 0 0 0 0 ];
       sel_mc13_pt1(4,:) = [ 0 0 0 0 0 0 1 0 0 0 0 0 0 0 0 0 ];

40     T_1_13 = sel_mc13_pt1 * ma_ds48;
       D_1_13 = pull_1 * transform_filt8 * mc_13;
       w_1_13 = inv( T_1_13 * Rx * T_1_13' ) * T_1_13 * Rx * D_1_13';
       mcp_13(2,:) = [ zeros(1,3)';(eye(4) - mean_4x4)*w_1_13 +
       mean_4';zeros(1,9)']';
45     err_var(14,2)=D_1_13*Rx*D_1_13'-D_1_13*Rx*T_1_13'*inv(T_1_13*Rx*T
       _1_13')*T_1_13*Rx* D_1_13';

sel_mc13_pt2(1,:) = [ 0 0 0 1 0 0 0 0 0 0 0 0 0 0 0 0 ];
       sel_mc13_pt2(2,:) = [ 0 0 0 0 1 0 0 0 0 0 0 0 0 0 0 0 ];
```

```
sel_mc13_pt2(3,:) = [ 0 0 0 0 0 1 0 0 0 0 0 0 0 0 ];
sel_mc13_pt2(4,:) = [ 0 0 0 0 0 0 1 0 0 0 0 0 0 0 ];

T_2_13 = sel_mc13_pt2 * ma_ds48;
D_2_13 = pull_2 * transform_filt8 * mc_13;
w_2_13 = inv( T_2_13 * Rx * T_2_13' ) * T_2_13 * Rx * D_2_13';
mcp_13(3,:) = [ zeros(1,3)';(eye(4) - mean_4x4)*w_2_13 +
mean_4';zeros(1,9)']';
err_var(14,3)=D_2_13*Rx*D_2_13'-D_2_13*Rx*T_2_13'*inv(T_2_13*Rx*T
_2_13')*T_2_13*Rx* D_2_13';

sel_mc13_pt3(1,:) = [ 0 0 0 1 0 0 0 0 0 0 0 0 0 0 ];
sel_mc13_pt3(2,:) = [ 0 0 0 0 1 0 0 0 0 0 0 0 0 0 ];
sel_mc13_pt3(3,:) = [ 0 0 0 0 0 1 0 0 0 0 0 0 0 0 ];
sel_mc13_pt3(4,:) = [ 0 0 0 0 0 0 1 0 0 0 0 0 0 0 ];

T_3_13 = sel_mc13_pt3 * ma_ds48;
D_3_13 = pull_3 * transform_filt8 * mc_13;
w_3_13 = inv( T_3_13 * Rx * T_3_13' ) * T_3_13 * Rx * D_3_13';
mcp_13(4,:) = [ zeros(1,3)';(eye(4) - mean_4x4)*w_3_13 +
mean_4';zeros(1,9)']';
err_var(14,4)=D_3_13*Rx*D_3_13'-D_3_13*Rx*T_3_13'*inv(T_3_13*Rx*T
_3_13')*T_3_13*Rx* D_3_13';

sel_mc13_pt4(1,:) = [ 0 0 0 0 1 0 0 0 0 0 0 0 0 0 ];
sel_mc13_pt4(2,:) = [ 0 0 0 0 0 1 0 0 0 0 0 0 0 0 ];
sel_mc13_pt4(3,:) = [ 0 0 0 0 0 0 1 0 0 0 0 0 0 0 ];
sel_mc13_pt4(4,:) = [ 0 0 0 0 0 0 0 1 0 0 0 0 0 0 ];

T_4_13 = sel_mc13_pt4 * ma_ds48;
D_4_13 = pull_4 * transform_filt8 * mc_13;
w_4_13 = inv( T_4_13 * Rx * T_4_13' ) * T_4_13 * Rx * D_4_13';
mcp_13(5,:) = [ zeros(1,4)';(eye(4) - mean_4x4)*w_4_13 +
mean_4';zeros(1,8)']';
err_var(14,5)=D_4_13*Rx*D_4_13'-D_4_13*Rx*T_4_13'*inv(T_4_13*Rx*T
_4_13')*T_4_13*Rx* D_4_13';

sel_mc13_pt5(1,:) = [ 0 0 0 0 1 0 0 0 0 0 0 0 0 0 ];
sel_mc13_pt5(2,:) = [ 0 0 0 0 0 1 0 0 0 0 0 0 0 0 ];
sel_mc13_pt5(3,:) = [ 0 0 0 0 0 0 1 0 0 0 0 0 0 0 ];
sel_mc13_pt5(4,:) = [ 0 0 0 0 0 0 0 1 0 0 0 0 0 0 ];

T_5_13 = sel_mc13_pt5 * ma_ds48;
D_5_13 = pull_5 * transform_filt8 * mc_13;
w_5_13 = inv( T_5_13 * Rx * T_5_13' ) * T_5_13 * Rx * D_5_13';
mcp_13(6,:) = [ zeros(1,4)';(eye(4) - mean_4x4)*w_5_13 +
mean_4';zeros(1,8)']';
err_var(14,6)=D_5_13*Rx*D_5_13'-D_5_13*Rx*T_5_13'*inv(T_5_13*Rx*T
_5_13')*T_5_13*Rx* D_5_13';
```

```
        sel_mc13_pt6(1,:) = [ 0 0 0 0 1 0 0 0 0 0 0 0 0 0 0 ];
        sel_mc13_pt6(2,:) = [ 0 0 0 0 0 1 0 0 0 0 0 0 0 0 0 ];
        sel_mc13_pt6(3,:) = [ 0 0 0 0 0 0 1 0 0 0 0 0 0 0 0 ];
        sel_mc13_pt6(4,:) = [ 0 0 0 0 0 0 0 1 0 0 0 0 0 0 0 ];
5
        T_6_13 = sel_mc13_pt6 * ma_ds48;
        D_6_13 = pull_6 * transform_filt8 * mc_13;
        w_6_13 = inv( T_6_13 * Rx * T_6_13' ) * T_6_13 * Rx * D_6_13';
        mcp_13(7,:) = [ zeros(1,4)';(eye(4) - mean_4x4)*w_6_13 +
10      mean_4';zeros(1,8)']';
        err_var(14,7)=D_6_13*Rx*D_6_13'-D_6_13*Rx*T_6_13'*inv(T_6_13*Rx*T
        _6_13')*T_6_13*Rx* D_6_13';

sel_mc13_pt7(1,:) = [ 0 0 0 0 0 1 0 0 0 0 0 0 0 0 0 ];
15      sel_mc13_pt7(2,:) = [ 0 0 0 0 0 0 1 0 0 0 0 0 0 0 0 ];
        sel_mc13_pt7(3,:) = [ 0 0 0 0 0 0 0 1 0 0 0 0 0 0 0 ];
        sel_mc13_pt7(4,:) = [ 0 0 0 0 0 0 0 0 1 0 0 0 0 0 0 ];

T_7_13 = sel_mc13_pt7 * ma_ds48;
20      D_7_13 = pull_7 * transform_filt8 * mc_13;
        w_7_13 = inv( T_7_13 * Rx * T_7_13' ) * T_7_13 * Rx * D_7_13';
        mcp_13(8,:) = [ zeros(1,5)';(eye(4) - mean_4x4)*w_7_13 +
        mean_4';zeros(1,7)']';
        err_var(14,8)=D_7_13*Rx*D_7_13'-D_7_13*Rx*T_7_13'*inv(T_7_13*Rx*T
25      _7_13')*T_7_13*Rx* D_7_13';

mamcp_13_chk_0 = ds_ma0*mcp_13;
        save mamcp_13_chk_0 mamcp_13_chk_0 -ascii -double -tabs
        mamcp_13_chk_1 = ds_ma1*mcp_13;
30      save mamcp_13_chk_1 mamcp_13_chk_1 -ascii -double -tabs
        mamcp_13_chk_2 = ds_ma2*mcp_13;
        save mamcp_13_chk_2 mamcp_13_chk_2 -ascii -double -tabs mc_14(1,:) = [ 0 0 0 0 0 0 0 0 0 0 0 0 0 0 1 0 0 0 0 0 0 0 0
35      0 0 0 0 0 0 0 0 0 0 0 0 0 0 0 0 0 0 0 ];
        mc_14(2,:) = [ 0 0 0 0 0 0 0 0 0 0 0 0 0 0 0 1 0 0 0 0 0 0 0
        0 0 0 0 0 0 0 0 0 0 0 0 0 0 0 0 0 0 0 ];
        mc_14(3,:) = [ 0 0 0 0 0 0 0 0 0 0 0 0 0 0 0 0 1 0 0 0 0 0 0
        0 0 0 0 0 0 0 0 0 0 0 0 0 0 0 0 0 0 0 ];
40      mc_14(4,:) = [ 0 0 0 0 0 0 0 0 0 0 0 0 0 0 0 0 0 1 0 0 0 0 0
        0 0 0 0 0 0 0 0 0 0 0 0 0 0 0 0 0 0 0 ];
        mc_14(5,:) = [ 0 0 0 0 0 0 0 0 0 0 0 0 0 0 0 0 0 0 1 0 0 0 0
        0 0 0 0 0 0 0 0 0 0 0 0 0 0 0 0 0 0 0 ];
        mc_14(6,:) = [ 0 0 0 0 0 0 0 0 0 0 0 0 0 0 0 0 0 0 0 1 0 0 0
45      0 0 0 0 0 0 0 0 0 0 0 0 0 0 0 0 0 0 0 ];
        mc_14(7,:) = [ 0 0 0 0 0 0 0 0 0 0 0 0 0 0 0 0 0 0 0 0 1 0 0
        0 0 0 0 0 0 0 0 0 0 0 0 0 0 0 0 0 0 0 ];
        mc_14(8,:) = [ 0 0 0 0 0 0 0 0 0 0 0 0 0 0 0 0 0 0 0 0 0 1 0
        0 0 0 0 0 0 0 0 0 0 0 0 0 0 0 0 0 0 0 ];
```

```
sel_mc14_pt0(1,:) = [ 0 0 0 1 0 0 0 0 0 0 0 0 0 0 0 ];
sel_mc14_pt0(2,:) = [ 0 0 0 0 1 0 0 0 0 0 0 0 0 0 0 ];
sel_mc14_pt0(3,:) = [ 0 0 0 0 0 1 0 0 0 0 0 0 0 0 0 ];
sel_mc14_pt0(4,:) = [ 0 0 0 0 0 0 1 0 0 0 0 0 0 0 0 ];

T_0_14 = sel_mc14_pt0 * ma_ds48;
D_0_14 = pull_0 * transform_filt8 * mc_14;
w_0_14 = inv( T_0_14 * Rx * T_0_14' ) * T_0_14 * Rx * D_0_14';
mcp_14(1,:) = [ zeros(1,3)';(eye(4) - mean_4x4)*w_0_14 +
mean_4';zeros(1,9)']';
err_var(15,1)=D_0_14*Rx*D_0_14'-D_0_14*Rx*T_0_14'*inv(T_0_14*Rx*T
_0_14')*T_0_14*Rx* D_0_14';

sel_mc14_pt1(1,:) = [ 0 0 0 1 0 0 0 0 0 0 0 0 0 0 0 ];
sel_mc14_pt1(2,:) = [ 0 0 0 0 1 0 0 0 0 0 0 0 0 0 0 ];
sel_mc14_pt1(3,:) = [ 0 0 0 0 0 1 0 0 0 0 0 0 0 0 0 ];
sel_mc14_pt1(4,:) = [ 0 0 0 0 0 0 1 0 0 0 0 0 0 0 0 ];

T_1_14 = sel_mc14_pt1 * ma_ds48;
D_1_14 = pull_1 * transform_filt8 * mc_14;
w_1_14 = inv( T_1_14 * Rx * T_1_14' ) * T_1_14 * Rx * D_1_14';
mcp_14(2,:) = [ zeros(1,3)';(eye(4) - mean_4x4)*w_1_14 +
mean_4';zeros(1,9)']';
err_var(15,2)=D_1_14*Rx*D_1_14'-D_1_14*Rx*T_1_14'*inv(T_1_14*Rx*T
_1_14')*T_1_14*Rx* D_1_14';

sel_mc14_pt2(1,:) = [ 0 0 0 1 0 0 0 0 0 0 0 0 0 0 0 ];
sel_mc14_pt2(2,:) = [ 0 0 0 0 1 0 0 0 0 0 0 0 0 0 0 ];
sel_mc14_pt2(3,:) = [ 0 0 0 0 0 1 0 0 0 0 0 0 0 0 0 ];
sel_mc14_pt2(4,:) = [ 0 0 0 0 0 0 1 0 0 0 0 0 0 0 0 ];

T_2_14 = sel_mc14_pt2 * ma_ds48;
D_2_14 = pull_2 * transform_filt8 * mc_14;
w_2_14 = inv( T_2_14 * Rx * T_2_14' ) * T_2_14 * Rx * D_2_14';
mcp_14(3,:) = [ zeros(1,3)';(eye(4) - mean_4x4)*w_2_14 +
mean_4';zeros(1,9)']';
err_var(15,3)=D_2_14*Rx*D_2_14'-D_2_14*Rx*T_2_14'*inv(T_2_14*Rx*T
_2_14')*T_2_14*Rx* D_2_14';

sel_mc14_pt3(1,:) = [ 0 0 0 0 1 0 0 0 0 0 0 0 0 0 0 ];
sel_mc14_pt3(2,:) = [ 0 0 0 0 0 1 0 0 0 0 0 0 0 0 0 ];
sel_mc14_pt3(3,:) = [ 0 0 0 0 0 0 1 0 0 0 0 0 0 0 0 ];
sel_mc14_pt3(4,:) = [ 0 0 0 0 0 0 0 1 0 0 0 0 0 0 0 ];

T_3_14 = sel_mc14_pt3 * ma_ds48;
D_3_14 = pull_3 * transform_filt8 * mc_14;
w_3_14 = inv( T_3_14 * Rx * T_3_14' ) * T_3_14 * Rx * D_3_14';
mcp_14(4,:) = [ zeros(1,4)';(eye(4) - mean_4x4)*w_3_14 +
mean_4';zeros(1,8)']';
```

```
err_var(15,4)=D_3_14*Rx*D_3_14'-D_3_14*Rx*T_3_14'*inv(T_3_14*Rx*T
_3_14')*T_3_14*Rx* D_3_14';

sel_mc14_pt4(1,:) = [ 0 0 0 0 1 0 0 0 0 0 0 0 0 0 0 ];
sel_mc14_pt4(2,:) = [ 0 0 0 0 0 1 0 0 0 0 0 0 0 0 0 ];
sel_mc14_pt4(3,:) = [ 0 0 0 0 0 0 1 0 0 0 0 0 0 0 0 ];
sel_mc14_pt4(4,:) = [ 0 0 0 0 0 0 0 1 0 0 0 0 0 0 0 ];

T_4_14 = sel_mc14_pt4 * ma_ds48;
D_4_14 = pull_4 * transform_filt8 * mc_14;
w_4_14 = inv( T_4_14 * Rx * T_4_14' ) * T_4_14 * Rx * D_4_14';
mcp_14(5,:) = [ zeros(1,4)';(eye(4) - mean_4x4)*w_4_14 +
mean_4';zeros(1,8)']';
err_var(15,5)=D_4_14*Rx*D_4_14'-D_4_14*Rx*T_4_14'*inv(T_4_14*Rx*T
_4_14')*T_4_14*Rx* D_4_14';

sel_mc14_pt5(1,:) = [ 0 0 0 0 1 0 0 0 0 0 0 0 0 0 0 ];
sel_mc14_pt5(2,:) = [ 0 0 0 0 0 1 0 0 0 0 0 0 0 0 0 ];
sel_mc14_pt5(3,:) = [ 0 0 0 0 0 0 1 0 0 0 0 0 0 0 0 ];
sel_mc14_pt5(4,:) = [ 0 0 0 0 0 0 0 1 0 0 0 0 0 0 0 ];

T_5_14 = sel_mc14_pt5 * ma_ds48;
D_5_14 = pull_5 * transform_filt8 * mc_14;
w_5_14 = inv( T_5_14 * Rx * T_5_14' ) * T_5_14 * Rx * D_5_14';
mcp_14(6,:) = [ zeros(1,4)';(eye(4) - mean_4x4)*w_5_14 +
mean_4';zeros(1,8)']';
err_var(15,6)=D_5_14*Rx*D_5_14'-D_5_14*Rx*T_5_14'*inv(T_5_14*Rx*T
_5_14')*T_5_14*Rx* D_5_14';

sel_mc14_pt6(1,:) = [ 0 0 0 0 0 1 0 0 0 0 0 0 0 0 0 ];
sel_mc14_pt6(2,:) = [ 0 0 0 0 0 0 1 0 0 0 0 0 0 0 0 ];
sel_mc14_pt6(3,:) = [ 0 0 0 0 0 0 0 1 0 0 0 0 0 0 0 ];
sel_mc14_pt6(4,:) = [ 0 0 0 0 0 0 0 0 1 0 0 0 0 0 0 ];

T_6_14 = sel_mc14_pt6 * ma_ds48;
D_6_14 = pull_6 * transform_filt8 * mc_14;
w_6_14 = inv( T_6_14 * Rx * T_6_14' ) * T_6_14 * Rx * D_6_14';
mcp_14(7,:) = [ zeros(1,5)';(eye(4) - mean_4x4)*w_6_14 +
mean_4';zeros(1,7)']';
err_var(15,7)=D_6_14*Rx*D_6_14'-D_6_14*Rx*T_6_14'*inv(T_6_14*Rx*T
_6_14')*T_6_14*Rx* D_6_14';

sel_mc14_pt7(1,:) = [ 0 0 0 0 0 1 0 0 0 0 0 0 0 0 0 ];
sel_mc14_pt7(2,:) = [ 0 0 0 0 0 0 1 0 0 0 0 0 0 0 0 ];
sel_mc14_pt7(3,:) = [ 0 0 0 0 0 0 0 1 0 0 0 0 0 0 0 ];
sel_mc14_pt7(4,:) = [ 0 0 0 0 0 0 0 0 1 0 0 0 0 0 0 ];

T_7_14 = sel_mc14_pt7 * ma_ds48;
D_7_14 = pull_7 * transform_filt8 * mc_14;
w_7_14 = inv( T_7_14 * Rx * T_7_14' ) * T_7_14 * Rx * D_7_14';
```

```
mcp_14(8,:) = [ zeros(1,5)';(eye(4) - mean_4x4)*w_7_14 +
mean_4';zeros(1,7)']';
err_var(15,8)=D_7_14*Rx*D_7_14'-D_7_14*Rx*T_7_14'*inv(T_7_14*Rx*T
_7_14')*T_7_14*Rx* D_7_14';

mamcp_14_chk_0 = ds_ma0*mcp_14;
save mamcp_14_chk_0 mamcp_14_chk_0 -ascii -double -tabs
mamcp_14_chk_1 = ds_ma1*mcp_14;
save mamcp_14_chk_1 mamcp_14_chk_1 -ascii -double -tabs
mamcp_14_chk_2 = ds_ma2*mcp_14;
save mamcp_14_chk_2 mamcp_14_chk_2 -ascii -double -tabs mc_15(1,:) = [ 0 0 0 0 0 0 0 0 0 0 0 0 0 0 0 0 1 0 0 0 0 0 0 0 0
0 0 0 0 0 0 0 0 0 0 0 0 0 0 0 0 0 0 0 0 0 0 0 ];
mc_15(2,:) = [ 0 0 0 0 0 0 0 0 0 0 0 0 0 0 0 0 0 1 0 0 0 0 0 0 0
0 0 0 0 0 0 0 0 0 0 0 0 0 0 0 0 0 0 0 0 0 0 0 ];
mc_15(3,:) = [ 0 0 0 0 0 0 0 0 0 0 0 0 0 0 0 0 0 0 1 0 0 0 0 0 0
0 0 0 0 0 0 0 0 0 0 0 0 0 0 0 0 0 0 0 0 0 0 0 ];
mc_15(4,:) = [ 0 0 0 0 0 0 0 0 0 0 0 0 0 0 0 0 0 0 0 1 0 0 0 0 0
0 0 0 0 0 0 0 0 0 0 0 0 0 0 0 0 0 0 0 0 0 0 0 ];
mc_15(5,:) = [ 0 0 0 0 0 0 0 0 0 0 0 0 0 0 0 0 0 0 0 0 1 0 0 0 0
0 0 0 0 0 0 0 0 0 0 0 0 0 0 0 0 0 0 0 0 0 0 0 ];
mc_15(6,:) = [ 0 0 0 0 0 0 0 0 0 0 0 0 0 0 0 0 0 0 0 0 0 1 0 0 0
0 0 0 0 0 0 0 0 0 0 0 0 0 0 0 0 0 0 0 0 0 0 0 ];
mc_15(7,:) = [ 0 0 0 0 0 0 0 0 0 0 0 0 0 0 0 0 0 0 0 0 0 0 1 0 0
0 0 0 0 0 0 0 0 0 0 0 0 0 0 0 0 0 0 0 0 0 0 0 ];
mc_15(8,:) = [ 0 0 0 0 0 0 0 0 0 0 0 0 0 0 0 0 0 0 0 0 0 0 0 1 0 0
0 0 0 0 0 0 0 0 0 0 0 0 0 0 0 0 0 0 0 0 0 0 ];

sel_mc15_pt0(1,:) = [ 0 0 0 1 0 0 0 0 0 0 0 0 0 0 0 0 ];
sel_mc15_pt0(2,:) = [ 0 0 0 0 1 0 0 0 0 0 0 0 0 0 0 0 ];
sel_mc15_pt0(3,:) = [ 0 0 0 0 0 1 0 0 0 0 0 0 0 0 0 0 ];
sel_mc15_pt0(4,:) = [ 0 0 0 0 0 0 1 0 0 0 0 0 0 0 0 0 ];

T_0_15 = sel_mc15_pt0 * ma_ds48;
D_0_15 = pull_0 * transform_filt8 * mc_15;
w_0_15 = inv( T_0_15 * Rx * T_0_15' ) * T_0_15 * Rx * D_0_15';
mcp_15(1,:) = [ zeros(1,3)';(eye(4) - mean_4x4)*w_0_15 +
mean_4';zeros(1,9)']';
err_var(16,1)=D_0_15*Rx*D_0_15'-D_0_15*Rx*T_0_15'*inv(T_0_15*Rx*T
_0_15')*T_0_15*Rx* D_0_15';

sel_mc15_pt1(1,:) = [ 0 0 0 1 0 0 0 0 0 0 0 0 0 0 0 0 ];
sel_mc15_pt1(2,:) = [ 0 0 0 0 1 0 0 0 0 0 0 0 0 0 0 0 ];
sel_mc15_pt1(3,:) = [ 0 0 0 0 0 1 0 0 0 0 0 0 0 0 0 0 ];
sel_mc15_pt1(4,:) = [ 0 0 0 0 0 0 1 0 0 0 0 0 0 0 0 0 ];

T_1_15 = sel_mc15_pt1 * ma_ds48;
D_1_15 = pull_1 * transform_filt8 * mc_15;
w_1_15 = inv( T_1_15 * Rx * T_1_15' ) * T_1_15 * Rx * D_1_15';
```

```
mcp_15(2,:) = [ zeros(1,3)';(eye(4) - mean_4x4)*w_1_15 +
mean_4';zeros(1,9)']';
err_var(16,2)=D_1_15*Rx*D_1_15'-D_1_15*Rx*T_1_15'*inv(T_1_15*Rx*T
_1_15')*T_1_15*Rx* D_1_15';

sel_mc15_pt2(1,:) = [ 0 0 0 0 1 0 0 0 0 0 0 0 0 0 0 0 ];
sel_mc15_pt2(2,:) = [ 0 0 0 0 0 1 0 0 0 0 0 0 0 0 0 0 ];
sel_mc15_pt2(3,:) = [ 0 0 0 0 0 0 1 0 0 0 0 0 0 0 0 0 ];
sel_mc15_pt2(4,:) = [ 0 0 0 0 0 0 0 1 0 0 0 0 0 0 0 0 ];

T_2_15 = sel_mc15_pt2 * ma_ds48;
D_2_15 = pull_2 * transform_filt8 * mc_15;
w_2_15 = inv( T_2_15 * Rx * T_2_15' ) * T_2_15 * Rx * D_2_15';
mcp_15(3,:) = [ zeros(1,4)';(eye(4) - mean_4x4)*w_2_15 +
mean_4';zeros(1,8)']';
err_var(16,3)=D_2_15*Rx*D_2_15'-D_2_15*Rx*T_2_15'*inv(T_2_15*Rx*T
_2_15')*T_2_15*Rx* D_2_15';

sel_mc15_pt3(1,:) = [ 0 0 0 0 1 0 0 0 0 0 0 0 0 0 0 0 ];
sel_mc15_pt3(2,:) = [ 0 0 0 0 0 1 0 0 0 0 0 0 0 0 0 0 ];
sel_mc15_pt3(3,:) = [ 0 0 0 0 0 0 1 0 0 0 0 0 0 0 0 0 ];
sel_mc15_pt3(4,:) = [ 0 0 0 0 0 0 0 1 0 0 0 0 0 0 0 0 ];

T_3_15 = sel_mc15_pt3 * ma_ds48;
D_3_15 = pull_3 * transform_filt8 * mc_15;
w_3_15 = inv( T_3_15 * Rx * T_3_15' ) * T_3_15 * Rx * D_3_15';
mcp_15(4,:) = [ zeros(1,4)';(eye(4) - mean_4x4)*w_3_15 +
mean_4';zeros(1,8)']';
err_var(16,4)=D_3_15*Rx*D_3_15'-D_3_15*Rx*T_3_15'*inv(T_3_15*Rx*T
_3_15')*T_3_15*Rx* D_3_15';

sel_mc15_pt4(1,:) = [ 0 0 0 0 1 0 0 0 0 0 0 0 0 0 0 0 ];
sel_mc15_pt4(2,:) = [ 0 0 0 0 0 1 0 0 0 0 0 0 0 0 0 0 ];
sel_mc15_pt4(3,:) = [ 0 0 0 0 0 0 1 0 0 0 0 0 0 0 0 0 ];
sel_mc15_pt4(4,:) = [ 0 0 0 0 0 0 0 1 0 0 0 0 0 0 0 0 ];

T_4_15 = sel_mc15_pt4 * ma_ds48;
D_4_15 = pull_4 * transform_filt8 * mc_15;
w_4_15 = inv( T_4_15 * Rx * T_4_15' ) * T_4_15 * Rx * D_4_15';
mcp_15(5,:) = [ zeros(1,4)';(eye(4) - mean_4x4)*w_4_15 +
mean_4';zeros(1,8)']';
err_var(16,5)=D_4_15*Rx*D_4_15'-D_4_15*Rx*T_4_15'*inv(T_4_15*Rx*T
_4_15')*T_4_15*Rx* D_4_15';

sel_mc15_pt5(1,:) = [ 0 0 0 0 0 1 0 0 0 0 0 0 0 0 0 0 ];
sel_mc15_pt5(2,:) = [ 0 0 0 0 0 0 1 0 0 0 0 0 0 0 0 0 ];
sel_mc15_pt5(3,:) = [ 0 0 0 0 0 0 0 1 0 0 0 0 0 0 0 0 ];
sel_mc15_pt5(4,:) = [ 0 0 0 0 0 0 0 0 1 0 0 0 0 0 0 0 ];
```

```
T_5_15 = sel_mc15_pt5 * ma_ds48;
D_5_15 = pull_5 * transform_filt8 * mc_15;
w_5_15 = inv( T_5_15 * Rx * T_5_15' ) * T_5_15 * Rx * D_5_15';
mcp_15(6,:) = [ zeros(1,5)';(eye(4) - mean_4x4)*w_5_15 +
mean_4';zeros(1,7)']';
err_var(16,6)=D_5_15*Rx*D_5_15'-D_5_15*Rx*T_5_15'*inv(T_5_15*Rx*T
_5_15')*T_5_15*Rx* D_5_15';

sel_mc15_pt6(1,:) = [ 0 0 0 0 0 1 0 0 0 0 0 0 0 0 0 ];
sel_mc15_pt6(2,:) = [ 0 0 0 0 0 0 1 0 0 0 0 0 0 0 0 ];
sel_mc15_pt6(3,:) = [ 0 0 0 0 0 0 0 1 0 0 0 0 0 0 0 ];
sel_mc15_pt6(4,:) = [ 0 0 0 0 0 0 0 0 1 0 0 0 0 0 0 ];

T_6_15 = sel_mc15_pt6 * ma_ds48;
D_6_15 = pull_6 * transform_filt8 * mc_15;
w_6_15 = inv( T_6_15 * Rx * T_6_15' ) * T_6_15 * Rx * D_6_15';
mcp_15(7,:) = [ zeros(1,5)';(eye(4) - mean_4x4)*w_6_15 +
mean_4';zeros(1,7)']';
err_var(16,7)=D_6_15*Rx*D_6_15'-D_6_15*Rx*T_6_15'*inv(T_6_15*Rx*T
_6_15')*T_6_15*Rx* D_6_15';

sel_mc15_pt7(1,:) = [ 0 0 0 0 0 1 0 0 0 0 0 0 0 0 0 ];
sel_mc15_pt7(2,:) = [ 0 0 0 0 0 0 1 0 0 0 0 0 0 0 0 ];
sel_mc15_pt7(3,:) = [ 0 0 0 0 0 0 0 1 0 0 0 0 0 0 0 ];
sel_mc15_pt7(4,:) = [ 0 0 0 0 0 0 0 0 1 0 0 0 0 0 0 ];

T_7_15 = sel_mc15_pt7 * ma_ds48;
D_7_15 = pull_7 * transform_filt8 * mc_15;
w_7_15 = inv( T_7_15 * Rx * T_7_15' ) * T_7_15 * Rx * D_7_15';
mcp_15(8,:) = [ zeros(1,5)';(eye(4) - mean_4x4)*w_7_15 +
mean_4';zeros(1,7)']';
err_var(16,8)=D_7_15*Rx*D_7_15'-D_7_15*Rx*T_7_15'*inv(T_7_15*Rx*T
_7_15')*T_7_15*Rx* D_7_15';

mamcp_15_chk_0 = ds_ma0*mcp_15;
save mamcp_15_chk_0 mamcp_15_chk_0 -ascii -double -tabs
mamcp_15_chk_1 = ds_ma1*mcp_15;
save mamcp_15_chk_1 mamcp_15_chk_1 -ascii -double -tabs
mamcp_15_chk_2 = ds_ma2*mcp_15;
save mamcp_15_chk_2 mamcp_15_chk_2 -ascii -double -tabs mc_16(1,:) = [ 0 0 0 0 0 0 0 0 0 0 0 0 0 0 0 1 0 0 0 0 0 0 0
 0 0 0 0 0 0 0 0 0 0 0 0 0 0 0 0 0 ];
mc_16(2,:) = [ 0 0 0 0 0 0 0 0 0 0 0 0 0 0 0 0 1 0 0 0 0 0 0
 0 0 0 0 0 0 0 0 0 0 0 0 0 0 0 0 0 ];
mc_16(3,:) = [ 0 0 0 0 0 0 0 0 0 0 0 0 0 0 0 0 0 1 0 0 0 0 0
 0 0 0 0 0 0 0 0 0 0 0 0 0 0 0 0 0 ];
mc_16(4,:) = [ 0 0 0 0 0 0 0 0 0 0 0 0 0 0 0 0 0 0 1 0 0 0 0
 0 0 0 0 0 0 0 0 0 0 0 0 0 0 0 0 0 ];
```

```
mc_16(5,:) = [ 0 0 0 0 0 0 0 0 0 0 0 0 0 0 0 0 0 0 0 1 0 0 0 0
                0 0 0 0 0 0 0 0 0 0 0 0 0 0 0 0 0 0 0 0 0 0 0 0 ];
mc_16(6,:) = [ 0 0 0 0 0 0 0 0 0 0 0 0 0 0 0 0 0 0 0 0 1 0 0 0
                0 0 0 0 0 0 0 0 0 0 0 0 0 0 0 0 0 0 0 0 0 0 0 0 ];
mc_16(7,:) = [ 0 0 0 0 0 0 0 0 0 0 0 0 0 0 0 0 0 0 0 0 0 1 0 0
                0 0 0 0 0 0 0 0 0 0 0 0 0 0 0 0 0 0 0 0 0 0 0 0 ];
mc_16(8,:) = [ 0 0 0 0 0 0 0 0 0 0 0 0 0 0 0 0 0 0 0 0 0 0 1 0
                0 0 0 0 0 0 0 0 0 0 0 0 0 0 0 0 0 0 0 0 0 0 0 0 ];

sel_mc16_pt0(1,:) = [ 0 0 0 1 0 0 0 0 0 0 0 0 0 0 0 0 ];
sel_mc16_pt0(2,:) = [ 0 0 0 0 1 0 0 0 0 0 0 0 0 0 0 0 ];
sel_mc16_pt0(3,:) = [ 0 0 0 0 0 1 0 0 0 0 0 0 0 0 0 0 ];
sel_mc16_pt0(4,:) = [ 0 0 0 0 0 0 1 0 0 0 0 0 0 0 0 0 ];

T_0_16 = sel_mc16_pt0 * ma_ds48;
D_0_16 = pull_0 * transform_filt8 * mc_16;
w_0_16 = inv( T_0_16 * Rx * T_0_16' ) * T_0_16 * Rx * D_0_16';
mcp_16(1,:) = [ zeros(1,3)';(eye(4) - mean_4x4)*w_0_16 +
mean_4';zeros(1,9)']';
err_var(17,1)=D_0_16*Rx*D_0_16'-D_0_16*Rx*T_0_16'*inv(T_0_16*Rx*T
_0_16')*T_0_16*Rx* D_0_16';

sel_mc16_pt1(1,:) = [ 0 0 0 0 1 0 0 0 0 0 0 0 0 0 0 0 ];
sel_mc16_pt1(2,:) = [ 0 0 0 0 0 1 0 0 0 0 0 0 0 0 0 0 ];
sel_mc16_pt1(3,:) = [ 0 0 0 0 0 0 1 0 0 0 0 0 0 0 0 0 ];
sel_mc16_pt1(4,:) = [ 0 0 0 0 0 0 0 1 0 0 0 0 0 0 0 0 ];

T_1_16 = sel_mc16_pt1 * ma_ds48;
D_1_16 = pull_1 * transform_filt8 * mc_16;
w_1_16 = inv( T_1_16 * Rx * T_1_16' ) * T_1_16 * Rx * D_1_16';
mcp_16(2,:) = [ zeros(1,4)';(eye(4) - mean_4x4)*w_1_16 +
mean_4';zeros(1,8)']';
err_var(17,2)=D_1_16*Rx*D_1_16'-D_1_16*Rx*T_1_16'*inv(T_1_16*Rx*T
_1_16')*T_1_16*Rx* D_1_16';

sel_mc16_pt2(1,:) = [ 0 0 0 0 1 0 0 0 0 0 0 0 0 0 0 0 ];
sel_mc16_pt2(2,:) = [ 0 0 0 0 0 1 0 0 0 0 0 0 0 0 0 0 ];
sel_mc16_pt2(3,:) = [ 0 0 0 0 0 0 1 0 0 0 0 0 0 0 0 0 ];
sel_mc16_pt2(4,:) = [ 0 0 0 0 0 0 0 1 0 0 0 0 0 0 0 0 ];

T_2_16 = sel_mc16_pt2 * ma_ds48;
D_2_16 = pull_2 * transform_filt8 * mc_16;
w_2_16 = inv( T_2_16 * Rx * T_2_16' ) * T_2_16 * Rx * D_2_16';
mcp_16(3,:) = [ zeros(1,4)';(eye(4) - mean_4x4)*w_2_16 +
mean_4';zeros(1,8)']';
err_var(17,3)=D_2_16*Rx*D_2_16'-D_2_16*Rx*T_2_16'*inv(T_2_16*Rx*T
_2_16')*T_2_16*Rx* D_2_16';

sel_mc16_pt3(1,:) = [ 0 0 0 0 1 0 0 0 0 0 0 0 0 0 0 0 ];
sel_mc16_pt3(2,:) = [ 0 0 0 0 0 1 0 0 0 0 0 0 0 0 0 0 ];
```

```
sel_mc16_pt3(3,:) = [ 0 0 0 0 0 0 1 0 0 0 0 0 0 0 0 0 ];
sel_mc16_pt3(4,:) = [ 0 0 0 0 0 0 0 1 0 0 0 0 0 0 0 0 ];

T_3_16 = sel_mc16_pt3 * ma_ds48;
D_3_16 = pull_3 * transform_filt8 * mc_16;
w_3_16 = inv( T_3_16 * Rx * T_3_16' ) * T_3_16 * Rx * D_3_16';
mcp_16(4,:) = [ zeros(1,4)';(eye(4) - mean_4x4)*w_3_16 +
mean_4';zeros(1,8)']';
err_var(17,4)=D_3_16*Rx*D_3_16'-D_3_16*Rx*T_3_16'*inv(T_3_16*Rx*T
_3_16')*T_3_16*Rx* D_3_16';

sel_mc16_pt4(1,:) = [ 0 0 0 0 0 1 0 0 0 0 0 0 0 0 0 0 ];
sel_mc16_pt4(2,:) = [ 0 0 0 0 0 0 1 0 0 0 0 0 0 0 0 0 ];
sel_mc16_pt4(3,:) = [ 0 0 0 0 0 0 0 1 0 0 0 0 0 0 0 0 ];
sel_mc16_pt4(4,:) = [ 0 0 0 0 0 0 0 0 1 0 0 0 0 0 0 0 ];

T_4_16 = sel_mc16_pt4 * ma_ds48;
D_4_16 = pull_4 * transform_filt8 * mc_16;
w_4_16 = inv( T_4_16 * Rx * T_4_16' ) * T_4_16 * Rx * D_4_16';
mcp_16(5,:) = [ zeros(1,5)';(eye(4) - mean_4x4)*w_4_16 +
mean_4';zeros(1,7)']';
err_var(17,5)=D_4_16*Rx*D_4_16'-D_4_16*Rx*T_4_16'*inv(T_4_16*Rx*T
_4_16')*T_4_16*Rx* D_4_16';

sel_mc16_pt5(1,:) = [ 0 0 0 0 0 1 0 0 0 0 0 0 0 0 0 0 ];
sel_mc16_pt5(2,:) = [ 0 0 0 0 0 0 1 0 0 0 0 0 0 0 0 0 ];
sel_mc16_pt5(3,:) = [ 0 0 0 0 0 0 0 1 0 0 0 0 0 0 0 0 ];
sel_mc16_pt5(4,:) = [ 0 0 0 0 0 0 0 0 1 0 0 0 0 0 0 0 ];

T_5_16 = sel_mc16_pt5 * ma_ds48;
D_5_16 = pull_5 * transform_filt8 * mc_16;
w_5_16 = inv( T_5_16 * Rx * T_5_16' ) * T_5_16 * Rx * D_5_16';
mcp_16(6,:) = [ zeros(1,5)';(eye(4) - mean_4x4)*w_5_16 +
mean_4';zeros(1,7)']';
err_var(17,6)=D_5_16*Rx*D_5_16'-D_5_16*Rx*T_5_16'*inv(T_5_16*Rx*T
_5_16')*T_5_16*Rx* D_5_16';

sel_mc16_pt6(1,:) = [ 0 0 0 0 0 1 0 0 0 0 0 0 0 0 0 0 ];
sel_mc16_pt6(2,:) = [ 0 0 0 0 0 0 1 0 0 0 0 0 0 0 0 0 ];
sel_mc16_pt6(3,:) = [ 0 0 0 0 0 0 0 1 0 0 0 0 0 0 0 0 ];
sel_mc16_pt6(4,:) = [ 0 0 0 0 0 0 0 0 1 0 0 0 0 0 0 0 ];

T_6_16 = sel_mc16_pt6 * ma_ds48;
D_6_16 = pull_6 * transform_filt8 * mc_16;
w_6_16 = inv( T_6_16 * Rx * T_6_16' ) * T_6_16 * Rx * D_6_16';
mcp_16(7,:) = [ zeros(1,5)';(eye(4) - mean_4x4)*w_6_16 +
mean_4';zeros(1,7)']';
err_var(17,7)=D_6_16*Rx*D_6_16'-D_6_16*Rx*T_6_16'*inv(T_6_16*Rx*T
_6_16')*T_6_16*Rx* D_6_16';
```

-69-

```
sel_mc16_pt7(1,:) = [ 0 0 0 0 0 0 1 0 0 0 0 0 0 0 0 0 ];
sel_mc16_pt7(2,:) = [ 0 0 0 0 0 0 0 1 0 0 0 0 0 0 0 0 ];
sel_mc16_pt7(3,:) = [ 0 0 0 0 0 0 0 0 1 0 0 0 0 0 0 0 ];
sel_mc16_pt7(4,:) = [ 0 0 0 0 0 0 0 0 0 1 0 0 0 0 0 0 ];

T_7_16 = sel_mc16_pt7 * ma_ds48;
D_7_16 = pull_7 * transform_filt8 * mc_16;
w_7_16 = inv( T_7_16 * Rx * T_7_16' ) * T_7_16 * Rx * D_7_16';
mcp_16(8,:) = [ zeros(1,6)';(eye(4) - mean_4x4)*w_7_16 +
mean_4';zeros(1,6)']';
err_var(17,8)=D_7_16*Rx*D_7_16'-D_7_16*Rx*T_7_16'*inv(T_7_16*Rx*T
_7_16')*T_7_16*Rx* D_7_16';

mamcp_16_chk_0 = ds_ma0*mcp_16;
save mamcp_16_chk_0 mamcp_16_chk_0 -ascii -double -tabs
mamcp_16_chk_1 = ds_ma1*mcp_16;
save mamcp_16_chk_1 mamcp_16_chk_1 -ascii -double -tabs
mamcp_16_chk_2 = ds_ma2*mcp_16;
save mamcp_16_chk_2 mamcp_16_chk_2 -ascii -double -tabs mc_17(1,:) = [ 0 0 0 0 0 0 0 0 0 0 0 0 0 0 0 0 1 0 0 0 0 0 0 0
0 0 0 0 0 0 0 0 0 0 0 0 0 0 0 0 ];
mc_17(2,:) = [ 0 0 0 0 0 0 0 0 0 0 0 0 0 0 0 0 0 1 0 0 0 0 0 0
0 0 0 0 0 0 0 0 0 0 0 0 0 0 0 0 ];
mc_17(3,:) = [ 0 0 0 0 0 0 0 0 0 0 0 0 0 0 0 0 0 0 1 0 0 0 0 0
0 0 0 0 0 0 0 0 0 0 0 0 0 0 0 0 ];
mc_17(4,:) = [ 0 0 0 0 0 0 0 0 0 0 0 0 0 0 0 0 0 0 0 1 0 0 0 0
0 0 0 0 0 0 0 0 0 0 0 0 0 0 0 0 ];
mc_17(5,:) = [ 0 0 0 0 0 0 0 0 0 0 0 0 0 0 0 0 0 0 0 0 1 0 0 0
0 0 0 0 0 0 0 0 0 0 0 0 0 0 0 0 ];
mc_17(6,:) = [ 0 0 0 0 0 0 0 0 0 0 0 0 0 0 0 0 0 0 0 0 0 1 0 0
0 0 0 0 0 0 0 0 0 0 0 0 0 0 0 0 ];
mc_17(7,:) = [ 0 0 0 0 0 0 0 0 0 0 0 0 0 0 0 0 0 0 0 0 0 0 1 0
0 0 0 0 0 0 0 0 0 0 0 0 0 0 0 0 ];
mc_17(8,:) = [ 0 0 0 0 0 0 0 0 0 0 0 0 0 0 0 0 0 0 0 0 0 0 0 1
0 0 0 0 0 0 0 0 0 0 0 0 0 0 0 0 ];

sel_mc17_pt0(1,:) = [ 0 0 0 0 1 0 0 0 0 0 0 0 0 0 0 0 ];
sel_mc17_pt0(2,:) = [ 0 0 0 0 0 1 0 0 0 0 0 0 0 0 0 0 ];
sel_mc17_pt0(3,:) = [ 0 0 0 0 0 0 1 0 0 0 0 0 0 0 0 0 ];
sel_mc17_pt0(4,:) = [ 0 0 0 0 0 0 0 1 0 0 0 0 0 0 0 0 ];

T_0_17 = sel_mc17_pt0 * ma_ds48;
D_0_17 = pull_0 * transform_filt8 * mc_17;
w_0_17 = inv( T_0_17 * Rx * T_0_17' ) * T_0_17 * Rx * D_0_17';
mcp_17(1,:) = [ zeros(1,4)';(eye(4) - mean_4x4)*w_0_17 +
mean_4';zeros(1,8)']';
err_var(18,1)=D_0_17*Rx*D_0_17'-D_0_17*Rx*T_0_17'*inv(T_0_17*Rx*T
_0_17')*T_0_17*Rx* D_0_17';
```

```
        sel_mc17_pt1(1,:) = [ 0 0 0 0 1 0 0 0 0 0 0 0 0 0 0 ];
        sel_mc17_pt1(2,:) = [ 0 0 0 0 0 1 0 0 0 0 0 0 0 0 0 ];
        sel_mc17_pt1(3,:) = [ 0 0 0 0 0 0 1 0 0 0 0 0 0 0 0 ];
        sel_mc17_pt1(4,:) = [ 0 0 0 0 0 0 0 1 0 0 0 0 0 0 0 ];
5
        T_1_17 = sel_mc17_pt1 * ma_ds48;
        D_1_17 = pull_1 * transform_filt8 * mc_17;
        w_1_17 = inv( T_1_17 * Rx * T_1_17' ) * T_1_17 * Rx * D_1_17';
        mcp_17(2,:) = [ zeros(1,4)';(eye(4) - mean_4x4)*w_1_17 +
10      mean_4';zeros(1,8)']';
        err_var(18,2)=D_1_17*Rx*D_1_17'-D_1_17*Rx*T_1_17'*inv(T_1_17*Rx*T
        _1_17')*T_1_17*Rx* D_1_17';

sel_mc17_pt2(1,:) = [ 0 0 0 0 1 0 0 0 0 0 0 0 0 0 0 ];
15      sel_mc17_pt2(2,:) = [ 0 0 0 0 0 1 0 0 0 0 0 0 0 0 0 ];
        sel_mc17_pt2(3,:) = [ 0 0 0 0 0 0 1 0 0 0 0 0 0 0 0 ];
        sel_mc17_pt2(4,:) = [ 0 0 0 0 0 0 0 1 0 0 0 0 0 0 0 ];

T_2_17 = sel_mc17_pt2 * ma_ds48;
20      D_2_17 = pull_2 * transform_filt8 * mc_17;
        w_2_17 = inv( T_2_17 * Rx * T_2_17' ) * T_2_17 * Rx * D_2_17';
        mcp_17(3,:) = [ zeros(1,4)';(eye(4) - mean_4x4)*w_2_17 +
        mean_4';zeros(1,8)']';
        err_var(18,3)=D_2_17*Rx*D_2_17'-D_2_17*Rx*T_2_17'*inv(T_2_17*Rx*T
25      _2_17')*T_2_17*Rx* D_2_17';

sel_mc17_pt3(1,:) = [ 0 0 0 0 0 1 0 0 0 0 0 0 0 0 0 ];
        sel_mc17_pt3(2,:) = [ 0 0 0 0 0 0 1 0 0 0 0 0 0 0 0 ];
        sel_mc17_pt3(3,:) = [ 0 0 0 0 0 0 0 1 0 0 0 0 0 0 0 ];
30      sel_mc17_pt3(4,:) = [ 0 0 0 0 0 0 0 0 1 0 0 0 0 0 0 ];

T_3_17 = sel_mc17_pt3 * ma_ds48;
        D_3_17 = pull_3 * transform_filt8 * mc_17;
        w_3_17 = inv( T_3_17 * Rx * T_3_17' ) * T_3_17 * Rx * D_3_17';
35      mcp_17(4,:) = [ zeros(1,5)';(eye(4) - mean_4x4)*w_3_17 +
        mean_4';zeros(1,7)']';
        err_var(18,4)=D_3_17*Rx*D_3_17'-D_3_17*Rx*T_3_17'*inv(T_3_17*Rx*T
        _3_17')*T_3_17*Rx* D_3_17';

40      sel_mc17_pt4(1,:) = [ 0 0 0 0 0 1 0 0 0 0 0 0 0 0 0 ];
        sel_mc17_pt4(2,:) = [ 0 0 0 0 0 0 1 0 0 0 0 0 0 0 0 ];
        sel_mc17_pt4(3,:) = [ 0 0 0 0 0 0 0 1 0 0 0 0 0 0 0 ];
        sel_mc17_pt4(4,:) = [ 0 0 0 0 0 0 0 0 1 0 0 0 0 0 0 ];

45      T_4_17 = sel_mc17_pt4 * ma_ds48;
        D_4_17 = pull_4 * transform_filt8 * mc_17;
        w_4_17 = inv( T_4_17 * Rx * T_4_17' ) * T_4_17 * Rx * D_4_17';
        mcp_17(5,:) = [ zeros(1,5)';(eye(4) - mean_4x4)*w_4_17 +
        mean_4';zeros(1,7)']';
```

-71-

```
err_var(18,5)=D_4_17*Rx*D_4_17'-D_4_17*Rx*T_4_17'*inv(T_4_17*Rx*T
_4_17')*T_4_17*Rx* D_4_17';

sel_mc17_pt5(1,:) = [ 0 0 0 0 0 1 0 0 0 0 0 0 0 0 0 ];
sel_mc17_pt5(2,:) = [ 0 0 0 0 0 0 1 0 0 0 0 0 0 0 0 ];
sel_mc17_pt5(3,:) = [ 0 0 0 0 0 0 0 1 0 0 0 0 0 0 0 ];
sel_mc17_pt5(4,:) = [ 0 0 0 0 0 0 0 0 1 0 0 0 0 0 0 ];

T_5_17 = sel_mc17_pt5 * ma_ds48;
D_5_17 = pull_5 * transform_filt8 * mc_17;
w_5_17 = inv( T_5_17 * Rx * T_5_17' ) * T_5_17 * Rx * D_5_17';
mcp_17(6,:) = [ zeros(1,5)';(eye(4) - mean_4x4)*w_5_17 +
mean_4';zeros(1,7)']';
err_var(18,6)=D_5_17*Rx*D_5_17'-D_5_17*Rx*T_5_17'*inv(T_5_17*Rx*T
_5_17')*T_5_17*Rx* D_5_17';

sel_mc17_pt6(1,:) = [ 0 0 0 0 0 0 1 0 0 0 0 0 0 0 0 ];
sel_mc17_pt6(2,:) = [ 0 0 0 0 0 0 0 1 0 0 0 0 0 0 0 ];
sel_mc17_pt6(3,:) = [ 0 0 0 0 0 0 0 0 1 0 0 0 0 0 0 ];
sel_mc17_pt6(4,:) = [ 0 0 0 0 0 0 0 0 0 1 0 0 0 0 0 ];

T_6_17 = sel_mc17_pt6 * ma_ds48;
D_6_17 = pull_6 * transform_filt8 * mc_17;
w_6_17 = inv( T_6_17 * Rx * T_6_17' ) * T_6_17 * Rx * D_6_17';
mcp_17(7,:) = [ zeros(1,6)';(eye(4) - mean_4x4)*w_6_17 +
mean_4';zeros(1,6)']';
err_var(18,7)=D_6_17*Rx*D_6_17'-D_6_17*Rx*T_6_17'*inv(T_6_17*Rx*T
_6_17')*T_6_17*Rx* D_6_17';

sel_mc17_pt7(1,:) = [ 0 0 0 0 0 0 1 0 0 0 0 0 0 0 0 ];
sel_mc17_pt7(2,:) = [ 0 0 0 0 0 0 0 1 0 0 0 0 0 0 0 ];
sel_mc17_pt7(3,:) = [ 0 0 0 0 0 0 0 0 1 0 0 0 0 0 0 ];
sel_mc17_pt7(4,:) = [ 0 0 0 0 0 0 0 0 0 1 0 0 0 0 0 ];

T_7_17 = sel_mc17_pt7 * ma_ds48;
D_7_17 = pull_7 * transform_filt8 * mc_17;
w_7_17 = inv( T_7_17 * Rx * T_7_17' ) * T_7_17 * Rx * D_7_17';
mcp_17(8,:) = [ zeros(1,6)';(eye(4) - mean_4x4)*w_7_17 +
mean_4';zeros(1,6)']';
err_var(18,8)=D_7_17*Rx*D_7_17'-D_7_17*Rx*T_7_17'*inv(T_7_17*Rx*T
_7_17')*T_7_17*Rx* D_7_17';

mamcp_17_chk_0 = ds_ma0*mcp_17;
save mamcp_17_chk_0 mamcp_17_chk_0 -ascii -double -tabs
mamcp_17_chk_1 = ds_ma1*mcp_17;
save mamcp_17_chk_1 mamcp_17_chk_1 -ascii -double -tabs
mamcp_17_chk_2 = ds_ma2*mcp_17;
save mamcp_17_chk_2 mamcp_17_chk_2 -ascii -double -tabs
```

```
mc_18(1,:) = [ 0 0 0 0 0 0 0 0 0 0 0 0 0 0 0 0 0 1 0 0 0 0 0 0
0 0 0 0 0 0 0 0 0 0 0 0 0 0 0 0 0 0 0 0 0 0 0 0 ];
mc_18(2,:) = [ 0 0 0 0 0 0 0 0 0 0 0 0 0 0 0 0 0 0 1 0 0 0 0 0
0 0 0 0 0 0 0 0 0 0 0 0 0 0 0 0 0 0 0 0 0 0 0 0 ];
mc_18(3,:) = [ 0 0 0 0 0 0 0 0 0 0 0 0 0 0 0 0 0 0 0 1 0 0 0 0
0 0 0 0 0 0 0 0 0 0 0 0 0 0 0 0 0 0 0 0 0 0 0 0 ];
mc_18(4,:) = [ 0 0 0 0 0 0 0 0 0 0 0 0 0 0 0 0 0 0 0 0 1 0 0 0
0 0 0 0 0 0 0 0 0 0 0 0 0 0 0 0 0 0 0 0 0 0 0 0 ];
mc_18(5,:) = [ 0 0 0 0 0 0 0 0 0 0 0 0 0 0 0 0 0 0 0 0 0 1 0 0
0 0 0 0 0 0 0 0 0 0 0 0 0 0 0 0 0 0 0 0 0 0 0 0 ];
mc_18(6,:) = [ 0 0 0 0 0 0 0 0 0 0 0 0 0 0 0 0 0 0 0 0 0 0 1 0
0 0 0 0 0 0 0 0 0 0 0 0 0 0 0 0 0 0 0 0 0 0 0 0 ];
mc_18(7,:) = [ 0 0 0 0 0 0 0 0 0 0 0 0 0 0 0 0 0 0 0 0 0 0 0 1
0 0 0 0 0 0 0 0 0 0 0 0 0 0 0 0 0 0 0 0 0 0 0 0 ];
mc_18(8,:) = [ 0 0 0 0 0 0 0 0 0 0 0 0 0 0 0 0 0 0 0 0 0 0 0 0
1 0 0 0 0 0 0 0 0 0 0 0 0 0 0 0 0 0 0 0 0 0 0 0 ];

sel_mc18_pt0(1,:) = [ 0 0 0 0 1 0 0 0 0 0 0 0 0 0 0 ];
sel_mc18_pt0(2,:) = [ 0 0 0 0 0 1 0 0 0 0 0 0 0 0 0 ];
sel_mc18_pt0(3,:) = [ 0 0 0 0 0 0 1 0 0 0 0 0 0 0 0 ];
sel_mc18_pt0(4,:) = [ 0 0 0 0 0 0 0 1 0 0 0 0 0 0 0 ];

T_0_18 = sel_mc18_pt0 * ma_ds48;
D_0_18 = pull_0 * transform_filt8 * mc_18;
w_0_18 = inv( T_0_18 * Rx * T_0_18' ) * T_0_18 * Rx * D_0_18';
mcp_18(1,:) = [ zeros(1,4)';(eye(4) - mean_4x4)*w_0_18 +
mean_4';zeros(1,8)']';
err_var(19,1)=D_0_18*Rx*D_0_18'-D_0_18*Rx*T_0_18'*inv(T_0_18*Rx*T
_0_18')*T_0_18*Rx* D_0_18';

sel_mc18_pt1(1,:) = [ 0 0 0 0 1 0 0 0 0 0 0 0 0 0 0 ];
sel_mc18_pt1(2,:) = [ 0 0 0 0 0 1 0 0 0 0 0 0 0 0 0 ];
sel_mc18_pt1(3,:) = [ 0 0 0 0 0 0 1 0 0 0 0 0 0 0 0 ];
sel_mc18_pt1(4,:) = [ 0 0 0 0 0 0 0 1 0 0 0 0 0 0 0 ];

T_1_18 = sel_mc18_pt1 * ma_ds48;
D_1_18 = pull_1 * transform_filt8 * mc_18;
w_1_18 = inv( T_1_18 * Rx * T_1_18' ) * T_1_18 * Rx * D_1_18';
mcp_18(2,:) = [ zeros(1,4)';(eye(4) - mean_4x4)*w_1_18 +
mean_4';zeros(1,8)']';
err_var(19,2)=D_1_18*Rx*D_1_18'-D_1_18*Rx*T_1_18'*inv(T_1_18*Rx*T
_1_18')*T_1_18*Rx* D_1_18';

sel_mc18_pt2(1,:) = [ 0 0 0 0 0 1 0 0 0 0 0 0 0 0 0 ];
sel_mc18_pt2(2,:) = [ 0 0 0 0 0 0 1 0 0 0 0 0 0 0 0 ];
sel_mc18_pt2(3,:) = [ 0 0 0 0 0 0 0 1 0 0 0 0 0 0 0 ];
sel_mc18_pt2(4,:) = [ 0 0 0 0 0 0 0 0 1 0 0 0 0 0 0 ];

T_2_18 = sel_mc18_pt2 * ma_ds48;
D_2_18 = pull_2 * transform_filt8 * mc_18;
```

-73-

```
        w_2_18 = inv( T_2_18 * Rx * T_2_18' ) * T_2_18 * Rx * D_2_18';
        mcp_18(3,:) = [ zeros(1,5)';(eye(4) - mean_4x4)*w_2_18 +
        mean_4';zeros(1,7)']';
        err_var(19,3)=D_2_18*Rx*D_2_18'-D_2_18*Rx*T_2_18'*inv(T_2_18*Rx*T
 5      _2_18')*T_2_18*Rx* D_2_18';

sel_mc18_pt3(1,:) = [ 0 0 0 0 0 1 0 0 0 0 0 0 0 0 ];
        sel_mc18_pt3(2,:) = [ 0 0 0 0 0 0 1 0 0 0 0 0 0 0 ];
        sel_mc18_pt3(3,:) = [ 0 0 0 0 0 0 0 1 0 0 0 0 0 0 ];
10      sel_mc18_pt3(4,:) = [ 0 0 0 0 0 0 0 0 1 0 0 0 0 0 ];

T_3_18 = sel_mc18_pt3 * ma_ds48;
        D_3_18 = pull_3 * transform_filt8 * mc_18;
        w_3_18 = inv( T_3_18 * Rx * T_3_18' ) * T_3_18 * Rx * D_3_18';
15      mcp_18(4,:) = [ zeros(1,5)';(eye(4) - mean_4x4)*w_3_18 +
        mean_4';zeros(1,7)']';
        err_var(19,4)=D_3_18*Rx*D_3_18'-D_3_18*Rx*T_3_18'*inv(T_3_18*Rx*T
        _3_18')*T_3_18*Rx* D_3_18';

20      sel_mc18_pt4(1,:) = [ 0 0 0 0 0 1 0 0 0 0 0 0 0 0 ];
        sel_mc18_pt4(2,:) = [ 0 0 0 0 0 0 1 0 0 0 0 0 0 0 ];
        sel_mc18_pt4(3,:) = [ 0 0 0 0 0 0 0 1 0 0 0 0 0 0 ];
        sel_mc18_pt4(4,:) = [ 0 0 0 0 0 0 0 0 1 0 0 0 0 0 ];

25      T_4_18 = sel_mc18_pt4 * ma_ds48;
        D_4_18 = pull_4 * transform_filt8 * mc_18;
        w_4_18 = inv( T_4_18 * Rx * T_4_18' ) * T_4_18 * Rx * D_4_18';
        mcp_18(5,:) = [ zeros(1,5)';(eye(4) - mean_4x4)*w_4_18 +
        mean_4';zeros(1,7)']';
30      err_var(19,5)=D_4_18*Rx*D_4_18'-D_4_18*Rx*T_4_18'*inv(T_4_18*Rx*T
        _4_18')*T_4_18*Rx* D_4_18';

sel_mc18_pt5(1,:) = [ 0 0 0 0 0 0 1 0 0 0 0 0 0 0 ];
        sel_mc18_pt5(2,:) = [ 0 0 0 0 0 0 0 1 0 0 0 0 0 0 ];
35      sel_mc18_pt5(3,:) = [ 0 0 0 0 0 0 0 0 1 0 0 0 0 0 ];
        sel_mc18_pt5(4,:) = [ 0 0 0 0 0 0 0 0 0 1 0 0 0 0 ];

T_5_18 = sel_mc18_pt5 * ma_ds48;
        D_5_18 = pull_5 * transform_filt8 * mc_18;
40      w_5_18 = inv( T_5_18 * Rx * T_5_18' ) * T_5_18 * Rx * D_5_18';
        mcp_18(6,:) = [ zeros(1,6)';(eye(4) - mean_4x4)*w_5_18 +
        mean_4';zeros(1,6)']';
        err_var(19,6)=D_5_18*Rx*D_5_18'-D_5_18*Rx*T_5_18'*inv(T_5_18*Rx*T
        _5_18')*T_5_18*Rx* D_5_18';
45
        sel_mc18_pt6(1,:) = [ 0 0 0 0 0 0 1 0 0 0 0 0 0 0 ];
        sel_mc18_pt6(2,:) = [ 0 0 0 0 0 0 0 1 0 0 0 0 0 0 ];
        sel_mc18_pt6(3,:) = [ 0 0 0 0 0 0 0 0 1 0 0 0 0 0 ];
        sel_mc18_pt6(4,:) = [ 0 0 0 0 0 0 0 0 0 1 0 0 0 0 ];
```

```
T_6_18 = sel_mc18_pt6 * ma_ds48;
D_6_18 = pull_6 * transform_filt8 * mc_18;
w_6_18 = inv( T_6_18 * Rx * T_6_18' ) * T_6_18 * Rx * D_6_18';
mcp_18(7,:) = [ zeros(1,6)';(eye(4) - mean_4x4)*w_6_18 +
mean_4';zeros(1,6)']';
err_var(19,7)=D_6_18*Rx*D_6_18'-D_6_18*Rx*T_6_18'*inv(T_6_18*Rx*T
_6_18')*T_6_18*Rx* D_6_18';

sel_mc18_pt7(1,:) = [ 0 0 0 0 0 0 1 0 0 0 0 0 0 0 0 ];
sel_mc18_pt7(2,:) = [ 0 0 0 0 0 0 0 1 0 0 0 0 0 0 0 ];
sel_mc18_pt7(3,:) = [ 0 0 0 0 0 0 0 0 1 0 0 0 0 0 0 ];
sel_mc18_pt7(4,:) = [ 0 0 0 0 0 0 0 0 0 1 0 0 0 0 0 ];

T_7_18 = sel_mc18_pt7 * ma_ds48;
D_7_18 = pull_7 * transform_filt8 * mc_18;
w_7_18 = inv( T_7_18 * Rx * T_7_18' ) * T_7_18 * Rx * D_7_18';
mcp_18(8,:) = [ zeros(1,6)';(eye(4) - mean_4x4)*w_7_18 +
mean_4';zeros(1,6)']';
err_var(19,8)=D_7_18*Rx*D_7_18'-D_7_18*Rx*T_7_18'*inv(T_7_18*Rx*T
_7_18')*T_7_18*Rx* D_7_18';

mamcp_18_chk_0 = ds_ma0*mcp_18;
save mamcp_18_chk_0 mamcp_18_chk_0 -ascii -double -tabs
mamcp_18_chk_1 = ds_ma1*mcp_18;
save mamcp_18_chk_1 mamcp_18_chk_1 -ascii -double -tabs
mamcp_18_chk_2 = ds_ma2*mcp_18;
save mamcp_18_chk_2 mamcp_18_chk_2 -ascii -double -tabs mc_19(1,:) = [ 0 0 0 0 0 0 0 0 0 0 0 0 0 0 0 0 0 0 1 0 0 0 0 0
0 0 0 0 0 0 0 0 0 0 0 0 0 0 0 0 0 0 0 0 ];
mc_19(2,:) = [ 0 0 0 0 0 0 0 0 0 0 0 0 0 0 0 0 0 0 0 1 0 0 0 0
0 0 0 0 0 0 0 0 0 0 0 0 0 0 0 0 0 0 0 0 ];
mc_19(3,:) = [ 0 0 0 0 0 0 0 0 0 0 0 0 0 0 0 0 0 0 0 0 1 0 0 0
0 0 0 0 0 0 0 0 0 0 0 0 0 0 0 0 0 0 0 0 ];
mc_19(4,:) = [ 0 0 0 0 0 0 0 0 0 0 0 0 0 0 0 0 0 0 0 0 0 1 0 0
0 0 0 0 0 0 0 0 0 0 0 0 0 0 0 0 0 0 0 0 ];
mc_19(5,:) = [ 0 0 0 0 0 0 0 0 0 0 0 0 0 0 0 0 0 0 0 0 0 0 1 0
0 0 0 0 0 0 0 0 0 0 0 0 0 0 0 0 0 0 0 0 ];
mc_19(6,:) = [ 0 0 0 0 0 0 0 0 0 0 0 0 0 0 0 0 0 0 0 0 0 0 0 1
0 0 0 0 0 0 0 0 0 0 0 0 0 0 0 0 0 0 0 0 ];
mc_19(7,:) = [ 0 0 0 0 0 0 0 0 0 0 0 0 0 0 0 0 0 0 0 0 0 0 0 0
1 0 0 0 0 0 0 0 0 0 0 0 0 0 0 0 0 0 0 0 ];
mc_19(8,:) = [ 0 0 0 0 0 0 0 0 0 0 0 0 0 0 0 0 0 0 0 0 0 0 0 0
0 1 0 0 0 0 0 0 0 0 0 0 0 0 0 0 0 0 0 0 ];

sel_mc19_pt0(1,:) = [ 0 0 0 0 1 0 0 0 0 0 0 0 0 0 0 ];
sel_mc19_pt0(2,:) = [ 0 0 0 0 0 1 0 0 0 0 0 0 0 0 0 ];
sel_mc19_pt0(3,:) = [ 0 0 0 0 0 0 1 0 0 0 0 0 0 0 0 ];
sel_mc19_pt0(4,:) = [ 0 0 0 0 0 0 0 1 0 0 0 0 0 0 0 ];
```

```
    T_0_19 = sel_mc19_pt0 * ma_ds48;
    D_0_19 = pull_0 * transform_filt8 * mc_19;
    w_0_19 = inv( T_0_19 * Rx * T_0_19' ) * T_0_19 * Rx * D_0_19';
    mcp_19(1,:) = [ zeros(1,4)';(eye(4) - mean_4x4)*w_0_19 +
5   mean_4';zeros(1,8)']';
    err_var(20,1)=D_0_19*Rx*D_0_19'-D_0_19*Rx*T_0_19'*inv(T_0_19*Rx*T
    _0_19')*T_0_19*Rx* D_0_19';

sel_mc19_pt1(1,:) = [ 0 0 0 0 0 1 0 0 0 0 0 0 0 0 0 ];
10  sel_mc19_pt1(2,:) = [ 0 0 0 0 0 0 1 0 0 0 0 0 0 0 0 ];
    sel_mc19_pt1(3,:) = [ 0 0 0 0 0 0 0 1 0 0 0 0 0 0 0 ];
    sel_mc19_pt1(4,:) = [ 0 0 0 0 0 0 0 0 1 0 0 0 0 0 0 ];

T_1_19 = sel_mc19_pt1 * ma_ds48;
15  D_1_19 = pull_1 * transform_filt8 * mc_19;
    w_1_19 = inv( T_1_19 * Rx * T_1_19' ) * T_1_19 * Rx * D_1_19';
    mcp_19(2,:) = [ zeros(1,5)';(eye(4) - mean_4x4)*w_1_19 +
    mean_4';zeros(1,7)']';
    err_var(20,2)=D_1_19*Rx*D_1_19'-D_1_19*Rx*T_1_19'*inv(T_1_19*Rx*T
20  _1_19')*T_1_19*Rx* D_1_19';

sel_mc19_pt2(1,:) = [ 0 0 0 0 0 1 0 0 0 0 0 0 0 0 0 ];
    sel_mc19_pt2(2,:) = [ 0 0 0 0 0 0 1 0 0 0 0 0 0 0 0 ];
    sel_mc19_pt2(3,:) = [ 0 0 0 0 0 0 0 1 0 0 0 0 0 0 0 ];
25  sel_mc19_pt2(4,:) = [ 0 0 0 0 0 0 0 0 1 0 0 0 0 0 0 ];

T_2_19 = sel_mc19_pt2 * ma_ds48;
    D_2_19 = pull_2 * transform_filt8 * mc_19;
    w_2_19 = inv( T_2_19 * Rx * T_2_19' ) * T_2_19 * Rx * D_2_19';
30  mcp_19(3,:) = [ zeros(1,5)';(eye(4) - mean_4x4)*w_2_19 +
    mean_4';zeros(1,7)']';
    err_var(20,3)=D_2_19*Rx*D_2_19'-D_2_19*Rx*T_2_19'*inv(T_2_19*Rx*T
    _2_19')*T_2_19*Rx* D_2_19';

35  sel_mc19_pt3(1,:) = [ 0 0 0 0 0 1 0 0 0 0 0 0 0 0 0 ];
    sel_mc19_pt3(2,:) = [ 0 0 0 0 0 0 1 0 0 0 0 0 0 0 0 ];
    sel_mc19_pt3(3,:) = [ 0 0 0 0 0 0 0 1 0 0 0 0 0 0 0 ];
    sel_mc19_pt3(4,:) = [ 0 0 0 0 0 0 0 0 1 0 0 0 0 0 0 ];

40  T_3_19 = sel_mc19_pt3 * ma_ds48;
    D_3_19 = pull_3 * transform_filt8 * mc_19;
    w_3_19 = inv( T_3_19 * Rx * T_3_19' ) * T_3_19 * Rx * D_3_19';
    mcp_19(4,:) = [ zeros(1,5)';(eye(4) - mean_4x4)*w_3_19 +
    mean_4';zeros(1,7)']';
45  err_var(20,4)=D_3_19*Rx*D_3_19'-D_3_19*Rx*T_3_19'*inv(T_3_19*Rx*T
    _3_19')*T_3_19*Rx* D_3_19';

sel_mc19_pt4(1,:) = [ 0 0 0 0 0 1 0 0 0 0 0 0 0 0 0 ];
    sel_mc19_pt4(2,:) = [ 0 0 0 0 0 0 1 0 0 0 0 0 0 0 0 ];
```

```
sel_mc19_pt4(3,:) = [ 0 0 0 0 0 0 0 0 1 0 0 0 0 0 0 0 ];
sel_mc19_pt4(4,:) = [ 0 0 0 0 0 0 0 0 0 1 0 0 0 0 0 0 ];

T_4_19 = sel_mc19_pt4 * ma_ds48;
D_4_19 = pull_4 * transform_filt8 * mc_19;
w_4_19 = inv( T_4_19 * Rx * T_4_19' ) * T_4_19 * Rx * D_4_19';
mcp_19(5,:) = [ zeros(1,6)';(eye(4) - mean_4x4)*w_4_19 +
mean_4';zeros(1,6)']';
err_var(20,5)=D_4_19*Rx*D_4_19'-D_4_19*Rx*T_4_19'*inv(T_4_19*Rx*T
_4_19')*T_4_19*Rx* D_4_19';

sel_mc19_pt5(1,:) = [ 0 0 0 0 0 0 1 0 0 0 0 0 0 0 0 0 ];
sel_mc19_pt5(2,:) = [ 0 0 0 0 0 0 0 1 0 0 0 0 0 0 0 0 ];
sel_mc19_pt5(3,:) = [ 0 0 0 0 0 0 0 0 1 0 0 0 0 0 0 0 ];
sel_mc19_pt5(4,:) = [ 0 0 0 0 0 0 0 0 0 1 0 0 0 0 0 0 ];

T_5_19 = sel_mc19_pt5 * ma_ds48;
D_5_19 = pull_5 * transform_filt8 * mc_19;
w_5_19 = inv( T_5_19 * Rx * T_5_19' ) * T_5_19 * Rx * D_5_19';
mcp_19(6,:) = [ zeros(1,6)';(eye(4) - mean_4x4)*w_5_19 +
mean_4';zeros(1,6)']';
err_var(20,6)=D_5_19*Rx*D_5_19'-D_5_19*Rx*T_5_19'*inv(T_5_19*Rx*T
_5_19')*T_5_19*Rx* D_5_19';

sel_mc19_pt6(1,:) = [ 0 0 0 0 0 0 1 0 0 0 0 0 0 0 0 0 ];
sel_mc19_pt6(2,:) = [ 0 0 0 0 0 0 0 1 0 0 0 0 0 0 0 0 ];
sel_mc19_pt6(3,:) = [ 0 0 0 0 0 0 0 0 1 0 0 0 0 0 0 0 ];
sel_mc19_pt6(4,:) = [ 0 0 0 0 0 0 0 0 0 1 0 0 0 0 0 0 ];

T_6_19 = sel_mc19_pt6 * ma_ds48;
D_6_19 = pull_6 * transform_filt8 * mc_19;
w_6_19 = inv( T_6_19 * Rx * T_6_19' ) * T_6_19 * Rx * D_6_19';
mcp_19(7,:) = [ zeros(1,6)';(eye(4) - mean_4x4)*w_6_19 +
mean_4';zeros(1,6)']';
err_var(20,7)=D_6_19*Rx*D_6_19'-D_6_19*Rx*T_6_19'*inv(T_6_19*Rx*T
_6_19')*T_6_19*Rx* D_6_19';

sel_mc19_pt7(1,:) = [ 0 0 0 0 0 0 0 1 0 0 0 0 0 0 0 0 ];
sel_mc19_pt7(2,:) = [ 0 0 0 0 0 0 0 0 1 0 0 0 0 0 0 0 ];
sel_mc19_pt7(3,:) = [ 0 0 0 0 0 0 0 0 0 1 0 0 0 0 0 0 ];
sel_mc19_pt7(4,:) = [ 0 0 0 0 0 0 0 0 0 0 1 0 0 0 0 0 ];

T_7_19 = sel_mc19_pt7 * ma_ds48;
D_7_19 = pull_7 * transform_filt8 * mc_19;
w_7_19 = inv( T_7_19 * Rx * T_7_19' ) * T_7_19 * Rx * D_7_19';
mcp_19(8,:) = [ zeros(1,7)';(eye(4) - mean_4x4)*w_7_19 +
mean_4';zeros(1,5)']';
err_var(20,8)=D_7_19*Rx*D_7_19'-D_7_19*Rx*T_7_19'*inv(T_7_19*Rx*T
_7_19')*T_7_19*Rx* D_7_19';
```

-77-

```
mamcp_19_chk_0 = ds_ma0*mcp_19;
save mamcp_19_chk_0 mamcp_19_chk_0 -ascii -double -tabs
mamcp_19_chk_1 = ds_ma1*mcp_19;
save mamcp_19_chk_1 mamcp_19_chk_1 -ascii -double -tabs
mamcp_19_chk_2 = ds_ma2*mcp_19;
save mamcp_19_chk_2 mamcp_19_chk_2 -ascii -double -tabs mc_20(1,:) = [ 0 0 0 0 0 0 0 0 0 0 0 0 0 0 0 0 0 0 0 1 0 0 0
               0 0 0 0 0 0 0 0 0 0 0 0 0 0 0 0 0 0 0 0 0 ];
mc_20(2,:) = [ 0 0 0 0 0 0 0 0 0 0 0 0 0 0 0 0 0 0 0 0 1 0 0
               0 0 0 0 0 0 0 0 0 0 0 0 0 0 0 0 0 0 0 0 0 ];
mc_20(3,:) = [ 0 0 0 0 0 0 0 0 0 0 0 0 0 0 0 0 0 0 0 0 0 1 0
               0 0 0 0 0 0 0 0 0 0 0 0 0 0 0 0 0 0 0 0 0 ];
mc_20(4,:) = [ 0 0 0 0 0 0 0 0 0 0 0 0 0 0 0 0 0 0 0 0 0 0 1 0
               0 0 0 0 0 0 0 0 0 0 0 0 0 0 0 0 0 0 0 0 0 ];
mc_20(5,:) = [ 0 0 0 0 0 0 0 0 0 0 0 0 0 0 0 0 0 0 0 0 0 0 0 1
               0 0 0 0 0 0 0 0 0 0 0 0 0 0 0 0 0 0 0 0 0 ];
mc_20(6,:) = [ 0 0 0 0 0 0 0 0 0 0 0 0 0 0 0 0 0 0 0 0 0 0 0 0
               1 0 0 0 0 0 0 0 0 0 0 0 0 0 0 0 0 0 0 0 0 ];
mc_20(7,:) = [ 0 0 0 0 0 0 0 0 0 0 0 0 0 0 0 0 0 0 0 0 0 0 0 0
               0 1 0 0 0 0 0 0 0 0 0 0 0 0 0 0 0 0 0 0 0 ];
mc_20(8,:) = [ 0 0 0 0 0 0 0 0 0 0 0 0 0 0 0 0 0 0 0 0 0 0 0 0
               0 0 1 0 0 0 0 0 0 0 0 0 0 0 0 0 0 0 0 0 0 ];

sel_mc20_pt0(1,:) = [ 0 0 0 0 0 1 0 0 0 0 0 0 0 0 0 ];
sel_mc20_pt0(2,:) = [ 0 0 0 0 0 0 1 0 0 0 0 0 0 0 0 ];
sel_mc20_pt0(3,:) = [ 0 0 0 0 0 0 0 1 0 0 0 0 0 0 0 ];
sel_mc20_pt0(4,:) = [ 0 0 0 0 0 0 0 0 1 0 0 0 0 0 0 ];

T_0_20 = sel_mc20_pt0 * ma_ds48;
D_0_20 = pull_0 * transform_filt8 * mc_20;
w_0_20 = inv( T_0_20 * Rx * T_0_20' ) * T_0_20 * Rx * D_0_20';
mcp_20(1,:) = [ zeros(1,5)';(eye(4) - mean_4x4)*w_0_20 +
mean_4';zeros(1,7)']';
err_var(21,1)=D_0_20*Rx*D_0_20'-D_0_20*Rx*T_0_20'*inv(T_0_20*Rx*T
_0_20')*T_0_20*Rx* D_0_20';

sel_mc20_pt1(1,:) = [ 0 0 0 0 0 1 0 0 0 0 0 0 0 0 0 ];
sel_mc20_pt1(2,:) = [ 0 0 0 0 0 0 1 0 0 0 0 0 0 0 0 ];
sel_mc20_pt1(3,:) = [ 0 0 0 0 0 0 0 1 0 0 0 0 0 0 0 ];
sel_mc20_pt1(4,:) = [ 0 0 0 0 0 0 0 0 1 0 0 0 0 0 0 ];

T_1_20 = sel_mc20_pt1 * ma_ds48;
D_1_20 = pull_1 * transform_filt8 * mc_20;
w_1_20 = inv( T_1_20 * Rx * T_1_20' ) * T_1_20 * Rx * D_1_20';
mcp_20(2,:) = [ zeros(1,5)';(eye(4) - mean_4x4)*w_1_20 +
mean_4';zeros(1,7)']';
err_var(21,2)=D_1_20*Rx*D_1_20'-D_1_20*Rx*T_1_20'*inv(T_1_20*Rx*T
_1_20')*T_1_20*Rx* D_1_20';
```

-78-

```
sel_mc20_pt2(1,:) = [ 0 0 0 0 0 1 0 0 0 0 0 0 0 0 0 ];
sel_mc20_pt2(2,:) = [ 0 0 0 0 0 0 1 0 0 0 0 0 0 0 0 ];
sel_mc20_pt2(3,:) = [ 0 0 0 0 0 0 0 1 0 0 0 0 0 0 0 ];
sel_mc20_pt2(4,:) = [ 0 0 0 0 0 0 0 0 1 0 0 0 0 0 0 ];

T_2_20 = sel_mc20_pt2 * ma_ds48;
D_2_20 = pull_2 * transform_filt8 * mc_20;
w_2_20 = inv( T_2_20 * Rx * T_2_20' ) * T_2_20 * Rx * D_2_20';
mcp_20(3,:) = [ zeros(1,5)';(eye(4) - mean_4x4)*w_2_20 +
mean_4';zeros(1,7)']';
err_var(21,3)=D_2_20*Rx*D_2_20'-D_2_20*Rx*T_2_20'*inv(T_2_20*Rx*T
_2_20')*T_2_20*Rx* D_2_20';

sel_mc20_pt3(1,:) = [ 0 0 0 0 0 0 1 0 0 0 0 0 0 0 0 ];
sel_mc20_pt3(2,:) = [ 0 0 0 0 0 0 0 1 0 0 0 0 0 0 0 ];
sel_mc20_pt3(3,:) = [ 0 0 0 0 0 0 0 0 1 0 0 0 0 0 0 ];
sel_mc20_pt3(4,:) = [ 0 0 0 0 0 0 0 0 0 1 0 0 0 0 0 ];

T_3_20 = sel_mc20_pt3 * ma_ds48;
D_3_20 = pull_3 * transform_filt8 * mc_20;
w_3_20 = inv( T_3_20 * Rx * T_3_20' ) * T_3_20 * Rx * D_3_20';
mcp_20(4,:) = [ zeros(1,6)';(eye(4) - mean_4x4)*w_3_20 +
mean_4';zeros(1,6)']';
err_var(21,4)=D_3_20*Rx*D_3_20'-D_3_20*Rx*T_3_20'*inv(T_3_20*Rx*T
_3_20')*T_3_20*Rx* D_3_20';

sel_mc20_pt4(1,:) = [ 0 0 0 0 0 0 1 0 0 0 0 0 0 0 0 ];
sel_mc20_pt4(2,:) = [ 0 0 0 0 0 0 0 1 0 0 0 0 0 0 0 ];
sel_mc20_pt4(3,:) = [ 0 0 0 0 0 0 0 0 1 0 0 0 0 0 0 ];
sel_mc20_pt4(4,:) = [ 0 0 0 0 0 0 0 0 0 1 0 0 0 0 0 ];

T_4_20 = sel_mc20_pt4 * ma_ds48;
D_4_20 = pull_4 * transform_filt8 * mc_20;
w_4_20 = inv( T_4_20 * Rx * T_4_20' ) * T_4_20 * Rx * D_4_20';
mcp_20(5,:) = [ zeros(1,6)';(eye(4) - mean_4x4)*w_4_20 +
mean_4';zeros(1,6)']';
err_var(21,5)=D_4_20*Rx*D_4_20'-D_4_20*Rx*T_4_20'*inv(T_4_20*Rx*T
_4_20')*T_4_20*Rx* D_4_20';

sel_mc20_pt5(1,:) = [ 0 0 0 0 0 0 1 0 0 0 0 0 0 0 0 ];
sel_mc20_pt5(2,:) = [ 0 0 0 0 0 0 0 1 0 0 0 0 0 0 0 ];
sel_mc20_pt5(3,:) = [ 0 0 0 0 0 0 0 0 1 0 0 0 0 0 0 ];
sel_mc20_pt5(4,:) = [ 0 0 0 0 0 0 0 0 0 1 0 0 0 0 0 ];

T_5_20 = sel_mc20_pt5 * ma_ds48;
D_5_20 = pull_5 * transform_filt8 * mc_20;
w_5_20 = inv( T_5_20 * Rx * T_5_20' ) * T_5_20 * Rx * D_5_20';
mcp_20(6,:) = [ zeros(1,6)';(eye(4) - mean_4x4)*w_5_20 +
mean_4';zeros(1,6)']';
```

-79-

```
err_var(21,6)=D_5_20*Rx*D_5_20'-D_5_20*Rx*T_5_20'*inv(T_5_20*Rx*T
_5_20')*T_5_20*Rx* D_5_20';

sel_mc20_pt6(1,:) = [ 0 0 0 0 0 0 0 1 0 0 0 0 0 0 0 ];
sel_mc20_pt6(2,:) = [ 0 0 0 0 0 0 0 0 1 0 0 0 0 0 0 ];
sel_mc20_pt6(3,:) = [ 0 0 0 0 0 0 0 0 0 1 0 0 0 0 0 ];
sel_mc20_pt6(4,:) = [ 0 0 0 0 0 0 0 0 0 0 1 0 0 0 0 ];

T_6_20 = sel_mc20_pt6 * ma_ds48;
D_6_20 = pull_6 * transform_filt8 * mc_20;
w_6_20 = inv( T_6_20 * Rx * T_6_20' ) * T_6_20 * Rx * D_6_20';
mcp_20(7,:) = [ zeros(1,7)';(eye(4) - mean_4x4)*w_6_20 +
mean_4';zeros(1,5)']';
err_var(21,7)=D_6_20*Rx*D_6_20'-D_6_20*Rx*T_6_20'*inv(T_6_20*Rx*T
_6_20')*T_6_20*Rx* D_6_20';

sel_mc20_pt7(1,:) = [ 0 0 0 0 0 0 0 1 0 0 0 0 0 0 0 ];
sel_mc20_pt7(2,:) = [ 0 0 0 0 0 0 0 0 1 0 0 0 0 0 0 ];
sel_mc20_pt7(3,:) = [ 0 0 0 0 0 0 0 0 0 1 0 0 0 0 0 ];
sel_mc20_pt7(4,:) = [ 0 0 0 0 0 0 0 0 0 0 1 0 0 0 0 ];

T_7_20 = sel_mc20_pt7 * ma_ds48;
D_7_20 = pull_7 * transform_filt8 * mc_20;
w_7_20 = inv( T_7_20 * Rx * T_7_20' ) * T_7_20 * Rx * D_7_20';
mcp_20(8,:) = [ zeros(1,7)';(eye(4) - mean_4x4)*w_7_20 +
mean_4';zeros(1,5)']';
err_var(21,8)=D_7_20*Rx*D_7_20'-D_7_20*Rx*T_7_20'*inv(T_7_20*Rx*T
_7_20')*T_7_20*Rx* D_7_20';

mamcp_20_chk_0 = ds_ma0*mcp_20;
save mamcp_20_chk_0 mamcp_20_chk_0 -ascii -double -tabs
mamcp_20_chk_1 = ds_ma1*mcp_20;
save mamcp_20_chk_1 mamcp_20_chk_1 -ascii -double -tabs
mamcp_20_chk_2 = ds_ma2*mcp_20;
save mamcp_20_chk_2 mamcp_20_chk_2 -ascii -double -tabs mc_21(1,:) = [ 0 0 0 0 0 0 0 0 0 0 0 0 0 0 0 0 0 0 0 0 1 0 0
 0 0 0 0 0 0 0 0 0 0 0 0 0 0 0 0 0 ];
mc_21(2,:) = [ 0 0 0 0 0 0 0 0 0 0 0 0 0 0 0 0 0 0 0 0 0 1 0
 0 0 0 0 0 0 0 0 0 0 0 0 0 0 0 0 0 ];
mc_21(3,:) = [ 0 0 0 0 0 0 0 0 0 0 0 0 0 0 0 0 0 0 0 0 0 0 1 0
 0 0 0 0 0 0 0 0 0 0 0 0 0 0 0 0 ];
mc_21(4,:) = [ 0 0 0 0 0 0 0 0 0 0 0 0 0 0 0 0 0 0 0 0 0 0 0 1
 0 0 0 0 0 0 0 0 0 0 0 0 0 0 0 0 ];
mc_21(5,:) = [ 0 0 0 0 0 0 0 0 0 0 0 0 0 0 0 0 0 0 0 0 0 0 0 0
 1 0 0 0 0 0 0 0 0 0 0 0 0 0 0 0 ];
mc_21(6,:) = [ 0 0 0 0 0 0 0 0 0 0 0 0 0 0 0 0 0 0 0 0 0 0 0 0
 0 1 0 0 0 0 0 0 0 0 0 0 0 0 0 0 ];
mc_21(7,:) = [ 0 0 0 0 0 0 0 0 0 0 0 0 0 0 0 0 0 0 0 0 0 0 0 0
 0 0 1 0 0 0 0 0 0 0 0 0 0 0 0 0 ];
```

```
       mc_21(8,:) = [ 0 0 0 0 0 0 0 0 0 0 0 0 0 0 0 0 0 0 0 0 0 0 0
       0 0 0 1 0 0 0 0 0 0 0 0 0 0 0 0 0 0 0 0 0 0 0 0 ];

sel_mc21_pt0(1,:) = [ 0 0 0 0 0 1 0 0 0 0 0 0 0 0 0 0 ];
 5     sel_mc21_pt0(2,:) = [ 0 0 0 0 0 0 1 0 0 0 0 0 0 0 0 0 ];
       sel_mc21_pt0(3,:) = [ 0 0 0 0 0 0 0 1 0 0 0 0 0 0 0 0 ];
       sel_mc21_pt0(4,:) = [ 0 0 0 0 0 0 0 0 1 0 0 0 0 0 0 0 ];

T_0_21 = sel_mc21_pt0 * ma_ds48;
10     D_0_21 = pull_0 * transform_filt8 * mc_21;
       w_0_21 = inv( T_0_21 * Rx * T_0_21' ) * T_0_21 * Rx * D_0_21';
       mcp_21(1,:) = [ zeros(1,5)';(eye(4) - mean_4x4)*w_0_21 +
       mean_4';zeros(1,7)']';
       err_var(22,1)=D_0_21*Rx*D_0_21'-D_0_21*Rx*T_0_21'*inv(T_0_21*Rx*T
15     _0_21')*T_0_21*Rx* D_0_21';

sel_mc21_pt1(1,:) = [ 0 0 0 0 0 1 0 0 0 0 0 0 0 0 0 0 ];
       sel_mc21_pt1(2,:) = [ 0 0 0 0 0 0 1 0 0 0 0 0 0 0 0 0 ];
       sel_mc21_pt1(3,:) = [ 0 0 0 0 0 0 0 1 0 0 0 0 0 0 0 0 ];
20     sel_mc21_pt1(4,:) = [ 0 0 0 0 0 0 0 0 1 0 0 0 0 0 0 0 ];

T_1_21 = sel_mc21_pt1 * ma_ds48;
       D_1_21 = pull_1 * transform_filt8 * mc_21;
       w_1_21 = inv( T_1_21 * Rx * T_1_21' ) * T_1_21 * Rx * D_1_21';
25     mcp_21(2,:) = [ zeros(1,5)';(eye(4) - mean_4x4)*w_1_21 +
       mean_4';zeros(1,7)']';
       err_var(22,2)=D_1_21*Rx*D_1_21'-D_1_21*Rx*T_1_21'*inv(T_1_21*Rx*T
       _1_21')*T_1_21*Rx* D_1_21';

30     sel_mc21_pt2(1,:) = [ 0 0 0 0 0 0 1 0 0 0 0 0 0 0 0 0 ];
       sel_mc21_pt2(2,:) = [ 0 0 0 0 0 0 0 1 0 0 0 0 0 0 0 0 ];
       sel_mc21_pt2(3,:) = [ 0 0 0 0 0 0 0 0 1 0 0 0 0 0 0 0 ];
       sel_mc21_pt2(4,:) = [ 0 0 0 0 0 0 0 0 0 1 0 0 0 0 0 0 ];

35     T_2_21 = sel_mc21_pt2 * ma_ds48;
       D_2_21 = pull_2 * transform_filt8 * mc_21;
       w_2_21 = inv( T_2_21 * Rx * T_2_21' ) * T_2_21 * Rx * D_2_21';
       mcp_21(3,:) = [ zeros(1,6)';(eye(4) - mean_4x4)*w_2_21 +
       mean_4';zeros(1,6)']';
40     err_var(22,3)=D_2_21*Rx*D_2_21'-D_2_21*Rx*T_2_21'*inv(T_2_21*Rx*T
       _2_21')*T_2_21*Rx* D_2_21';

sel_mc21_pt3(1,:) = [ 0 0 0 0 0 0 1 0 0 0 0 0 0 0 0 0 ];
       sel_mc21_pt3(2,:) = [ 0 0 0 0 0 0 0 1 0 0 0 0 0 0 0 0 ];
45     sel_mc21_pt3(3,:) = [ 0 0 0 0 0 0 0 0 1 0 0 0 0 0 0 0 ];
       sel_mc21_pt3(4,:) = [ 0 0 0 0 0 0 0 0 0 1 0 0 0 0 0 0 ];

T_3_21 = sel_mc21_pt3 * ma_ds48;
       D_3_21 = pull_3 * transform_filt8 * mc_21;
50     w_3_21 = inv( T_3_21 * Rx * T_3_21' ) * T_3_21 * Rx * D_3_21';
```

-81-

```
mcp_21(4,:) = [ zeros(1,6)';(eye(4) - mean_4x4)*w_3_21 +
mean_4';zeros(1,6)']';
err_var(22,4)=D_3_21*Rx*D_3_21'-D_3_21*Rx*T_3_21'*inv(T_3_21*Rx*T
_3_21')*T_3_21*Rx* D_3_21';

sel_mc21_pt4(1,:) = [ 0 0 0 0 0 0 1 0 0 0 0 0 0 0 0 ];
sel_mc21_pt4(2,:) = [ 0 0 0 0 0 0 0 1 0 0 0 0 0 0 0 ];
sel_mc21_pt4(3,:) = [ 0 0 0 0 0 0 0 0 1 0 0 0 0 0 0 ];
sel_mc21_pt4(4,:) = [ 0 0 0 0 0 0 0 0 0 1 0 0 0 0 0 ];

T_4_21 = sel_mc21_pt4 * ma_ds48;
D_4_21 = pull_4 * transform_filt8 * mc_21;
w_4_21 = inv( T_4_21 * Rx * T_4_21' ) * T_4_21 * Rx * D_4_21';
mcp_21(5,:) = [ zeros(1,6)';(eye(4) - mean_4x4)*w_4_21 +
mean_4';zeros(1,6)']';
err_var(22,5)=D_4_21*Rx*D_4_21'-D_4_21*Rx*T_4_21'*inv(T_4_21*Rx*T
_4_21')*T_4_21*Rx* D_4_21';

sel_mc21_pt5(1,:) = [ 0 0 0 0 0 0 0 1 0 0 0 0 0 0 0 ];
sel_mc21_pt5(2,:) = [ 0 0 0 0 0 0 0 0 1 0 0 0 0 0 0 ];
sel_mc21_pt5(3,:) = [ 0 0 0 0 0 0 0 0 0 1 0 0 0 0 0 ];
sel_mc21_pt5(4,:) = [ 0 0 0 0 0 0 0 0 0 0 1 0 0 0 0 ];

T_5_21 = sel_mc21_pt5 * ma_ds48;
D_5_21 = pull_5 * transform_filt8 * mc_21;
w_5_21 = inv( T_5_21 * Rx * T_5_21' ) * T_5_21 * Rx * D_5_21';
mcp_21(6,:) = [ zeros(1,7)';(eye(4) - mean_4x4)*w_5_21 +
mean_4';zeros(1,5)']';
err_var(22,6)=D_5_21*Rx*D_5_21'-D_5_21*Rx*T_5_21'*inv(T_5_21*Rx*T
_5_21')*T_5_21*Rx* D_5_21';

sel_mc21_pt6(1,:) = [ 0 0 0 0 0 0 0 1 0 0 0 0 0 0 0 ];
sel_mc21_pt6(2,:) = [ 0 0 0 0 0 0 0 0 1 0 0 0 0 0 0 ];
sel_mc21_pt6(3,:) = [ 0 0 0 0 0 0 0 0 0 1 0 0 0 0 0 ];
sel_mc21_pt6(4,:) = [ 0 0 0 0 0 0 0 0 0 0 1 0 0 0 0 ];

T_6_21 = sel_mc21_pt6 * ma_ds48;
D_6_21 = pull_6 * transform_filt8 * mc_21;
w_6_21 = inv( T_6_21 * Rx * T_6_21' ) * T_6_21 * Rx * D_6_21';
mcp_21(7,:) = [ zeros(1,7)';(eye(4) - mean_4x4)*w_6_21 +
mean_4';zeros(1,5)']';
err_var(22,7)=D_6_21*Rx*D_6_21'-D_6_21*Rx*T_6_21'*inv(T_6_21*Rx*T
_6_21')*T_6_21*Rx* D_6_21';

sel_mc21_pt7(1,:) = [ 0 0 0 0 0 0 1 0 0 0 0 0 0 0 0 ];
sel_mc21_pt7(2,:) = [ 0 0 0 0 0 0 0 1 0 0 0 0 0 0 0 ];
sel_mc21_pt7(3,:) = [ 0 0 0 0 0 0 0 0 1 0 0 0 0 0 0 ];
sel_mc21_pt7(4,:) = [ 0 0 0 0 0 0 0 0 0 1 0 0 0 0 0 ];
```

```
         T_7_21 = sel_mc21_pt7 * ma_ds48;
         D_7_21 = pull_7 * transform_filt8 * mc_21;
         w_7_21 = inv( T_7_21 * Rx * T_7_21' ) * T_7_21 * Rx * D_7_21';
         mcp_21(8,:) = [ zeros(1,7)';(eye(4) - mean_4x4)*w_7_21 +
 5       mean_4';zeros(1,5)']';
         err_var(22,8)=D_7_21*Rx*D_7_21'-D_7_21*Rx*T_7_21'*inv(T_7_21*Rx*T
         _7_21')*T_7_21*Rx* D_7_21';

mamcp_21_chk_0 = ds_ma0*mcp_21;
10       save mamcp_21_chk_0 mamcp_21_chk_0 -ascii -double -tabs
         mamcp_21_chk_1 = ds_ma1*mcp_21;
         save mamcp_21_chk_1 mamcp_21_chk_1 -ascii -double -tabs
         mamcp_21_chk_2 = ds_ma2*mcp_21;
         save mamcp_21_chk_2 mamcp_21_chk_2 -ascii -double -tabs
15
         mc_22(1,:) = [ 0 0 0 0 0 0 0 0 0 0 0 0 0 0 0 0 0 0 0 0 1 0 0
         0 0 0 0 0 0 0 0 0 0 0 0 0 0 0 0 0 0 0 0 0 0 0 0 ];
         mc_22(2,:) = [ 0 0 0 0 0 0 0 0 0 0 0 0 0 0 0 0 0 0 0 0 0 1 0
         0 0 0 0 0 0 0 0 0 0 0 0 0 0 0 0 0 0 0 0 0 0 0 0 ];
20       mc_22(3,:) = [ 0 0 0 0 0 0 0 0 0 0 0 0 0 0 0 0 0 0 0 0 0 0 1
         0 0 0 0 0 0 0 0 0 0 0 0 0 0 0 0 0 0 0 0 0 0 0 0 ];
         mc_22(4,:) = [ 0 0 0 0 0 0 0 0 0 0 0 0 0 0 0 0 0 0 0 0 0 0 0
         1 0 0 0 0 0 0 0 0 0 0 0 0 0 0 0 0 0 0 0 0 0 0 0 ];
         mc_22(5,:) = [ 0 0 0 0 0 0 0 0 0 0 0 0 0 0 0 0 0 0 0 0 0 0 0
25       0 1 0 0 0 0 0 0 0 0 0 0 0 0 0 0 0 0 0 0 0 0 0 0 ];
         mc_22(6,:) = [ 0 0 0 0 0 0 0 0 0 0 0 0 0 0 0 0 0 0 0 0 0 0 0
         0 0 1 0 0 0 0 0 0 0 0 0 0 0 0 0 0 0 0 0 0 0 0 0 ];
         mc_22(7,:) = [ 0 0 0 0 0 0 0 0 0 0 0 0 0 0 0 0 0 0 0 0 0 0 0
         0 0 0 1 0 0 0 0 0 0 0 0 0 0 0 0 0 0 0 0 0 0 0 0 ];
30       mc_22(8,:) = [ 0 0 0 0 0 0 0 0 0 0 0 0 0 0 0 0 0 0 0 0 0 0 0
         0 0 0 0 1 0 0 0 0 0 0 0 0 0 0 0 0 0 0 0 0 0 0 0 ];

sel_mc22_pt0(1,:) = [ 0 0 0 0 0 1 0 0 0 0 0 0 0 0 0 0 ];
         sel_mc22_pt0(2,:) = [ 0 0 0 0 0 0 1 0 0 0 0 0 0 0 0 0 ];
35       sel_mc22_pt0(3,:) = [ 0 0 0 0 0 0 0 1 0 0 0 0 0 0 0 0 ];
         sel_mc22_pt0(4,:) = [ 0 0 0 0 0 0 0 0 1 0 0 0 0 0 0 0 ];

T_0_22 = sel_mc22_pt0 * ma_ds48;
         D_0_22 = pull_0 * transform_filt8 * mc_22;
40       w_0_22 = inv( T_0_22 * Rx * T_0_22' ) * T_0_22 * Rx * D_0_22';
         mcp_22(1,:) = [ zeros(1,5)';(eye(4) - mean_4x4)*w_0_22 +
         mean_4';zeros(1,7)']';
         err_var(23,1)=D_0_22*Rx*D_0_22'-D_0_22*Rx*T_0_22'*inv(T_0_22*Rx*T
         _0_22')*T_0_22*Rx* D_0_22';
45
         sel_mc22_pt1(1,:) = [ 0 0 0 0 0 0 1 0 0 0 0 0 0 0 0 0 ];
         sel_mc22_pt1(2,:) = [ 0 0 0 0 0 0 0 1 0 0 0 0 0 0 0 0 ];
         sel_mc22_pt1(3,:) = [ 0 0 0 0 0 0 0 0 1 0 0 0 0 0 0 0 ];
         sel_mc22_pt1(4,:) = [ 0 0 0 0 0 0 0 0 0 1 0 0 0 0 0 0 ];
```

```
     T_1_22 = sel_mc22_pt1 * ma_ds48;
     D_1_22 = pull_1 * transform_filt8 * mc_22;
     w_1_22 = inv( T_1_22 * Rx * T_1_22' ) * T_1_22 * Rx * D_1_22';
     mcp_22(2,:) = [ zeros(1,6)';(eye(4) - mean_4x4)*w_1_22 +
5    mean_4';zeros(1,6)']';
     err_var(23,2)=D_1_22*Rx*D_1_22'-D_1_22*Rx*T_1_22'*inv(T_1_22*Rx*T
     _1_22')*T_1_22*Rx* D_1_22';

sel_mc22_pt2(1,:) = [ 0 0 0 0 0 0 1 0 0 0 0 0 0 0 ];
10   sel_mc22_pt2(2,:) = [ 0 0 0 0 0 0 0 1 0 0 0 0 0 0 ];
     sel_mc22_pt2(3,:) = [ 0 0 0 0 0 0 0 0 1 0 0 0 0 0 ];
     sel_mc22_pt2(4,:) = [ 0 0 0 0 0 0 0 0 0 1 0 0 0 0 ];

T_2_22 = sel_mc22_pt2 * ma_ds48;
15   D_2_22 = pull_2 * transform_filt8 * mc_22;
     w_2_22 = inv( T_2_22 * Rx * T_2_22' ) * T_2_22 * Rx * D_2_22';
     mcp_22(3,:) = [ zeros(1,6)';(eye(4) - mean_4x4)*w_2_22 +
     mean_4';zeros(1,6)']';
     err_var(23,3)=D_2_22*Rx*D_2_22'-D_2_22*Rx*T_2_22'*inv(T_2_22*Rx*T
20   _2_22')*T_2_22*Rx* D_2_22';

sel_mc22_pt3(1,:) = [ 0 0 0 0 0 0 1 0 0 0 0 0 0 0 ];
     sel_mc22_pt3(2,:) = [ 0 0 0 0 0 0 0 1 0 0 0 0 0 0 ];
     sel_mc22_pt3(3,:) = [ 0 0 0 0 0 0 0 0 1 0 0 0 0 0 ];
25   sel_mc22_pt3(4,:) = [ 0 0 0 0 0 0 0 0 0 1 0 0 0 0 ];

T_3_22 = sel_mc22_pt3 * ma_ds48;
     D_3_22 = pull_3 * transform_filt8 * mc_22;
     w_3_22 = inv( T_3_22 * Rx * T_3_22' ) * T_3_22 * Rx * D_3_22';
30   mcp_22(4,:) = [ zeros(1,6)';(eye(4) - mean_4x4)*w_3_22 +
     mean_4';zeros(1,6)']';
     err_var(23,4)=D_3_22*Rx*D_3_22'-D_3_22*Rx*T_3_22'*inv(T_3_22*Rx*T
     _3_22')*T_3_22*Rx* D_3_22';

35   sel_mc22_pt4(1,:) = [ 0 0 0 0 0 0 1 0 0 0 0 0 0 0 ];
     sel_mc22_pt4(2,:) = [ 0 0 0 0 0 0 0 1 0 0 0 0 0 0 ];
     sel_mc22_pt4(3,:) = [ 0 0 0 0 0 0 0 0 1 0 0 0 0 0 ];
     sel_mc22_pt4(4,:) = [ 0 0 0 0 0 0 0 0 0 1 0 0 0 0 ];

40   T_4_22 = sel_mc22_pt4 * ma_ds48;
     D_4_22 = pull_4 * transform_filt8 * mc_22;
     w_4_22 = inv( T_4_22 * Rx * T_4_22' ) * T_4_22 * Rx * D_4_22';
     mcp_22(5,:) = [ zeros(1,7)';(eye(4) - mean_4x4)*w_4_22 +
     mean_4';zeros(1,5)']';
45   err_var(23,5)=D_4_22*Rx*D_4_22'-D_4_22*Rx*T_4_22'*inv(T_4_22*Rx*T
     _4_22')*T_4_22*Rx* D_4_22';

sel_mc22_pt5(1,:) = [ 0 0 0 0 0 0 1 0 0 0 0 0 0 0 ];
     sel_mc22_pt5(2,:) = [ 0 0 0 0 0 0 0 1 0 0 0 0 0 0 ];
```

```
sel_mc22_pt5(3,:) = [ 0 0 0 0 0 0 0 0 1 0 0 0 0 0 ];
sel_mc22_pt5(4,:) = [ 0 0 0 0 0 0 0 0 0 1 0 0 0 0 ];

T_5_22 = sel_mc22_pt5 * ma_ds48;
D_5_22 = pull_5 * transform_filt8 * mc_22;
w_5_22 = inv( T_5_22 * Rx * T_5_22' ) * T_5_22 * Rx * D_5_22';
mcp_22(6,:) = [ zeros(1,7)';(eye(4) - mean_4x4)*w_5_22 +
mean_4';zeros(1,5)']';
err_var(23,6)=D_5_22*Rx*D_5_22'-D_5_22*Rx*T_5_22'*inv(T_5_22*Rx*T
_5_22')*T_5_22*Rx* D_5_22';

sel_mc22_pt6(1,:) = [ 0 0 0 0 0 0 0 1 0 0 0 0 0 0 ];
sel_mc22_pt6(2,:) = [ 0 0 0 0 0 0 0 0 1 0 0 0 0 0 ];
sel_mc22_pt6(3,:) = [ 0 0 0 0 0 0 0 0 0 1 0 0 0 0 ];
sel_mc22_pt6(4,:) = [ 0 0 0 0 0 0 0 0 0 0 1 0 0 0 ];

T_6_22 = sel_mc22_pt6 * ma_ds48;
D_6_22 = pull_6 * transform_filt8 * mc_22;
w_6_22 = inv( T_6_22 * Rx * T_6_22' ) * T_6_22 * Rx * D_6_22';
mcp_22(7,:) = [ zeros(1,7)';(eye(4) - mean_4x4)*w_6_22 +
mean_4';zeros(1,5)']';
err_var(23,7)=D_6_22*Rx*D_6_22'-D_6_22*Rx*T_6_22'*inv(T_6_22*Rx*T
_6_22')*T_6_22*Rx* D_6_22';

sel_mc22_pt7(1,:) = [ 0 0 0 0 0 0 0 0 1 0 0 0 0 0 ];
sel_mc22_pt7(2,:) = [ 0 0 0 0 0 0 0 0 0 1 0 0 0 0 ];
sel_mc22_pt7(3,:) = [ 0 0 0 0 0 0 0 0 0 0 1 0 0 0 0 ];
sel_mc22_pt7(4,:) = [ 0 0 0 0 0 0 0 0 0 0 0 1 0 0 0 ];

T_7_22 = sel_mc22_pt7 * ma_ds48;
D_7_22 = pull_7 * transform_filt8 * mc_22;
w_7_22 = inv( T_7_22 * Rx * T_7_22' ) * T_7_22 * Rx * D_7_22';
mcp_22(8,:) = [ zeros(1,8)';(eye(4) - mean_4x4)*w_7_22 +
mean_4';zeros(1,4)']';
err_var(23,8)=D_7_22*Rx*D_7_22'-D_7_22*Rx*T_7_22'*inv(T_7_22*Rx*T
_7_22')*T_7_22*Rx* D_7_22';

mamcp_22_chk_0 = ds_ma0*mcp_22;
save mamcp_22_chk_0 mamcp_22_chk_0 -ascii -double -tabs
mamcp_22_chk_1 = ds_ma1*mcp_22;
save mamcp_22_chk_1 mamcp_22_chk_1 -ascii -double -tabs
mamcp_22_chk_2 = ds_ma2*mcp_22;
save mamcp_22_chk_2 mamcp_22_chk_2 -ascii -double -tabs mc_23(1,:) = [ 0 0 0 0 0 0 0 0 0 0 0 0 0 0 0 0 0 0 0 0 1 0
0 0 0 0 0 0 0 0 0 0 0 0 0 0 ];
mc_23(2,:) = [ 0 0 0 0 0 0 0 0 0 0 0 0 0 0 0 0 0 0 0 0 0 1
0 0 0 0 0 0 0 0 0 0 0 0 0 0 ];
mc_23(3,:) = [ 0 0 0 0 0 0 0 0 0 0 0 0 0 0 0 0 0 0 0 0 0 0
1 0 0 0 0 0 0 0 0 0 0 0 0 0 ];
```

```
        mc_23(4,:) = [ 0 0 0 0 0 0 0 0 0 0 0 0 0 0 0 0 0 0 0 0 0 0 0
        0 1 0 0 0 0 0 0 0 0 0 0 0 0 0 0 0 0 0 0 0 0 0 0 0 ];
        mc_23(5,:) = [ 0 0 0 0 0 0 0 0 0 0 0 0 0 0 0 0 0 0 0 0 0 0 0
        0 0 1 0 0 0 0 0 0 0 0 0 0 0 0 0 0 0 0 0 0 0 0 0 0 ];
 5      mc_23(6,:) = [ 0 0 0 0 0 0 0 0 0 0 0 0 0 0 0 0 0 0 0 0 0 0 0
        0 0 0 1 0 0 0 0 0 0 0 0 0 0 0 0 0 0 0 0 0 0 0 0 0 ];
        mc_23(7,:) = [ 0 0 0 0 0 0 0 0 0 0 0 0 0 0 0 0 0 0 0 0 0 0 0
        0 0 0 0 1 0 0 0 0 0 0 0 0 0 0 0 0 0 0 0 0 0 0 0 0 ];
        mc_23(8,:) = [ 0 0 0 0 0 0 0 0 0 0 0 0 0 0 0 0 0 0 0 0 0 0 0
10      0 0 0 0 0 1 0 0 0 0 0 0 0 0 0 0 0 0 0 0 0 0 0 0 0 ];

sel_mc23_pt0(1,:) = [ 0 0 0 0 0 0 1 0 0 0 0 0 0 0 0 ];
        sel_mc23_pt0(2,:) = [ 0 0 0 0 0 0 0 1 0 0 0 0 0 0 0 ];
        sel_mc23_pt0(3,:) = [ 0 0 0 0 0 0 0 0 1 0 0 0 0 0 0 ];
15      sel_mc23_pt0(4,:) = [ 0 0 0 0 0 0 0 0 0 1 0 0 0 0 0 ];

T_0_23 = sel_mc23_pt0 * ma_ds48;
        D_0_23 = pull_0 * transform_filt8 * mc_23;
        w_0_23 = inv( T_0_23 * Rx * T_0_23' ) * T_0_23 * Rx * D_0_23';
20      mcp_23(1,:) = [ zeros(1,6)';(eye(4) - mean_4x4)*w_0_23 +
        mean_4';zeros(1,6)']';
        err_var(24,1)=D_0_23*Rx*D_0_23'-D_0_23*Rx*T_0_23'*inv(T_0_23*Rx*T
        _0_23')*T_0_23*Rx* D_0_23';

25      sel_mc23_pt1(1,:) = [ 0 0 0 0 0 0 1 0 0 0 0 0 0 0 0 ];
        sel_mc23_pt1(2,:) = [ 0 0 0 0 0 0 0 1 0 0 0 0 0 0 0 ];
        sel_mc23_pt1(3,:) = [ 0 0 0 0 0 0 0 0 1 0 0 0 0 0 0 ];
        sel_mc23_pt1(4,:) = [ 0 0 0 0 0 0 0 0 0 1 0 0 0 0 0 ];

30      T_1_23 = sel_mc23_pt1 * ma_ds48;
        D_1_23 = pull_1 * transform_filt8 * mc_23;
        w_1_23 = inv( T_1_23 * Rx * T_1_23' ) * T_1_23 * Rx * D_1_23';
        mcp_23(2,:) = [ zeros(1,6)';(eye(4) - mean_4x4)*w_1_23 +
        mean_4';zeros(1,6)']';
35      err_var(24,2)=D_1_23*Rx*D_1_23'-D_1_23*Rx*T_1_23'*inv(T_1_23*Rx*T
        _1_23')*T_1_23*Rx* D_1_23';

sel_mc23_pt2(1,:) = [ 0 0 0 0 0 0 1 0 0 0 0 0 0 0 0 ];
        sel_mc23_pt2(2,:) = [ 0 0 0 0 0 0 0 1 0 0 0 0 0 0 0 ];
40      sel_mc23_pt2(3,:) = [ 0 0 0 0 0 0 0 0 1 0 0 0 0 0 0 ];
        sel_mc23_pt2(4,:) = [ 0 0 0 0 0 0 0 0 0 1 0 0 0 0 0 ];

T_2_23 = sel_mc23_pt2 * ma_ds48;
        D_2_23 = pull_2 * transform_filt8 * mc_23;
45      w_2_23 = inv( T_2_23 * Rx * T_2_23' ) * T_2_23 * Rx * D_2_23';
        mcp_23(3,:) = [ zeros(1,6)';(eye(4) - mean_4x4)*w_2_23 +
        mean_4';zeros(1,6)']';
        err_var(24,3)=D_2_23*Rx*D_2_23'-D_2_23*Rx*T_2_23'*inv(T_2_23*Rx*T
        _2_23')*T_2_23*Rx* D_2_23';
```

```
sel_mc23_pt3(1,:) = [ 0 0 0 0 0 0 1 0 0 0 0 0 0 0 ];
sel_mc23_pt3(2,:) = [ 0 0 0 0 0 0 0 1 0 0 0 0 0 0 ];
sel_mc23_pt3(3,:) = [ 0 0 0 0 0 0 0 0 1 0 0 0 0 0 ];
sel_mc23_pt3(4,:) = [ 0 0 0 0 0 0 0 0 0 1 0 0 0 0 ];

T_3_23 = sel_mc23_pt3 * ma_ds48;
D_3_23 = pull_3 * transform_filt8 * mc_23;
w_3_23 = inv( T_3_23 * Rx * T_3_23' ) * T_3_23 * Rx * D_3_23';
mcp_23(4,:) = [ zeros(1,7)';(eye(4) - mean_4x4)*w_3_23 +
mean_4';zeros(1,5)']';
err_var(24,4)=D_3_23*Rx*D_3_23'-D_3_23*Rx*T_3_23'*inv(T_3_23*Rx*T
_3_23')*T_3_23*Rx* D_3_23';

sel_mc23_pt4(1,:) = [ 0 0 0 0 0 0 1 0 0 0 0 0 0 0 ];
sel_mc23_pt4(2,:) = [ 0 0 0 0 0 0 0 1 0 0 0 0 0 0 ];
sel_mc23_pt4(3,:) = [ 0 0 0 0 0 0 0 0 1 0 0 0 0 0 ];
sel_mc23_pt4(4,:) = [ 0 0 0 0 0 0 0 0 0 1 0 0 0 0 ];

T_4_23 = sel_mc23_pt4 * ma_ds48;
D_4_23 = pull_4 * transform_filt8 * mc_23;
w_4_23 = inv( T_4_23 * Rx * T_4_23' ) * T_4_23 * Rx * D_4_23';
mcp_23(5,:) = [ zeros(1,7)';(eye(4) - mean_4x4)*w_4_23 +
mean_4';zeros(1,5)']';
err_var(24,5)=D_4_23*Rx*D_4_23'-D_4_23*Rx*T_4_23'*inv(T_4_23*Rx*T
_4_23')*T_4_23*Rx* D_4_23';

sel_mc23_pt5(1,:) = [ 0 0 0 0 0 0 1 0 0 0 0 0 0 0 ];
sel_mc23_pt5(2,:) = [ 0 0 0 0 0 0 0 1 0 0 0 0 0 0 ];
sel_mc23_pt5(3,:) = [ 0 0 0 0 0 0 0 0 1 0 0 0 0 0 ];
sel_mc23_pt5(4,:) = [ 0 0 0 0 0 0 0 0 0 1 0 0 0 0 ];

T_5_23 = sel_mc23_pt5 * ma_ds48;
D_5_23 = pull_5 * transform_filt8 * mc_23;
w_5_23 = inv( T_5_23 * Rx * T_5_23' ) * T_5_23 * Rx * D_5_23';
mcp_23(6,:) = [ zeros(1,7)';(eye(4) - mean_4x4)*w_5_23 +
mean_4';zeros(1,5)']';
err_var(24,6)=D_5_23*Rx*D_5_23'-D_5_23*Rx*T_5_23'*inv(T_5_23*Rx*T
_5_23')*T_5_23*Rx* D_5_23';

sel_mc23_pt6(1,:) = [ 0 0 0 0 0 0 0 1 0 0 0 0 0 0 ];
sel_mc23_pt6(2,:) = [ 0 0 0 0 0 0 0 0 1 0 0 0 0 0 ];
sel_mc23_pt6(3,:) = [ 0 0 0 0 0 0 0 0 0 1 0 0 0 0 ];
sel_mc23_pt6(4,:) = [ 0 0 0 0 0 0 0 0 0 0 1 0 0 0 ];

T_6_23 = sel_mc23_pt6 * ma_ds48;
D_6_23 = pull_6 * transform_filt8 * mc_23;
w_6_23 = inv( T_6_23 * Rx * T_6_23' ) * T_6_23 * Rx * D_6_23';
mcp_23(7,:) = [ zeros(1,8)';(eye(4) - mean_4x4)*w_6_23 +
mean_4';zeros(1,4)']';
```

```
err_var(24,7)=D_6_23*Rx*D_6_23'-D_6_23*Rx*T_6_23'*inv(T_6_23*Rx*T
_6_23')*T_6_23*Rx* D_6_23';

sel_mc23_pt7(1,:) = [ 0 0 0 0 0 0 0 0 1 0 0 0 0 0 0 0 ];
sel_mc23_pt7(2,:) = [ 0 0 0 0 0 0 0 0 0 1 0 0 0 0 0 0 ];
sel_mc23_pt7(3,:) = [ 0 0 0 0 0 0 0 0 0 0 1 0 0 0 0 0 ];
sel_mc23_pt7(4,:) = [ 0 0 0 0 0 0 0 0 0 0 0 1 0 0 0 0 ];

T_7_23 = sel_mc23_pt7 * ma_ds48;
D_7_23 = pull_7 * transform_filt8 * mc_23;
w_7_23 = inv( T_7_23 * Rx * T_7_23' ) * T_7_23 * Rx * D_7_23';
mcp_23(8,:) = [ zeros(1,8)';(eye(4) - mean_4x4)*w_7_23 +
mean_4';zeros(1,4)']';
err_var(24,8)=D_7_23*Rx*D_7_23'-D_7_23*Rx*T_7_23'*inv(T_7_23*Rx*T
_7_23')*T_7_23*Rx* D_7_23';

mamcp_23_chk_0 = ds_ma0*mcp_23;
save mamcp_23_chk_0 mamcp_23_chk_0 -ascii -double -tabs
mamcp_23_chk_1 = ds_ma1*mcp_23;
save mamcp_23_chk_1 mamcp_23_chk_1 -ascii -double -tabs
mamcp_23_chk_2 = ds_ma2*mcp_23;
save mamcp_23_chk_2 mamcp_23_chk_2 -ascii -double -tabs mc_24(1,:) = [ 0 0 0 0 0 0 0 0 0 0 0 0 0 0 0 0 0 0 0 0 0 0 0 1
0 0 0 0 0 0 0 0 0 0 0 0 0 0 0 0 0 0 0 0 0 0 0 0 ];
mc_24(2,:) = [ 0 0 0 0 0 0 0 0 0 0 0 0 0 0 0 0 0 0 0 0 0 0 0 0
1 0 0 0 0 0 0 0 0 0 0 0 0 0 0 0 0 0 0 0 0 0 0 0 ];
mc_24(3,:) = [ 0 0 0 0 0 0 0 0 0 0 0 0 0 0 0 0 0 0 0 0 0 0 0 0
0 1 0 0 0 0 0 0 0 0 0 0 0 0 0 0 0 0 0 0 0 0 0 0 ];
mc_24(4,:) = [ 0 0 0 0 0 0 0 0 0 0 0 0 0 0 0 0 0 0 0 0 0 0 0 0
0 0 1 0 0 0 0 0 0 0 0 0 0 0 0 0 0 0 0 0 0 0 0 0 ];
mc_24(5,:) = [ 0 0 0 0 0 0 0 0 0 0 0 0 0 0 0 0 0 0 0 0 0 0 0 0
0 0 0 1 0 0 0 0 0 0 0 0 0 0 0 0 0 0 0 0 0 0 0 0 ];
mc_24(6,:) = [ 0 0 0 0 0 0 0 0 0 0 0 0 0 0 0 0 0 0 0 0 0 0 0 0
0 0 0 0 1 0 0 0 0 0 0 0 0 0 0 0 0 0 0 0 0 0 0 0 ];
mc_24(7,:) = [ 0 0 0 0 0 0 0 0 0 0 0 0 0 0 0 0 0 0 0 0 0 0 0 0
0 0 0 0 0 1 0 0 0 0 0 0 0 0 0 0 0 0 0 0 0 0 0 0 ];
mc_24(8,:) = [ 0 0 0 0 0 0 0 0 0 0 0 0 0 0 0 0 0 0 0 0 0 0 0 0
0 0 0 0 0 0 1 0 0 0 0 0 0 0 0 0 0 0 0 0 0 0 0 0 ];

sel_mc24_pt0(1,:) = [ 0 0 0 0 0 0 1 0 0 0 0 0 0 0 0 0 ];
sel_mc24_pt0(2,:) = [ 0 0 0 0 0 0 0 1 0 0 0 0 0 0 0 0 ];
sel_mc24_pt0(3,:) = [ 0 0 0 0 0 0 0 0 1 0 0 0 0 0 0 0 ];
sel_mc24_pt0(4,:) = [ 0 0 0 0 0 0 0 0 0 1 0 0 0 0 0 0 ];

T_0_24 = sel_mc24_pt0 * ma_ds48;
D_0_24 = pull_0 * transform_filt8 * mc_24;
w_0_24 = inv( T_0_24 * Rx * T_0_24' ) * T_0_24 * Rx * D_0_24';
mcp_24(1,:) = [ zeros(1,6)';(eye(4) - mean_4x4)*w_0_24 +
mean_4';zeros(1,6)']';
```

-88-

```
err_var(25,1)=D_0_24*Rx*D_0_24'-D_0_24*Rx*T_0_24'*inv(T_0_24*Rx*T
_0_24')*T_0_24*Rx* D_0_24';

sel_mc24_pt1(1,:) = [ 0 0 0 0 0 0 1 0 0 0 0 0 0 0 0 ];
sel_mc24_pt1(2,:) = [ 0 0 0 0 0 0 0 1 0 0 0 0 0 0 0 ];
sel_mc24_pt1(3,:) = [ 0 0 0 0 0 0 0 0 1 0 0 0 0 0 0 ];
sel_mc24_pt1(4,:) = [ 0 0 0 0 0 0 0 0 0 1 0 0 0 0 0 ];

T_1_24 = sel_mc24_pt1 * ma_ds48;
D_1_24 = pull_1 * transform_filt8 * mc_24;
w_1_24 = inv( T_1_24 * Rx * T_1_24' ) * T_1_24 * Rx * D_1_24';
mcp_24(2,:) = [ zeros(1,6)';(eye(4) - mean_4x4)*w_1_24 +
mean_4';zeros(1,6)']';
err_var(25,2)=D_1_24*Rx*D_1_24'-D_1_24*Rx*T_1_24'*inv(T_1_24*Rx*T
_1_24')*T_1_24*Rx* D_1_24';

sel_mc24_pt2(1,:) = [ 0 0 0 0 0 0 0 1 0 0 0 0 0 0 0 ];
sel_mc24_pt2(2,:) = [ 0 0 0 0 0 0 0 0 1 0 0 0 0 0 0 ];
sel_mc24_pt2(3,:) = [ 0 0 0 0 0 0 0 0 0 1 0 0 0 0 0 ];
sel_mc24_pt2(4,:) = [ 0 0 0 0 0 0 0 0 0 0 1 0 0 0 0 ];

T_2_24 = sel_mc24_pt2 * ma_ds48;
D_2_24 = pull_2 * transform_filt8 * mc_24;
w_2_24 = inv( T_2_24 * Rx * T_2_24' ) * T_2_24 * Rx * D_2_24';
mcp_24(3,:) = [ zeros(1,7)';(eye(4) - mean_4x4)*w_2_24 +
mean_4';zeros(1,5)']';
err_var(25,3)=D_2_24*Rx*D_2_24'-D_2_24*Rx*T_2_24'*inv(T_2_24*Rx*T
_2_24')*T_2_24*Rx* D_2_24';

sel_mc24_pt3(1,:) = [ 0 0 0 0 0 0 0 1 0 0 0 0 0 0 0 ];
sel_mc24_pt3(2,:) = [ 0 0 0 0 0 0 0 0 1 0 0 0 0 0 0 ];
sel_mc24_pt3(3,:) = [ 0 0 0 0 0 0 0 0 0 1 0 0 0 0 0 ];
sel_mc24_pt3(4,:) = [ 0 0 0 0 0 0 0 0 0 0 1 0 0 0 0 ];

T_3_24 = sel_mc24_pt3 * ma_ds48;
D_3_24 = pull_3 * transform_filt8 * mc_24;
w_3_24 = inv( T_3_24 * Rx * T_3_24' ) * T_3_24 * Rx * D_3_24';
mcp_24(4,:) = [ zeros(1,7)';(eye(4) - mean_4x4)*w_3_24 +
mean_4';zeros(1,5)']';
err_var(25,4)=D_3_24*Rx*D_3_24'-D_3_24*Rx*T_3_24'*inv(T_3_24*Rx*T
_3_24')*T_3_24*Rx* D_3_24';

sel_mc24_pt4(1,:) = [ 0 0 0 0 0 0 0 1 0 0 0 0 0 0 0 ];
sel_mc24_pt4(2,:) = [ 0 0 0 0 0 0 0 0 1 0 0 0 0 0 0 ];
sel_mc24_pt4(3,:) = [ 0 0 0 0 0 0 0 0 0 1 0 0 0 0 0 ];
sel_mc24_pt4(4,:) = [ 0 0 0 0 0 0 0 0 0 0 1 0 0 0 0 ];

T_4_24 = sel_mc24_pt4 * ma_ds48;
D_4_24 = pull_4 * transform_filt8 * mc_24;
w_4_24 = inv( T_4_24 * Rx * T_4_24' ) * T_4_24 * Rx * D_4_24';
```

```
mcp_24(5,:) = [ zeros(1,7)';(eye(4) - mean_4x4)*w_4_24 +
mean_4';zeros(1,5)']';
err_var(25,5)=D_4_24*Rx*D_4_24'-D_4_24*Rx*T_4_24'*inv(T_4_24*Rx*T
_4_24')*T_4_24*Rx* D_4_24';

sel_mc24_pt5(1,:) = [ 0 0 0 0 0 0 0 0 1 0 0 0 0 0 0 0 ];
sel_mc24_pt5(2,:) = [ 0 0 0 0 0 0 0 0 0 1 0 0 0 0 0 0 ];
sel_mc24_pt5(3,:) = [ 0 0 0 0 0 0 0 0 0 0 1 0 0 0 0 0 ];
sel_mc24_pt5(4,:) = [ 0 0 0 0 0 0 0 0 0 0 0 1 0 0 0 0 ];

T_5_24 = sel_mc24_pt5 * ma_ds48;
D_5_24 = pull_5 * transform_filt8 * mc_24;
w_5_24 = inv( T_5_24 * Rx * T_5_24' ) * T_5_24 * Rx * D_5_24';
mcp_24(6,:) = [ zeros(1,8)';(eye(4) - mean_4x4)*w_5_24 +
mean_4';zeros(1,4)']';
err_var(25,6)=D_5_24*Rx*D_5_24'-D_5_24*Rx*T_5_24'*inv(T_5_24*Rx*T
_5_24')*T_5_24*Rx* D_5_24';

sel_mc24_pt6(1,:) = [ 0 0 0 0 0 0 0 0 1 0 0 0 0 0 0 0 ];
sel_mc24_pt6(2,:) = [ 0 0 0 0 0 0 0 0 0 1 0 0 0 0 0 0 ];
sel_mc24_pt6(3,:) = [ 0 0 0 0 0 0 0 0 0 0 1 0 0 0 0 0 ];
sel_mc24_pt6(4,:) = [ 0 0 0 0 0 0 0 0 0 0 0 1 0 0 0 0 ];

T_6_24 = sel_mc24_pt6 * ma_ds48;
D_6_24 = pull_6 * transform_filt8 * mc_24;
w_6_24 = inv( T_6_24 * Rx * T_6_24' ) * T_6_24 * Rx * D_6_24';
mcp_24(7,:) = [ zeros(1,8)';(eye(4) - mean_4x4)*w_6_24 +
mean_4';zeros(1,4)']';
err_var(25,7)=D_6_24*Rx*D_6_24'-D_6_24*Rx*T_6_24'*inv(T_6_24*Rx*T
_6_24')*T_6_24*Rx* D_6_24';

sel_mc24_pt7(1,:) = [ 0 0 0 0 0 0 0 0 1 0 0 0 0 0 0 0 ];
sel_mc24_pt7(2,:) = [ 0 0 0 0 0 0 0 0 0 1 0 0 0 0 0 0 ];
sel_mc24_pt7(3,:) = [ 0 0 0 0 0 0 0 0 0 0 1 0 0 0 0 0 ];
sel_mc24_pt7(4,:) = [ 0 0 0 0 0 0 0 0 0 0 0 1 0 0 0 0 ];

T_7_24 = sel_mc24_pt7 * ma_ds48;
D_7_24 = pull_7 * transform_filt8 * mc_24;
w_7_24 = inv( T_7_24 * Rx * T_7_24' ) * T_7_24 * Rx * D_7_24';
mcp_24(8,:) = [ zeros(1,8)';(eye(4) - mean_4x4)*w_7_24 +
mean_4';zeros(1,4)']';
err_var(25,8)=D_7_24*Rx*D_7_24'-D_7_24*Rx*T_7_24'*inv(T_7_24*Rx*T
_7_24')*T_7_24*Rx* D_7_24';

mamcp_24_chk_0 = ds_ma0*mcp_24;
save mamcp_24_chk_0 mamcp_24_chk_0 -ascii -double -tabs
mamcp_24_chk_1 = ds_ma1*mcp_24;
save mamcp_24_chk_1 mamcp_24_chk_1 -ascii -double -tabs
mamcp_24_chk_2 = ds_ma2*mcp_24;
save mamcp_24_chk_2 mamcp_24_chk_2 -ascii -double -tabs
```

```
mc_25(1,:) = [ 0 0 0 0 0 0 0 0 0 0 0 0 0 0 0 0 0 0 0 0 0 0 0
1 0 0 0 0 0 0 0 0 0 0 0 0 0 0 0 0 0 0 0 0 0 ];
mc_25(2,:) = [ 0 0 0 0 0 0 0 0 0 0 0 0 0 0 0 0 0 0 0 0 0 0 0
0 1 0 0 0 0 0 0 0 0 0 0 0 0 0 0 0 0 0 0 0 0 ];
mc_25(3,:) = [ 0 0 0 0 0 0 0 0 0 0 0 0 0 0 0 0 0 0 0 0 0 0 0
0 0 1 0 0 0 0 0 0 0 0 0 0 0 0 0 0 0 0 0 0 0 ];
mc_25(4,:) = [ 0 0 0 0 0 0 0 0 0 0 0 0 0 0 0 0 0 0 0 0 0 0 0
0 0 0 1 0 0 0 0 0 0 0 0 0 0 0 0 0 0 0 0 0 0 ];
mc_25(5,:) = [ 0 0 0 0 0 0 0 0 0 0 0 0 0 0 0 0 0 0 0 0 0 0 0
0 0 0 0 1 0 0 0 0 0 0 0 0 0 0 0 0 0 0 0 0 0 ];
mc_25(6,:) = [ 0 0 0 0 0 0 0 0 0 0 0 0 0 0 0 0 0 0 0 0 0 0 0
0 0 0 0 0 1 0 0 0 0 0 0 0 0 0 0 0 0 0 0 0 0 ];
mc_25(7,:) = [ 0 0 0 0 0 0 0 0 0 0 0 0 0 0 0 0 0 0 0 0 0 0 0
0 0 0 0 0 0 1 0 0 0 0 0 0 0 0 0 0 0 0 0 0 0 ];
mc_25(8,:) = [ 0 0 0 0 0 0 0 0 0 0 0 0 0 0 0 0 0 0 0 0 0 0 0
0 0 0 0 0 0 0 1 0 0 0 0 0 0 0 0 0 0 0 0 0 0 ];

sel_mc25_pt0(1,:) = [ 0 0 0 0 0 0 1 0 0 0 0 0 0 0 0 ];
sel_mc25_pt0(2,:) = [ 0 0 0 0 0 0 0 1 0 0 0 0 0 0 0 ];
sel_mc25_pt0(3,:) = [ 0 0 0 0 0 0 0 0 1 0 0 0 0 0 0 ];
sel_mc25_pt0(4,:) = [ 0 0 0 0 0 0 0 0 0 1 0 0 0 0 0 ];

T_0_25 = sel_mc25_pt0 * ma_ds48;
D_0_25 = pull_0 * transform_filt8 * mc_25;
w_0_25 = inv( T_0_25 * Rx * T_0_25' ) * T_0_25 * Rx * D_0_25';
mcp_25(1,:) = [ zeros(1,6)';(eye(4) - mean_4x4)*w_0_25 +
mean_4';zeros(1,6)']';
err_var(26,1)=D_0_25*Rx*D_0_25'-D_0_25*Rx*T_0_25'*inv(T_0_25*Rx*T
_0_25')*T_0_25*Rx* D_0_25';

sel_mc25_pt1(1,:) = [ 0 0 0 0 0 0 0 1 0 0 0 0 0 0 0 ];
sel_mc25_pt1(2,:) = [ 0 0 0 0 0 0 0 0 1 0 0 0 0 0 0 ];
sel_mc25_pt1(3,:) = [ 0 0 0 0 0 0 0 0 0 1 0 0 0 0 0 ];
sel_mc25_pt1(4,:) = [ 0 0 0 0 0 0 0 0 0 0 1 0 0 0 0 ];

T_1_25 = sel_mc25_pt1 * ma_ds48;
D_1_25 = pull_1 * transform_filt8 * mc_25;
w_1_25 = inv( T_1_25 * Rx * T_1_25' ) * T_1_25 * Rx * D_1_25';
mcp_25(2,:) = [ zeros(1,7)';(eye(4) - mean_4x4)*w_1_25 +
mean_4';zeros(1,5)']';
err_var(26,2)=D_1_25*Rx*D_1_25'-D_1_25*Rx*T_1_25'*inv(T_1_25*Rx*T
_1_25')*T_1_25*Rx* D_1_25';

sel_mc25_pt2(1,:) = [ 0 0 0 0 0 0 0 0 1 0 0 0 0 0 0 ];
sel_mc25_pt2(2,:) = [ 0 0 0 0 0 0 0 0 0 1 0 0 0 0 0 ];
sel_mc25_pt2(3,:) = [ 0 0 0 0 0 0 0 0 0 0 1 0 0 0 0 ];
sel_mc25_pt2(4,:) = [ 0 0 0 0 0 0 0 0 0 0 0 1 0 0 0 ];

T_2_25 = sel_mc25_pt2 * ma_ds48;
D_2_25 = pull_2 * transform_filt8 * mc_25;
```

```
w_2_25 = inv( T_2_25 * Rx * T_2_25' ) * T_2_25 * Rx * D_2_25';
mcp_25(3,:) = [ zeros(1,7)';(eye(4) - mean_4x4)*w_2_25 +
mean_4';zeros(1,5)']';
err_var(26,3)=D_2_25*Rx*D_2_25'-D_2_25*Rx*T_2_25'*inv(T_2_25*Rx*T
_2_25')*T_2_25*Rx* D_2_25';

sel_mc25_pt3(1,:) = [ 0 0 0 0 0 0 0 1 0 0 0 0 0 0 0 ];
sel_mc25_pt3(2,:) = [ 0 0 0 0 0 0 0 0 1 0 0 0 0 0 0 ];
sel_mc25_pt3(3,:) = [ 0 0 0 0 0 0 0 0 0 1 0 0 0 0 0 ];
sel_mc25_pt3(4,:) = [ 0 0 0 0 0 0 0 0 0 0 1 0 0 0 0 ];

T_3_25 = sel_mc25_pt3 * ma_ds48;
D_3_25 = pull_3 * transform_filt8 * mc_25;
w_3_25 = inv( T_3_25 * Rx * T_3_25' ) * T_3_25 * Rx * D_3_25';
mcp_25(4,:) = [ zeros(1,7)';(eye(4) - mean_4x4)*w_3_25 +
mean_4';zeros(1,5)']';
err_var(26,4)=D_3_25*Rx*D_3_25'-D_3_25*Rx*T_3_25'*inv(T_3_25*Rx*T
_3_25')*T_3_25*Rx* D_3_25';

sel_mc25_pt4(1,:) = [ 0 0 0 0 0 0 0 0 1 0 0 0 0 0 0 ];
sel_mc25_pt4(2,:) = [ 0 0 0 0 0 0 0 0 0 1 0 0 0 0 0 ];
sel_mc25_pt4(3,:) = [ 0 0 0 0 0 0 0 0 0 0 1 0 0 0 0 ];
sel_mc25_pt4(4,:) = [ 0 0 0 0 0 0 0 0 0 0 0 1 0 0 0 ];

T_4_25 = sel_mc25_pt4 * ma_ds48;
D_4_25 = pull_4 * transform_filt8 * mc_25;
w_4_25 = inv( T_4_25 * Rx * T_4_25' ) * T_4_25 * Rx * D_4_25';
mcp_25(5,:) = [ zeros(1,8)';(eye(4) - mean_4x4)*w_4_25 +
mean_4';zeros(1,4)']';
err_var(26,5)=D_4_25*Rx*D_4_25'-D_4_25*Rx*T_4_25'*inv(T_4_25*Rx*T
_4_25')*T_4_25*Rx* D_4_25';

sel_mc25_pt5(1,:) = [ 0 0 0 0 0 0 0 0 1 0 0 0 0 0 0 ];
sel_mc25_pt5(2,:) = [ 0 0 0 0 0 0 0 0 0 1 0 0 0 0 0 ];
sel_mc25_pt5(3,:) = [ 0 0 0 0 0 0 0 0 0 0 1 0 0 0 0 ];
sel_mc25_pt5(4,:) = [ 0 0 0 0 0 0 0 0 0 0 0 1 0 0 0 ];

T_5_25 = sel_mc25_pt5 * ma_ds48;
D_5_25 = pull_5 * transform_filt8 * mc_25;
w_5_25 = inv( T_5_25 * Rx * T_5_25' ) * T_5_25 * Rx * D_5_25';
mcp_25(6,:) = [ zeros(1,8)';(eye(4) - mean_4x4)*w_5_25 +
mean_4';zeros(1,4)']';
err_var(26,6)=D_5_25*Rx*D_5_25'-D_5_25*Rx*T_5_25'*inv(T_5_25*Rx*T
_5_25')*T_5_25*Rx* D_5_25';

sel_mc25_pt6(1,:) = [ 0 0 0 0 0 0 0 1 0 0 0 0 0 0 0 ];
sel_mc25_pt6(2,:) = [ 0 0 0 0 0 0 0 0 1 0 0 0 0 0 0 ];
sel_mc25_pt6(3,:) = [ 0 0 0 0 0 0 0 0 0 1 0 0 0 0 0 ];
sel_mc25_pt6(4,:) = [ 0 0 0 0 0 0 0 0 0 0 1 0 0 0 0 ];
```

```
T_6_25 = sel_mc25_pt6 * ma_ds48;
D_6_25 = pull_6 * transform_filt8 * mc_25;
w_6_25 = inv( T_6_25 * Rx * T_6_25' ) * T_6_25 * Rx * D_6_25';
mcp_25(7,:) = [ zeros(1,8)';(eye(4) - mean_4x4)*w_6_25 +
mean_4';zeros(1,4)']';
err_var(26,7)=D_6_25*Rx*D_6_25'-D_6_25*Rx*T_6_25'*inv(T_6_25*Rx*T
_6_25')*T_6_25*Rx* D_6_25';

sel_mc25_pt7(1,:) = [ 0 0 0 0 0 0 0 0 1 0 0 0 0 0 0 ];
sel_mc25_pt7(2,:) = [ 0 0 0 0 0 0 0 0 0 1 0 0 0 0 0 ];
sel_mc25_pt7(3,:) = [ 0 0 0 0 0 0 0 0 0 0 1 0 0 0 0 ];
sel_mc25_pt7(4,:) = [ 0 0 0 0 0 0 0 0 0 0 0 1 0 0 0 ];

T_7_25 = sel_mc25_pt7 * ma_ds48;
D_7_25 = pull_7 * transform_filt8 * mc_25;
w_7_25 = inv( T_7_25 * Rx * T_7_25' ) * T_7_25 * Rx * D_7_25';
mcp_25(8,:) = [ zeros(1,9)';(eye(4) - mean_4x4)*w_7_25 +
mean_4';zeros(1,3)']';
err_var(26,8)=D_7_25*Rx*D_7_25'-D_7_25*Rx*T_7_25'*inv(T_7_25*Rx*T
_7_25')*T_7_25*Rx* D_7_25';

mamcp_25_chk_0 = ds_ma0*mcp_25;
save mamcp_25_chk_0 mamcp_25_chk_0 -ascii -double -tabs
mamcp_25_chk_1 = ds_ma1*mcp_25;
save mamcp_25_chk_1 mamcp_25_chk_1 -ascii -double -tabs
mamcp_25_chk_2 = ds_ma2*mcp_25;
save mamcp_25_chk_2 mamcp_25_chk_2 -ascii -double -tabs mc_26(1,:) = [ 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 ];
mc_26(2,:) = [ 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 ];
mc_26(3,:) = [ 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 ];
mc_26(4,:) = [ 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 ];
mc_26(5,:) = [ 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 ];
mc_26(6,:) = [ 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 ];
mc_26(7,:) = [ 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 ];
mc_26(8,:) = [ 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 ];

sel_mc26_pt0(1,:) = [ 0 0 0 0 0 0 0 1 0 0 0 0 0 0 0 ];
sel_mc26_pt0(2,:) = [ 0 0 0 0 0 0 0 0 1 0 0 0 0 0 0 ];
sel_mc26_pt0(3,:) = [ 0 0 0 0 0 0 0 0 0 1 0 0 0 0 0 ];
sel_mc26_pt0(4,:) = [ 0 0 0 0 0 0 0 0 0 0 1 0 0 0 0 ];
```

```
     T_0_26 = sel_mc26_pt0 * ma_ds48;
     D_0_26 = pull_0 * transform_filt8 * mc_26;
     w_0_26 = inv( T_0_26 * Rx * T_0_26' ) * T_0_26 * Rx * D_0_26';
     mcp_26(1,:) = [ zeros(1,7)';(eye(4) - mean_4x4)*w_0_26 +
 5   mean_4';zeros(1,5)']';
     err_var(27,1)=D_0_26*Rx*D_0_26'-D_0_26*Rx*T_0_26'*inv(T_0_26*Rx*T
     _0_26')*T_0_26*Rx* D_0_26';

sel_mc26_pt1(1,:) = [ 0 0 0 0 0 0 0 1 0 0 0 0 0 0 0 ];
10   sel_mc26_pt1(2,:) = [ 0 0 0 0 0 0 0 0 1 0 0 0 0 0 0 ];
     sel_mc26_pt1(3,:) = [ 0 0 0 0 0 0 0 0 0 1 0 0 0 0 0 ];
     sel_mc26_pt1(4,:) = [ 0 0 0 0 0 0 0 0 0 0 1 0 0 0 0 ];

T_1_26 = sel_mc26_pt1 * ma_ds48;
15   D_1_26 = pull_1 * transform_filt8 * mc_26;
     w_1_26 = inv( T_1_26 * Rx * T_1_26' ) * T_1_26 * Rx * D_1_26';
     mcp_26(2,:) = [ zeros(1,7)';(eye(4) - mean_4x4)*w_1_26 +
     mean_4';zeros(1,5)']';
     err_var(27,2)=D_1_26*Rx*D_1_26'-D_1_26*Rx*T_1_26'*inv(T_1_26*Rx*T
20   _1_26')*T_1_26*Rx* D_1_26';

sel_mc26_pt2(1,:) = [ 0 0 0 0 0 0 0 1 0 0 0 0 0 0 0 ];
     sel_mc26_pt2(2,:) = [ 0 0 0 0 0 0 0 0 1 0 0 0 0 0 0 ];
     sel_mc26_pt2(3,:) = [ 0 0 0 0 0 0 0 0 0 1 0 0 0 0 0 ];
25   sel_mc26_pt2(4,:) = [ 0 0 0 0 0 0 0 0 0 0 1 0 0 0 0 ];

T_2_26 = sel_mc26_pt2 * ma_ds48;
     D_2_26 = pull_2 * transform_filt8 * mc_26;
     w_2_26 = inv( T_2_26 * Rx * T_2_26' ) * T_2_26 * Rx * D_2_26';
30   mcp_26(3,:) = [ zeros(1,7)';(eye(4) - mean_4x4)*w_2_26 +
     mean_4';zeros(1,5)']';
     err_var(27,3)=D_2_26*Rx*D_2_26'-D_2_26*Rx*T_2_26'*inv(T_2_26*Rx*T
     _2_26')*T_2_26*Rx* D_2_26';

35   sel_mc26_pt3(1,:) = [ 0 0 0 0 0 0 0 1 0 0 0 0 0 0 0 ];
     sel_mc26_pt3(2,:) = [ 0 0 0 0 0 0 0 0 1 0 0 0 0 0 0 ];
     sel_mc26_pt3(3,:) = [ 0 0 0 0 0 0 0 0 0 1 0 0 0 0 0 ];
     sel_mc26_pt3(4,:) = [ 0 0 0 0 0 0 0 0 0 0 1 0 0 0 0 ];

40   T_3_26 = sel_mc26_pt3 * ma_ds48;
     D_3_26 = pull_3 * transform_filt8 * mc_26;
     w_3_26 = inv( T_3_26 * Rx * T_3_26' ) * T_3_26 * Rx * D_3_26';
     mcp_26(4,:) = [ zeros(1,8)';(eye(4) - mean_4x4)*w_3_26 +
     mean_4';zeros(1,4)']';
45   err_var(27,4)=D_3_26*Rx*D_3_26'-D_3_26*Rx*T_3_26'*inv(T_3_26*Rx*T
     _3_26')*T_3_26*Rx* D_3_26';

sel_mc26_pt4(1,:) = [ 0 0 0 0 0 0 0 1 0 0 0 0 0 0 0 ];
     sel_mc26_pt4(2,:) = [ 0 0 0 0 0 0 0 0 1 0 0 0 0 0 0 ];
```

```
sel_mc26_pt4(3,:) = [ 0 0 0 0 0 0 0 0 0 1 0 0 0 0 0 ];
sel_mc26_pt4(4,:) = [ 0 0 0 0 0 0 0 0 0 0 1 0 0 0 0 ];

T_4_26 = sel_mc26_pt4 * ma_ds48;
D_4_26 = pull_4 * transform_filt8 * mc_26;
w_4_26 = inv( T_4_26 * Rx * T_4_26' ) * T_4_26 * Rx * D_4_26';
mcp_26(5,:) = [ zeros(1,8)';(eye(4) - mean_4x4)*w_4_26 +
mean_4';zeros(1,4)']';
err_var(27,5)=D_4_26*Rx*D_4_26'-D_4_26*Rx*T_4_26'*inv(T_4_26*Rx*T
_4_26')*T_4_26*Rx* D_4_26';

sel_mc26_pt5(1,:) = [ 0 0 0 0 0 0 0 0 1 0 0 0 0 0 0 ];
sel_mc26_pt5(2,:) = [ 0 0 0 0 0 0 0 0 0 1 0 0 0 0 0 ];
sel_mc26_pt5(3,:) = [ 0 0 0 0 0 0 0 0 0 0 1 0 0 0 0 ];
sel_mc26_pt5(4,:) = [ 0 0 0 0 0 0 0 0 0 0 0 1 0 0 0 ];

T_5_26 = sel_mc26_pt5 * ma_ds48;
D_5_26 = pull_5 * transform_filt8 * mc_26;
w_5_26 = inv( T_5_26 * Rx * T_5_26' ) * T_5_26 * Rx * D_5_26';
mcp_26(6,:) = [ zeros(1,8)';(eye(4) - mean_4x4)*w_5_26 +
mean_4';zeros(1,4)']';
err_var(27,6)=D_5_26*Rx*D_5_26'-D_5_26*Rx*T_5_26'*inv(T_5_26*Rx*T
_5_26')*T_5_26*Rx* D_5_26';

sel_mc26_pt6(1,:) = [ 0 0 0 0 0 0 0 0 1 0 0 0 0 0 0 ];
sel_mc26_pt6(2,:) = [ 0 0 0 0 0 0 0 0 0 1 0 0 0 0 0 ];
sel_mc26_pt6(3,:) = [ 0 0 0 0 0 0 0 0 0 0 1 0 0 0 0 ];
sel_mc26_pt6(4,:) = [ 0 0 0 0 0 0 0 0 0 0 0 1 0 0 0 ];

T_6_26 = sel_mc26_pt6 * ma_ds48;
D_6_26 = pull_6 * transform_filt8 * mc_26;
w_6_26 = inv( T_6_26 * Rx * T_6_26' ) * T_6_26 * Rx * D_6_26';
mcp_26(7,:) = [ zeros(1,9)';(eye(4) - mean_4x4)*w_6_26 +
mean_4';zeros(1,3)']';
err_var(27,7)=D_6_26*Rx*D_6_26'-D_6_26*Rx*T_6_26'*inv(T_6_26*Rx*T
_6_26')*T_6_26*Rx* D_6_26';

sel_mc26_pt7(1,:) = [ 0 0 0 0 0 0 0 0 1 0 0 0 0 0 0 ];
sel_mc26_pt7(2,:) = [ 0 0 0 0 0 0 0 0 0 1 0 0 0 0 0 ];
sel_mc26_pt7(3,:) = [ 0 0 0 0 0 0 0 0 0 0 1 0 0 0 0 ];
sel_mc26_pt7(4,:) = [ 0 0 0 0 0 0 0 0 0 0 0 1 0 0 0 ];

T_7_26 = sel_mc26_pt7 * ma_ds48;
D_7_26 = pull_7 * transform_filt8 * mc_26;
w_7_26 = inv( T_7_26 * Rx * T_7_26' ) * T_7_26 * Rx * D_7_26';
mcp_26(8,:) = [ zeros(1,9)';(eye(4) - mean_4x4)*w_7_26 +
mean_4';zeros(1,3)']';
err_var(27,8)=D_7_26*Rx*D_7_26'-D_7_26*Rx*T_7_26'*inv(T_7_26*Rx*T
_7_26')*T_7_26*Rx* D_7_26';
```

```
mamcp_26_chk_0 = ds_ma0*mcp_26;
save mamcp_26_chk_0 mamcp_26_chk_0 -ascii -double -tabs
mamcp_26_chk_1 = ds_ma1*mcp_26;
save mamcp_26_chk_1 mamcp_26_chk_1 -ascii -double -tabs
mamcp_26_chk_2 = ds_ma2*mcp_26;
save mamcp_26_chk_2 mamcp_26_chk_2 -ascii -double -tabs mc_27(1,:) = [ 0 0 0 0 0 0 0 0 0 0 0 0 0 0 0 0 0 0 0 0 0 0 0 0 0 0
     0 0 1 0 0 0 0 0 0 0 0 0 0 0 0 0 0 0 0 0 0 ];
mc_27(2,:) = [ 0 0 0 0 0 0 0 0 0 0 0 0 0 0 0 0 0 0 0 0 0 0 0 0 0 0
     0 0 0 1 0 0 0 0 0 0 0 0 0 0 0 0 0 0 0 0 0 ];
mc_27(3,:) = [ 0 0 0 0 0 0 0 0 0 0 0 0 0 0 0 0 0 0 0 0 0 0 0 0 0 0
     0 0 0 0 1 0 0 0 0 0 0 0 0 0 0 0 0 0 0 0 0 ];
mc_27(4,:) = [ 0 0 0 0 0 0 0 0 0 0 0 0 0 0 0 0 0 0 0 0 0 0 0 0 0 0
     0 0 0 0 0 1 0 0 0 0 0 0 0 0 0 0 0 0 0 0 0 ];
mc_27(5,:) = [ 0 0 0 0 0 0 0 0 0 0 0 0 0 0 0 0 0 0 0 0 0 0 0 0 0 0
     0 0 0 0 0 0 1 0 0 0 0 0 0 0 0 0 0 0 0 0 0 ];
mc_27(6,:) = [ 0 0 0 0 0 0 0 0 0 0 0 0 0 0 0 0 0 0 0 0 0 0 0 0 0 0
     0 0 0 0 0 0 0 1 0 0 0 0 0 0 0 0 0 0 0 0 0 ];
mc_27(7,:) = [ 0 0 0 0 0 0 0 0 0 0 0 0 0 0 0 0 0 0 0 0 0 0 0 0 0 0
     0 0 0 0 0 0 0 0 1 0 0 0 0 0 0 0 0 0 0 0 0 ];
mc_27(8,:) = [ 0 0 0 0 0 0 0 0 0 0 0 0 0 0 0 0 0 0 0 0 0 0 0 0 0 0
     0 0 0 0 0 0 0 0 0 1 0 0 0 0 0 0 0 0 0 0 0 ];

sel_mc27_pt0(1,:) = [ 0 0 0 0 0 0 0 1 0 0 0 0 0 0 0 ];
sel_mc27_pt0(2,:) = [ 0 0 0 0 0 0 0 0 1 0 0 0 0 0 0 ];
sel_mc27_pt0(3,:) = [ 0 0 0 0 0 0 0 0 0 1 0 0 0 0 0 ];
sel_mc27_pt0(4,:) = [ 0 0 0 0 0 0 0 0 0 0 1 0 0 0 0 ];

T_0_27 = sel_mc27_pt0 * ma_ds48;
D_0_27 = pull_0 * transform_filt8 * mc_27;
w_0_27 = inv( T_0_27 * Rx * T_0_27' ) * T_0_27 * Rx * D_0_27';
mcp_27(1,:) = [ zeros(1,7)';(eye(4) - mean_4x4)*w_0_27 +
mean_4';zeros(1,5)']';
err_var(28,1)=D_0_27*Rx*D_0_27'-D_0_27*Rx*T_0_27'*inv(T_0_27*Rx*T
_0_27')*T_0_27*Rx* D_0_27';

sel_mc27_pt1(1,:) = [ 0 0 0 0 0 0 0 1 0 0 0 0 0 0 0 ];
sel_mc27_pt1(2,:) = [ 0 0 0 0 0 0 0 0 1 0 0 0 0 0 0 ];
sel_mc27_pt1(3,:) = [ 0 0 0 0 0 0 0 0 0 1 0 0 0 0 0 ];
sel_mc27_pt1(4,:) = [ 0 0 0 0 0 0 0 0 0 0 1 0 0 0 0 ];

T_1_27 = sel_mc27_pt1 * ma_ds48;
D_1_27 = pull_1 * transform_filt8 * mc_27;
w_1_27 = inv( T_1_27 * Rx * T_1_27' ) * T_1_27 * Rx * D_1_27';
mcp_27(2,:) = [ zeros(1,7)';(eye(4) - mean_4x4)*w_1_27 +
mean_4';zeros(1,5)']';
err_var(28,2)=D_1_27*Rx*D_1_27'-D_1_27*Rx*T_1_27'*inv(T_1_27*Rx*T
_1_27')*T_1_27*Rx* D_1_27';
```

```
sel_mc27_pt2(1,:) = [ 0 0 0 0 0 0 0 0 1 0 0 0 0 0 0 0 ];
sel_mc27_pt2(2,:) = [ 0 0 0 0 0 0 0 0 0 1 0 0 0 0 0 0 ];
sel_mc27_pt2(3,:) = [ 0 0 0 0 0 0 0 0 0 0 1 0 0 0 0 0 ];
sel_mc27_pt2(4,:) = [ 0 0 0 0 0 0 0 0 0 0 0 1 0 0 0 0 ];

T_2_27 = sel_mc27_pt2 * ma_ds48;
D_2_27 = pull_2 * transform_filt8 * mc_27;
w_2_27 = inv( T_2_27 * Rx * T_2_27' ) * T_2_27 * Rx * D_2_27';
mcp_27(3,:) = [ zeros(1,8)';(eye(4) - mean_4x4)*w_2_27 +
mean_4';zeros(1,4)']';
err_var(28,3)=D_2_27*Rx*D_2_27'-D_2_27*Rx*T_2_27'*inv(T_2_27*Rx*T
_2_27')*T_2_27*Rx* D_2_27';

sel_mc27_pt3(1,:) = [ 0 0 0 0 0 0 0 0 1 0 0 0 0 0 0 0 ];
sel_mc27_pt3(2,:) = [ 0 0 0 0 0 0 0 0 0 1 0 0 0 0 0 0 ];
sel_mc27_pt3(3,:) = [ 0 0 0 0 0 0 0 0 0 0 1 0 0 0 0 0 ];
sel_mc27_pt3(4,:) = [ 0 0 0 0 0 0 0 0 0 0 0 1 0 0 0 0 ];

T_3_27 = sel_mc27_pt3 * ma_ds48;
D_3_27 = pull_3 * transform_filt8 * mc_27;
w_3_27 = inv( T_3_27 * Rx * T_3_27' ) * T_3_27 * Rx * D_3_27';
mcp_27(4,:) = [ zeros(1,8)';(eye(4) - mean_4x4)*w_3_27 +
mean_4';zeros(1,4)']';
err_var(28,4)=D_3_27*Rx*D_3_27'-D_3_27*Rx*T_3_27'*inv(T_3_27*Rx*T
_3_27')*T_3_27*Rx* D_3_27';

sel_mc27_pt4(1,:) = [ 0 0 0 0 0 0 0 0 1 0 0 0 0 0 0 0 ];
sel_mc27_pt4(2,:) = [ 0 0 0 0 0 0 0 0 0 1 0 0 0 0 0 0 ];
sel_mc27_pt4(3,:) = [ 0 0 0 0 0 0 0 0 0 0 1 0 0 0 0 0 ];
sel_mc27_pt4(4,:) = [ 0 0 0 0 0 0 0 0 0 0 0 1 0 0 0 0 ];

T_4_27 = sel_mc27_pt4 * ma_ds48;
D_4_27 = pull_4 * transform_filt8 * mc_27;
w_4_27 = inv( T_4_27 * Rx * T_4_27' ) * T_4_27 * Rx * D_4_27';
mcp_27(5,:) = [ zeros(1,8)';(eye(4) - mean_4x4)*w_4_27 +
mean_4';zeros(1,4)']';
err_var(28,5)=D_4_27*Rx*D_4_27'-D_4_27*Rx*T_4_27'*inv(T_4_27*Rx*T
_4_27')*T_4_27*Rx* D_4_27';

sel_mc27_pt5(1,:) = [ 0 0 0 0 0 0 0 0 1 0 0 0 0 0 0 0 ];
sel_mc27_pt5(2,:) = [ 0 0 0 0 0 0 0 0 0 1 0 0 0 0 0 0 ];
sel_mc27_pt5(3,:) = [ 0 0 0 0 0 0 0 0 0 0 1 0 0 0 0 0 ];
sel_mc27_pt5(4,:) = [ 0 0 0 0 0 0 0 0 0 0 0 1 0 0 0 0 ];

T_5_27 = sel_mc27_pt5 * ma_ds48;
D_5_27 = pull_5 * transform_filt8 * mc_27;
w_5_27 = inv( T_5_27 * Rx * T_5_27' ) * T_5_27 * Rx * D_5_27';
mcp_27(6,:) = [ zeros(1,9)';(eye(4) - mean_4x4)*w_5_27 +
mean_4';zeros(1,3)']';
```

```
err_var(28,6)=D_5_27*Rx*D_5_27'-D_5_27*Rx*T_5_27'*inv(T_5_27*Rx*T
_5_27')*T_5_27*Rx* D_5_27';

sel_mc27_pt6(1,:) = [ 0 0 0 0 0 0 0 0 0 1 0 0 0 0 0 ];
sel_mc27_pt6(2,:) = [ 0 0 0 0 0 0 0 0 0 0 1 0 0 0 0 ];
sel_mc27_pt6(3,:) = [ 0 0 0 0 0 0 0 0 0 0 0 1 0 0 0 ];
sel_mc27_pt6(4,:) = [ 0 0 0 0 0 0 0 0 0 0 0 0 1 0 0 ];

T_6_27 = sel_mc27_pt6 * ma_ds48;
D_6_27 = pull_6 * transform_filt8 * mc_27;
w_6_27 = inv( T_6_27 * Rx * T_6_27' ) * T_6_27 * Rx * D_6_27';
mcp_27(7,:) = [ zeros(1,9)';(eye(4) - mean_4x4)*w_6_27 +
mean_4';zeros(1,3)']';
err_var(28,7)=D_6_27*Rx*D_6_27'-D_6_27*Rx*T_6_27'*inv(T_6_27*Rx*T
_6_27')*T_6_27*Rx* D_6_27';

sel_mc27_pt7(1,:) = [ 0 0 0 0 0 0 0 0 0 1 0 0 0 0 0 ];
sel_mc27_pt7(2,:) = [ 0 0 0 0 0 0 0 0 0 0 1 0 0 0 0 ];
sel_mc27_pt7(3,:) = [ 0 0 0 0 0 0 0 0 0 0 0 1 0 0 0 ];
sel_mc27_pt7(4,:) = [ 0 0 0 0 0 0 0 0 0 0 0 0 1 0 0 ];

T_7_27 = sel_mc27_pt7 * ma_ds48;
D_7_27 = pull_7 * transform_filt8 * mc_27;
w_7_27 = inv( T_7_27 * Rx * T_7_27' ) * T_7_27 * Rx * D_7_27';
mcp_27(8,:) = [ zeros(1,9)';(eye(4) - mean_4x4)*w_7_27 +
mean_4';zeros(1,3)']';
err_var(28,8)=D_7_27*Rx*D_7_27'-D_7_27*Rx*T_7_27'*inv(T_7_27*Rx*T
_7_27')*T_7_27*Rx* D_7_27';

mamcp_27_chk_0 = ds_ma0*mcp_27;
save mamcp_27_chk_0 mamcp_27_chk_0 -ascii -double -tabs
mamcp_27_chk_1 = ds_ma1*mcp_27;
save mamcp_27_chk_1 mamcp_27_chk_1 -ascii -double -tabs
mamcp_27_chk_2 = ds_ma2*mcp_27;
save mamcp_27_chk_2 mamcp_27_chk_2 -ascii -double -tabs mc_28(1,:) = [ 0 0 0 0 0 0 0 0 0 0 0 0 0 0 0 0 0 0 0 0 0 0 0 0
0 0 0 1 0 0 0 0 0 0 0 0 0 0 0 0 0 0 ];
mc_28(2,:) = [ 0 0 0 0 0 0 0 0 0 0 0 0 0 0 0 0 0 0 0 0 0 0 0 0
0 0 0 0 1 0 0 0 0 0 0 0 0 0 0 0 0 0 ];
mc_28(3,:) = [ 0 0 0 0 0 0 0 0 0 0 0 0 0 0 0 0 0 0 0 0 0 0 0 0
0 0 0 0 0 1 0 0 0 0 0 0 0 0 0 0 0 0 ];
mc_28(4,:) = [ 0 0 0 0 0 0 0 0 0 0 0 0 0 0 0 0 0 0 0 0 0 0 0 0
0 0 0 0 0 0 1 0 0 0 0 0 0 0 0 0 0 0 ];
mc_28(5,:) = [ 0 0 0 0 0 0 0 0 0 0 0 0 0 0 0 0 0 0 0 0 0 0 0 0
0 0 0 0 0 0 0 1 0 0 0 0 0 0 0 0 0 0 ];
mc_28(6,:) = [ 0 0 0 0 0 0 0 0 0 0 0 0 0 0 0 0 0 0 0 0 0 0 0 0
0 0 0 0 0 0 0 0 1 0 0 0 0 0 0 0 0 0 ];
mc_28(7,:) = [ 0 0 0 0 0 0 0 0 0 0 0 0 0 0 0 0 0 0 0 0 0 0 0 0
0 0 0 0 0 0 0 0 0 1 0 0 0 0 0 0 0 0 ];
```

```
     mc_28(8,:) = [ 0 0 0 0 0 0 0 0 0 0 0 0 0 0 0 0 0 0 0 0 0 0 0 0
     0 0 0 0 0 0 0 0 1 0 0 0 0 0 0 0 0 0 0 0 0 0 0 ];

sel_mc28_pt0(1,:) = [ 0 0 0 0 0 0 0 1 0 0 0 0 0 0 0 0 ];
5    sel_mc28_pt0(2,:) = [ 0 0 0 0 0 0 0 0 1 0 0 0 0 0 0 0 ];
     sel_mc28_pt0(3,:) = [ 0 0 0 0 0 0 0 0 0 1 0 0 0 0 0 0 ];
     sel_mc28_pt0(4,:) = [ 0 0 0 0 0 0 0 0 0 0 1 0 0 0 0 0 ];

T_0_28 = sel_mc28_pt0 * ma_ds48;
10   D_0_28 = pull_0 * transform_filt8 * mc_28;
     w_0_28 = inv( T_0_28 * Rx * T_0_28' ) * T_0_28 * Rx * D_0_28';
     mcp_28(1,:) = [ zeros(1,7)';(eye(4) - mean_4x4)*w_0_28 +
     mean_4';zeros(1,5)']';
     err_var(29,1)=D_0_28*Rx*D_0_28'-D_0_28*Rx*T_0_28'*inv(T_0_28*Rx*T
15   _0_28')*T_0_28*Rx* D_0_28';

sel_mc28_pt1(1,:) = [ 0 0 0 0 0 0 0 0 1 0 0 0 0 0 0 0 ];
     sel_mc28_pt1(2,:) = [ 0 0 0 0 0 0 0 0 0 1 0 0 0 0 0 0 ];
     sel_mc28_pt1(3,:) = [ 0 0 0 0 0 0 0 0 0 0 1 0 0 0 0 0 ];
20   sel_mc28_pt1(4,:) = [ 0 0 0 0 0 0 0 0 0 0 0 1 0 0 0 0 ];

T_1_28 = sel_mc28_pt1 * ma_ds48;
     D_1_28 = pull_1 * transform_filt8 * mc_28;
     w_1_28 = inv( T_1_28 * Rx * T_1_28' ) * T_1_28 * Rx * D_1_28';
25   mcp_28(2,:) = [ zeros(1,8)';(eye(4) - mean_4x4)*w_1_28 +
     mean_4';zeros(1,4)']';
     err_var(29,2)=D_1_28*Rx*D_1_28'-D_1_28*Rx*T_1_28'*inv(T_1_28*Rx*T
     _1_28')*T_1_28*Rx* D_1_28';

30   sel_mc28_pt2(1,:) = [ 0 0 0 0 0 0 0 0 1 0 0 0 0 0 0 0 ];
     sel_mc28_pt2(2,:) = [ 0 0 0 0 0 0 0 0 0 1 0 0 0 0 0 0 ];
     sel_mc28_pt2(3,:) = [ 0 0 0 0 0 0 0 0 0 0 1 0 0 0 0 0 ];
     sel_mc28_pt2(4,:) = [ 0 0 0 0 0 0 0 0 0 0 0 1 0 0 0 0 ];

35   T_2_28 = sel_mc28_pt2 * ma_ds48;
     D_2_28 = pull_2 * transform_filt8 * mc_28;
     w_2_28 = inv( T_2_28 * Rx * T_2_28' ) * T_2_28 * Rx * D_2_28';
     mcp_28(3,:) = [ zeros(1,8)';(eye(4) - mean_4x4)*w_2_28 +
     mean_4';zeros(1,4)']';
40   err_var(29,3)=D_2_28*Rx*D_2_28'-D_2_28*Rx*T_2_28'*inv(T_2_28*Rx*T
     _2_28')*T_2_28*Rx* D_2_28';

sel_mc28_pt3(1,:) = [ 0 0 0 0 0 0 0 0 1 0 0 0 0 0 0 0 ];
     sel_mc28_pt3(2,:) = [ 0 0 0 0 0 0 0 0 0 1 0 0 0 0 0 0 ];
45   sel_mc28_pt3(3,:) = [ 0 0 0 0 0 0 0 0 0 0 1 0 0 0 0 0 ];
     sel_mc28_pt3(4,:) = [ 0 0 0 0 0 0 0 0 0 0 0 1 0 0 0 0 ];

T_3_28 = sel_mc28_pt3 * ma_ds48;
     D_3_28 = pull_3 * transform_filt8 * mc_28;
50   w_3_28 = inv( T_3_28 * Rx * T_3_28' ) * T_3_28 * Rx * D_3_28';
```

```
mcp_28(4,:) = [ zeros(1,8)';(eye(4) - mean_4x4)*w_3_28 +
mean_4';zeros(1,4)']';
err_var(29,4)=D_3_28*Rx*D_3_28'-D_3_28*Rx*T_3_28'*inv(T_3_28*Rx*T
_3_28')*T_3_28*Rx* D_3_28';

sel_mc28_pt4(1,:) = [ 0 0 0 0 0 0 0 0 1 0 0 0 0 0 0 ];
sel_mc28_pt4(2,:) = [ 0 0 0 0 0 0 0 0 0 1 0 0 0 0 0 ];
sel_mc28_pt4(3,:) = [ 0 0 0 0 0 0 0 0 0 0 1 0 0 0 0 ];
sel_mc28_pt4(4,:) = [ 0 0 0 0 0 0 0 0 0 0 0 1 0 0 0 ];

T_4_28 = sel_mc28_pt4 * ma_ds48;
D_4_28 = pull_4 * transform_filt8 * mc_28;
w_4_28 = inv( T_4_28 * Rx * T_4_28' ) * T_4_28 * Rx * D_4_28';
mcp_28(5,:) = [ zeros(1,9)';(eye(4) - mean_4x4)*w_4_28 +
mean_4';zeros(1,3)']';
err_var(29,5)=D_4_28*Rx*D_4_28'-D_4_28*Rx*T_4_28'*inv(T_4_28*Rx*T
_4_28')*T_4_28*Rx* D_4_28';

sel_mc28_pt5(1,:) = [ 0 0 0 0 0 0 0 0 1 0 0 0 0 0 0 ];
sel_mc28_pt5(2,:) = [ 0 0 0 0 0 0 0 0 0 1 0 0 0 0 0 ];
sel_mc28_pt5(3,:) = [ 0 0 0 0 0 0 0 0 0 0 1 0 0 0 0 ];
sel_mc28_pt5(4,:) = [ 0 0 0 0 0 0 0 0 0 0 0 1 0 0 0 ];

T_5_28 = sel_mc28_pt5 * ma_ds48;
D_5_28 = pull_5 * transform_filt8 * mc_28;
w_5_28 = inv( T_5_28 * Rx * T_5_28' ) * T_5_28 * Rx * D_5_28';
mcp_28(6,:) = [ zeros(1,9)';(eye(4) - mean_4x4)*w_5_28 +
mean_4';zeros(1,3)']';
err_var(29,6)=D_5_28*Rx*D_5_28'-D_5_28*Rx*T_5_28'*inv(T_5_28*Rx*T
_5_28')*T_5_28*Rx* D_5_28';

sel_mc28_pt6(1,:) = [ 0 0 0 0 0 0 0 0 1 0 0 0 0 0 0 ];
sel_mc28_pt6(2,:) = [ 0 0 0 0 0 0 0 0 0 1 0 0 0 0 0 ];
sel_mc28_pt6(3,:) = [ 0 0 0 0 0 0 0 0 0 0 1 0 0 0 0 ];
sel_mc28_pt6(4,:) = [ 0 0 0 0 0 0 0 0 0 0 0 1 0 0 0 ];

T_6_28 = sel_mc28_pt6 * ma_ds48;
D_6_28 = pull_6 * transform_filt8 * mc_28;
w_6_28 = inv( T_6_28 * Rx * T_6_28' ) * T_6_28 * Rx * D_6_28';
mcp_28(7,:) = [ zeros(1,9)';(eye(4) - mean_4x4)*w_6_28 +
mean_4';zeros(1,3)']';
err_var(29,7)=D_6_28*Rx*D_6_28'-D_6_28*Rx*T_6_28'*inv(T_6_28*Rx*T
_6_28')*T_6_28*Rx* D_6_28';

sel_mc28_pt7(1,:) = [ 0 0 0 0 0 0 0 0 0 1 0 0 0 0 0 ];
sel_mc28_pt7(2,:) = [ 0 0 0 0 0 0 0 0 0 0 1 0 0 0 0 ];
sel_mc28_pt7(3,:) = [ 0 0 0 0 0 0 0 0 0 0 0 1 0 0 0 ];
sel_mc28_pt7(4,:) = [ 0 0 0 0 0 0 0 0 0 0 0 0 1 0 0 ];
```

```
T_7_28 = sel_mc28_pt7 * ma_ds48;
D_7_28 = pull_7 * transform_filt8 * mc_28;
w_7_28 = inv( T_7_28 * Rx * T_7_28' ) * T_7_28 * Rx * D_7_28';
mcp_28(8,:) = [ zeros(1,10)';(eye(4) - mean_4x4)*w_7_28 +
mean_4';zeros(1,2)']';
err_var(29,8)=D_7_28*Rx*D_7_28'-D_7_28*Rx*T_7_28'*inv(T_7_28*Rx*T
_7_28')*T_7_28*Rx* D_7_28';

mamcp_28_chk_0 = ds_ma0*mcp_28;
save mamcp_28_chk_0 mamcp_28_chk_0 -ascii -double -tabs
mamcp_28_chk_1 = ds_ma1*mcp_28;
save mamcp_28_chk_1 mamcp_28_chk_1 -ascii -double -tabs
mamcp_28_chk_2 = ds_ma2*mcp_28;
save mamcp_28_chk_2 mamcp_28_chk_2 -ascii -double -tabs mc_29(1,:) = [ 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 ];
mc_29(2,:) = [ 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 ];
mc_29(3,:) = [ 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 ];
mc_29(4,:) = [ 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 ];
mc_29(5,:) = [ 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 ];
mc_29(6,:) = [ 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 ];
mc_29(7,:) = [ 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 ];
mc_29(8,:) = [ 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 ];

sel_mc29_pt0(1,:) = [ 0 0 0 0 0 0 0 0 1 0 0 0 0 0 0 0 ];
sel_mc29_pt0(2,:) = [ 0 0 0 0 0 0 0 0 0 1 0 0 0 0 0 0 ];
sel_mc29_pt0(3,:) = [ 0 0 0 0 0 0 0 0 0 0 1 0 0 0 0 0 ];
sel_mc29_pt0(4,:) = [ 0 0 0 0 0 0 0 0 0 0 0 1 0 0 0 0 ];

T_0_29 = sel_mc29_pt0 * ma_ds48;
D_0_29 = pull_0 * transform_filt8 * mc_29;
w_0_29 = inv( T_0_29 * Rx * T_0_29' ) * T_0_29 * Rx * D_0_29';
mcp_29(1,:) = [ zeros(1,8)';(eye(4) - mean_4x4)*w_0_29 +
mean_4';zeros(1,4)']';
err_var(30,1)=D_0_29*Rx*D_0_29'-D_0_29*Rx*T_0_29'*inv(T_0_29*Rx*T
_0_29')*T_0_29*Rx* D_0_29';

sel_mc29_pt1(1,:) = [ 0 0 0 0 0 0 0 0 1 0 0 0 0 0 0 0 ];
sel_mc29_pt1(2,:) = [ 0 0 0 0 0 0 0 0 0 1 0 0 0 0 0 0 ];
sel_mc29_pt1(3,:) = [ 0 0 0 0 0 0 0 0 0 0 1 0 0 0 0 0 ];
sel_mc29_pt1(4,:) = [ 0 0 0 0 0 0 0 0 0 0 0 1 0 0 0 0 ];
```

```
T_1_29 = sel_mc29_pt1 * ma_ds48;
D_1_29 = pull_1 * transform_filt8 * mc_29;
w_1_29 = inv( T_1_29 * Rx * T_1_29' ) * T_1_29 * Rx * D_1_29';
mcp_29(2,:) = [ zeros(1,8)';(eye(4) - mean_4x4)*w_1_29 +
mean_4';zeros(1,4)']';
err_var(30,2)=D_1_29*Rx*D_1_29'-D_1_29*Rx*T_1_29'*inv(T_1_29*Rx*T
_1_29')*T_1_29*Rx* D_1_29';

sel_mc29_pt2(1,:) = [ 0 0 0 0 0 0 0 1 0 0 0 0 0 0 ];
sel_mc29_pt2(2,:) = [ 0 0 0 0 0 0 0 0 1 0 0 0 0 0 ];
sel_mc29_pt2(3,:) = [ 0 0 0 0 0 0 0 0 0 1 0 0 0 0 ];
sel_mc29_pt2(4,:) = [ 0 0 0 0 0 0 0 0 0 0 1 0 0 0 ];

T_2_29 = sel_mc29_pt2 * ma_ds48;
D_2_29 = pull_2 * transform_filt8 * mc_29;
w_2_29 = inv( T_2_29 * Rx * T_2_29' ) * T_2_29 * Rx * D_2_29';
mcp_29(3,:) = [ zeros(1,8)';(eye(4) - mean_4x4)*w_2_29 +
mean_4';zeros(1,4)']';
err_var(30,3)=D_2_29*Rx*D_2_29'-D_2_29*Rx*T_2_29'*inv(T_2_29*Rx*T
_2_29')*T_2_29*Rx* D_2_29';

sel_mc29_pt3(1,:) = [ 0 0 0 0 0 0 0 0 1 0 0 0 0 0 ];
sel_mc29_pt3(2,:) = [ 0 0 0 0 0 0 0 0 0 1 0 0 0 0 ];
sel_mc29_pt3(3,:) = [ 0 0 0 0 0 0 0 0 0 0 1 0 0 0 ];
sel_mc29_pt3(4,:) = [ 0 0 0 0 0 0 0 0 0 0 0 1 0 0 ];

T_3_29 = sel_mc29_pt3 * ma_ds48;
D_3_29 = pull_3 * transform_filt8 * mc_29;
w_3_29 = inv( T_3_29 * Rx * T_3_29' ) * T_3_29 * Rx * D_3_29';
mcp_29(4,:) = [ zeros(1,9)';(eye(4) - mean_4x4)*w_3_29 +
mean_4';zeros(1,3)']';
err_var(30,4)=D_3_29*Rx*D_3_29'-D_3_29*Rx*T_3_29'*inv(T_3_29*Rx*T
_3_29')*T_3_29*Rx* D_3_29';

sel_mc29_pt4(1,:) = [ 0 0 0 0 0 0 0 0 0 1 0 0 0 0 ];
sel_mc29_pt4(2,:) = [ 0 0 0 0 0 0 0 0 0 0 1 0 0 0 ];
sel_mc29_pt4(3,:) = [ 0 0 0 0 0 0 0 0 0 0 0 1 0 0 ];
sel_mc29_pt4(4,:) = [ 0 0 0 0 0 0 0 0 0 0 0 0 1 0 ];

T_4_29 = sel_mc29_pt4 * ma_ds48;
D_4_29 = pull_4 * transform_filt8 * mc_29;
w_4_29 = inv( T_4_29 * Rx * T_4_29' ) * T_4_29 * Rx * D_4_29';
mcp_29(5,:) = [ zeros(1,9)';(eye(4) - mean_4x4)*w_4_29 +
mean_4';zeros(1,3)']';
err_var(30,5)=D_4_29*Rx*D_4_29'-D_4_29*Rx*T_4_29'*inv(T_4_29*Rx*T
_4_29')*T_4_29*Rx* D_4_29';

sel_mc29_pt5(1,:) = [ 0 0 0 0 0 0 0 0 1 0 0 0 0 0 ];
sel_mc29_pt5(2,:) = [ 0 0 0 0 0 0 0 0 0 1 0 0 0 0 ];
```

```
sel_mc29_pt5(3,:) = [ 0 0 0 0 0 0 0 0 0 0 1 0 0 0 0 ];
sel_mc29_pt5(4,:) = [ 0 0 0 0 0 0 0 0 0 0 0 1 0 0 0 ];

T_5_29 = sel_mc29_pt5 * ma_ds48;
D_5_29 = pull_5 * transform_filt8 * mc_29;
w_5_29 = inv( T_5_29 * Rx * T_5_29' ) * T_5_29 * Rx * D_5_29';
mcp_29(6,:) = [ zeros(1,9)';(eye(4) - mean_4x4)*w_5_29 +
mean_4';zeros(1,3)']';
err_var(30,6)=D_5_29*Rx*D_5_29'-D_5_29*Rx*T_5_29'*inv(T_5_29*Rx*T
_5_29')*T_5_29*Rx* D_5_29';

sel_mc29_pt6(1,:) = [ 0 0 0 0 0 0 0 0 0 0 1 0 0 0 0 ];
sel_mc29_pt6(2,:) = [ 0 0 0 0 0 0 0 0 0 0 0 1 0 0 0 ];
sel_mc29_pt6(3,:) = [ 0 0 0 0 0 0 0 0 0 0 0 0 1 0 0 ];
sel_mc29_pt6(4,:) = [ 0 0 0 0 0 0 0 0 0 0 0 0 0 1 0 ];

T_6_29 = sel_mc29_pt6 * ma_ds48;
D_6_29 = pull_6 * transform_filt8 * mc_29;
w_6_29 = inv( T_6_29 * Rx * T_6_29' ) * T_6_29 * Rx * D_6_29';
mcp_29(7,:) = [ zeros(1,10)';(eye(4) - mean_4x4)*w_6_29 +
mean_4';zeros(1,2)']';
err_var(30,7)=D_6_29*Rx*D_6_29'-D_6_29*Rx*T_6_29'*inv(T_6_29*Rx*T
_6_29')*T_6_29*Rx* D_6_29';

sel_mc29_pt7(1,:) = [ 0 0 0 0 0 0 0 0 0 0 1 0 0 0 0 ];
sel_mc29_pt7(2,:) = [ 0 0 0 0 0 0 0 0 0 0 0 1 0 0 0 ];
sel_mc29_pt7(3,:) = [ 0 0 0 0 0 0 0 0 0 0 0 0 1 0 0 ];
sel_mc29_pt7(4,:) = [ 0 0 0 0 0 0 0 0 0 0 0 0 0 1 0 ];

T_7_29 = sel_mc29_pt7 * ma_ds48;
D_7_29 = pull_7 * transform_filt8 * mc_29;
w_7_29 = inv( T_7_29 * Rx * T_7_29' ) * T_7_29 * Rx * D_7_29';
mcp_29(8,:) = [ zeros(1,10)';(eye(4) - mean_4x4)*w_7_29 +
mean_4';zeros(1,2)']';
err_var(30,8)=D_7_29*Rx*D_7_29'-D_7_29*Rx*T_7_29'*inv(T_7_29*Rx*T
_7_29')*T_7_29*Rx* D_7_29';

mamcp_29_chk_0 = ds_ma0*mcp_29;
save mamcp_29_chk_0 mamcp_29_chk_0 -ascii -double -tabs
mamcp_29_chk_1 = ds_ma1*mcp_29;
save mamcp_29_chk_1 mamcp_29_chk_1 -ascii -double -tabs
mamcp_29_chk_2 = ds_ma2*mcp_29;
save mamcp_29_chk_2 mamcp_29_chk_2 -ascii -double -tabs
```

What is claimed is:

1. A method of downsampling multiple groups of complete pixel values in at least a first dimension by a factor of N, where N is a positive number, comprising the steps of:

downsampling a first group of complete pixel values by N to generate a first partial pixel value;

downsampling at least a second group of full pixel values by N to generate a second partial pixel value; and combining at least the first and second partial pixel values to form a complete pixel value.

2. The method of claim 1, wherein the first and second groups of complete pixel values are rows of pixel values which are located in different blocks of complete pixel values.

3. The method of claim 2, further comprising the step of:

storing the first partial pixel value prior to combining it with the second partial pixel value.

4. The method of claim 3, wherein each block of complete pixel values includes multiple rows of pixel values, wherein the first and second groups of complete pixel values are the first and second rows of pixel values located in first and second blocks, respectively, the method further comprising the steps of:

downsampling a third group of complete pixel values by N to generate a third partial pixel value, the third group of pixel values being a second row of complete pixel values included in the first block;

storing the third partial pixel value;

downsampling a fourth group of complete pixel values by N to generate a fourth partial pixel value, the fourth group of complete pixel values being a second row of complete pixel values included in the first block; and combining the third and fourth partial pixel values to generate a second complete pixel value.

5. The method of claim 4, further comprising the steps of:

incorporating the first and second complete pixel values into a third block of complete pixel values which is a downsampled representation of at least the first and second blocks complete pixel values.

6. The method of claim 4, further comprising the step of:

downsampling the first and second blocks of complete pixel values in a second dimension by a factor of X, where X is a positive number.

7. The method of claim 6, wherein the step of downsampling the first and second blocks of pixel values in the second dimension includes the step of:

generating partial pixel values by downsampling the first and second blocks of complete pixel values in the second dimension; and combining the partial pixel values to form complete pixel values.

8. The method of claim 7, wherein the first dimension is the horizontal direction and the second dimension is the vertical direction;

wherein the first and second blocks of complete pixel values are 8×8 blocks of video data and wherein each pixel value includes data representing a single pixel.

9. A video decoder circuit, comprising:

a full order inverse discrete cosine transform circuit;

a downsampler coupled to the full order inverse discrete cosine transform circuit;

a frame memory for storing anchor frame data coupled to the downsampler; and a first motion compensated prediction filter module including a first spatially variant filter circuit coupled to the anchor frame memory for filtering anchor frame data representing at least a portion of an anchor frame to thereby reduce the amount of drift that will result in an a video frame being generated therefrom.

10. The video decoder circuit of claim 9, further comprising:

a syntax parser and variable length decoder circuit coupled to the filter control circuit and for supplying thereto macroblock type information relevant to the frame being generated; and wherein the filter control circuit also controls the spatially variant filter as a function of the macroblock type information.

11. The video decoder circuit of claim 9, further comprising:

a filter control circuit for controlling the spatially variant filter circuit to perform reduced computational filtering when the video frame is being generated using interpolated prediction than is performed when the video frame is being generated using one way prediction.

12. The video decoder circuit of claim 9, wherein the portion of the anchor frame being filtered was generated from data that was previously coded using a field type discrete cosine transform operation or a frame type discrete cosine transform operation, the decoder circuit further comprising:

an auxiliary memory coupled to the frame memory for storing information on the type of discrete cosine transform operation previously used to code the data stored in the frame memory; and a filter control circuit for controlling the spatially variant filter circuit as a function of the discrete cosine transform type information stored in the auxiliary memory.

13. The video decoder circuit of claim 9, wherein the portion of the anchor frame being filtered was generated from data that was previously coded using a field type discrete cosine transform operation or a frame type discrete cosine transform operation, the decoder circuit further comprising:

a filter control circuit for controlling the spatially variant filter circuit as a function of the discrete cosine transform type previously used to code the anchor frame being filtered.

14. The video decoder circuit of claim 9, further comprising:

a filter control circuit for controlling the spatially variant filter circuit as a function of a motion vector.

15. The video decoder circuit of claim 14, wherein the video frame being generated is one of a plurality of frame types; and wherein the filter control circuit varies the amount of filtering performed by the spatially variant filter to reduce drift as a function of the type of video frame being generated.

16. The video decoder circuit of claim 14, wherein the video frame being generated uses either one way prediction or interpolated prediction; and wherein the filter control circuit varies the amount of filtering performed by the spatially variant filter so that less computationally complex filtering is performed by the spatially variant filter when the video frame being generated uses interpolated prediction than when the video frame being generated uses one way prediction.

17. The video decoder circuit of claim 14, wherein the video frame being generated uses either one way prediction or interpolated prediction; and wherein the motion compensated prediction filter module includes:
i. a first prediction filter module including the first spatially variant filter circuit the first spatially variant filter circuit; and
ii. a second prediction filter module including a second spatially variant filter circuit which is less computationally complex than the first spatially variant filter circuit, the second spatially variant filter circuit being used to filter anchor frame picture data used to produce video frames being generated using interpolated prediction.

18. The video decoder of claim 14, further comprising:
a DCT truncation circuit coupled to the full order IDCT circuit.

19. The video decoder circuit of claim 18, further comprising:
means for storing partial pixel values coupled to the downsampler; and
means for combining a stored partial pixel value with a subsequently generated partial pixel value to generate a full pixel value therefrom.

* * * * *